United States Patent
Hanaoka et al.

(10) Patent No.: US 11,430,894 B2
(45) Date of Patent: Aug. 30, 2022

(54) SEMICONDUCTOR DEVICE INCLUDING A OXIDE SEMICONDUCTOR TRANSISTOR

(71) Applicant: SEMICONDUCTOR ENERGY LABORATORY CO., LTD., Atsugi (JP)

(72) Inventors: Kazuya Hanaoka, Kanagawa (JP); Daisuke Matsubayashi, Kanagawa (JP); Yoshiyuki Kobayashi, Kanagawa (JP); Shunpei Yamazaki, Tokyo (JP); Shinpei Matsuda, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 184 days.

(21) Appl. No.: 16/710,456

(22) Filed: Dec. 11, 2019

(65) Prior Publication Data

US 2020/0119201 A1    Apr. 16, 2020

Related U.S. Application Data

(63) Continuation of application No. 15/617,696, filed on Jun. 8, 2017, now Pat. No. 10,573,758, which is a (Continued)

(30) Foreign Application Priority Data

May 20, 2013 (JP) ................. 2013-106284
Jul. 16, 2013 (JP) ................. 2013-147191
(Continued)

(51) Int. Cl.
*H01L 29/78* (2006.01)
*H01L 29/786* (2006.01)
*H01L 29/417* (2006.01)

(52) U.S. Cl.
CPC .... *H01L 29/7869* (2013.01); *H01L 29/41733* (2013.01); *H01L 29/78696* (2013.01); *H01L 29/785* (2013.01); *H01L 29/7854* (2013.01)

(58) Field of Classification Search
None
See application file for complete search history.

(56) References Cited

U.S. PATENT DOCUMENTS 5,731,856 A   3/1998 Kim et al.
5,744,864 A   4/1998 Cillessen et al.
(Continued)

FOREIGN PATENT DOCUMENTS

CN   101325162 A   12/2008
CN   101821839 A   9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Nilufa Rahim
(74) *Attorney, Agent, or Firm* — Nixon Peabody LLP; Jeffrey L. Costellia

(57) ABSTRACT

Provided is a semiconductor device in which deterioration of electric characteristics which becomes more noticeable as the semiconductor device is miniaturized can be suppressed. The semiconductor device includes a first oxide film, an oxide semiconductor film over the first oxide film, a source electrode and a drain electrode in contact with the oxide semiconductor film, a second oxide film over the oxide semiconductor film, the source electrode, and the drain electrode, a gate insulating film over the second oxide film, and a gate electrode in contact with the gate insulating film.
(Continued)

A top end portion of the oxide semiconductor film is curved when seen in a channel width direction.

20 Claims, 40 Drawing Sheets

Related U.S. Application Data continuation of application No. 14/277,465, filed on May 14, 2014, now Pat. No. 9,722,088.

(30) Foreign Application Priority Data

Sep. 23, 2013 (JP) .................................. 2013-196300
Apr. 21, 2014 (JP) .................................. 2014-087067

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,093,589 B2 | 1/2012 | Sugihara et al. |
| 8,274,079 B2 | 9/2012 | Yamazaki |
| 8,278,162 B2 | 10/2012 | Akimoto et al. |
| 8,299,461 B2 | 10/2012 | Tanaka et al. |
| 8,384,080 B2 | 2/2013 | Taniguchi et al. |
| 8,389,988 B2 | 3/2013 | Yamazaki et al. |
| 8,420,456 B2 | 4/2013 | Okamoto |
| 8,426,905 B2 | 4/2013 | Kamath et al. |
| 8,530,589 B2 | 9/2013 | Scher et al. |
| 8,669,556 B2 | 3/2014 | Yamazaki et al. |
| 8,674,354 B2 | 3/2014 | Yamazaki |
| 8,680,522 B2 | 3/2014 | Yamazaki et al. |
| 8,692,252 B2 | 4/2014 | Takata et al. |
| 8,748,224 B2 | 6/2014 | Noda et al. |
| 8,748,881 B2 | 6/2014 | Yamazaki |
| 8,754,409 B2 | 6/2014 | Yamazaki et al. |
| 8,779,420 B2 | 7/2014 | Yamazaki |
| 8,779,428 B2 | 7/2014 | Kim et al. |
| 8,802,515 B2 | 8/2014 | Endo et al. |
| 8,878,180 B2 | 11/2014 | Yamazaki |
| 8,896,042 B2 | 11/2014 | Yamazaki et al. |
| 8,994,021 B2 | 3/2015 | Yamazaki et al. |
| 9,006,803 B2 | 4/2015 | Isobe et al. |
| 9,059,295 B2 | 6/2015 | Yamazaki |
| 9,076,874 B2 | 7/2015 | Yamazaki et al. |
| 9,093,539 B2 | 7/2015 | Sasagawa et al. |
| 9,105,511 B2 | 8/2015 | Yamazaki et al. |
| 9,166,060 B2 | 10/2015 | Yamazaki et al. |
| 9,202,923 B2 | 12/2015 | Yamazaki |
| 9,214,520 B2 | 12/2015 | Yamazaki |
| 9,287,408 B2 | 3/2016 | Yamazaki et al. |
| 9,331,208 B2 | 5/2016 | Yamazaki et al. |
| 9,373,640 B2 | 6/2016 | Yamazaki et al. |
| 9,373,708 B2 | 6/2016 | Sasagawa et al. |
| 9,385,238 B2 | 7/2016 | Yamazaki |
| 9,548,395 B2 | 1/2017 | Yamazaki et al. |
| 9,548,397 B2 | 1/2017 | Yamazaki et al. |
| 9,627,545 B2 | 4/2017 | Yamazaki et al. |
| 9,685,447 B2 | 6/2017 | Yamazaki et al. |
| 9,711,655 B2 | 7/2017 | Yamazaki et al. |
| 9,722,088 B2 | 8/2017 | Hanaoka et al. |
| 9,728,555 B2 | 8/2017 | Yamazaki |
| 9,768,307 B2 | 9/2017 | Yamazaki et al. |
| 9,837,548 B2 | 12/2017 | Yamazaki |
| 9,842,937 B2 | 12/2017 | Yamazaki |
| 9,859,443 B2 | 1/2018 | Yamazaki et al. |
| 9,887,298 B2 | 2/2018 | Yamazaki |
| 9,960,278 B2 | 5/2018 | Sato et al. |
| 9,991,288 B2 | 6/2018 | Yamazaki |
| 10,079,295 B2 | 9/2018 | Isobe et al. |
| 10,103,277 B2 | 10/2018 | Yamazaki et al. |
| 10,263,120 B2 | 4/2019 | Yamazaki |
| 10,439,072 B2 | 10/2019 | Yamazaki |
| 10,510,757 B2 | 12/2019 | Yamazaki et al. |
| 10,608,118 B2 | 3/2020 | Yamazaki |
| 10,615,179 B2 | 4/2020 | Yamazaki |
| 10,714,626 B2 | 7/2020 | Yamazaki |
| 10,811,417 B2 | 10/2020 | Yamazaki et al. |
| 10,916,663 B2 | 2/2021 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187682 A1 | 8/2007 | Takeuchi et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |

(56) References Cited

U.S. PATENT DOCUMENTS

| | | |
|---|---|---|
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308911 A1 | 12/2008 | Okamoto |
| 2009/0068773 A1 | 3/2009 | Lai et al. |
| 2009/0073325 A1 | 3/2009 | Kuwabara et al. |
| 2009/0085095 A1 | 4/2009 | Kamath et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0286351 A1 | 11/2009 | Hirao et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0089417 A1 | 4/2011 | Yamazaki et al. |
| 2011/0101339 A1* | 5/2011 | Yamazaki ......... H01L 27/11551 257/43 |
| 2011/0127523 A1 | 6/2011 | Yamazaki |
| 2011/0140100 A1 | 6/2011 | Takata et al. |
| 2011/0147734 A1 | 6/2011 | Kim et al. |
| 2011/0175090 A1 | 7/2011 | Sugihara et al. |
| 2011/0193077 A1 | 8/2011 | Yamazaki |
| 2011/0240991 A1 | 10/2011 | Yamazaki |
| 2012/0040495 A1 | 2/2012 | Noda et al. |
| 2012/0058598 A1* | 3/2012 | Yamazaki ......... H01L 21/02554 438/104 |
| 2012/0119212 A1 | 5/2012 | Endo et al. |
| 2012/0132908 A1 | 5/2012 | Sugihara et al. |
| 2012/0138922 A1* | 6/2012 | Yamazaki ........... H01L 29/1033 257/43 |
| 2012/0146713 A1 | 6/2012 | Kim et al. |
| 2012/0287702 A1* | 11/2012 | Fujita .................... G11C 11/403 365/149 |
| 2012/0288993 A1 | 11/2012 | Sasagawa et al. |
| 2012/0292616 A1 | 11/2012 | Ohshima |
| 2013/0009148 A1 | 1/2013 | Yamazaki |
| 2013/0112968 A1 | 5/2013 | Sasagawa et al. |
| 2013/0189823 A1 | 7/2013 | Kamath et al. |
| 2013/0214393 A1 | 8/2013 | Okamoto |
| 2013/0344301 A1 | 12/2013 | Scher et al. |
| 2014/0034946 A1 | 2/2014 | Yamazaki et al. |
| 2014/0042437 A1 | 2/2014 | Yamazaki |
| 2014/0042438 A1 | 2/2014 | Yamazaki |
| 2014/0077205 A1 | 3/2014 | Yamazaki et al. |
| 2014/0167041 A1 | 6/2014 | Yamazaki et al. |
| 2020/0194467 A1 | 6/2020 | Yamazaki |
| 2020/0212222 A1 | 7/2020 | Yamazaki |
| 2020/0365592 A1 | 11/2020 | Yamazaki et al. |
| 2021/0020783 A1 | 1/2021 | Yamazaki |
| 2021/0159345 A1 | 5/2021 | Yamazaki et al. |
| 2021/0305432 A1 | 9/2021 | Yamazaki et al. |

FOREIGN PATENT DOCUMENTS

| | | |
|---|---|---|
| CN | 102376583 A | 3/2012 |
| EP | 1737044 A | 12/2006 |
| EP | 2226847 A | 9/2010 |
| EP | 2421031 A | 2/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2006-339556 A | 12/2006 |
| JP | 2005/022637 | 11/2007 |
| JP | 2009-021565 A | 1/2009 |
| JP | 2010-003822 A | 1/2010 |
| JP | 2010-287735 A | 12/2010 |
| JP | 2010-541255 | 12/2010 |
| JP | 2011-119675 A | 6/2011 |
| JP | 2011-124360 A | 6/2011 |
| JP | 2011-135063 A | 7/2011 |
| JP | 2011-138934 A | 7/2011 |
| JP | 2011-181913 A | 9/2011 |
| JP | 2011-228689 A | 11/2011 |
| JP | 2012-064929 A | 3/2012 |
| JP | 2012-119667 A | 6/2012 |
| JP | 2012-134475 A | 7/2012 |
| JP | 2012-216802 A | 11/2012 |
| JP | 2012-227521 A | 11/2012 |
| JP | 2012-256874 A | 12/2012 |
| JP | 2013-021313 A | 1/2013 |
| JP | 2013-038402 A | 2/2013 |
| KR | 2010-0081983 A | 7/2010 |
| KR | 2012-0016586 A | 2/2012 |
| KR | 2012-0050912 A | 5/2012 |
| KR | 2012-0065048 A | 6/2012 |
| KR | 2012-0096469 A | 8/2012 |
| KR | 2012-0120062 A | 11/2012 |
| TW | 200505016 | 2/2005 |
| TW | 201 120947 | 6/2011 |
| TW | 201227830 | 7/2012 |
| TW | 201227965 | 7/2012 |
| TW | 201236157 | 9/2012 |
| WO | WO-2004/114391 | 12/2004 |
| WO | WO-2008/137811 | 11/2008 |
| WO | WO-2009/046148 | 4/2009 |
| WO | WO-2010/125986 | 11/2010 |
| WO | WO-2011/048929 | 4/2011 |
| WO | WO-2011/052488 | 5/2011 |
| WO | WO-2011/065243 | 6/2011 |
| WO | WO-2011/096263 | 8/2011 |
| WO | WO-2011/122363 | 10/2011 |
| WO | WO-2012/073844 | 6/2012 |
| WO | WO-2012/172746 | 12/2012 |
| WO | WO-2013/008407 | 1/2013 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "SPINEL,YBFE2O4, and YB2FE3O7 Types of Structures for Compounds in the IN2O3 and SC2O3—A2O3—BO Systems [A; Fe, Ga, or Al; B; Mg, Mn, Fe, Nl, Cu,or Zn] At Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3,

(56) References Cited

OTHER PUBLICATIONS and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED ", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Park.S et al., "Challenge to Future Displays: Transparent AM-OLED Driven by PEALD Grown ZnO TFT", IMID '07 DIGEST, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
LEE.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW'08 : Proceedings of the 15th International Display Workshops, Dec. 3, 2008, pp. 1637-1640.
Sakata.J et al., "Development of 4.0-IN. AMOLED Display With Driver Circuit Using Amorphous In—Ga—Zn-Oxide TFTS", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID DIGEST '09 : SID International Symposium Digest of Technical Papers, May 31, 2009, pp. 191-193.
Cho.D et al., "21 2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1 Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Ohara.H et al., "21.3:4.0 IN. QVGA AMOLED Display Using In—Ga—Zn-Oxide TFTS With a Novel Passivation Layer", SID DIGEST '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.

(56) References Cited

OTHER PUBLICATIONS

Janotti.A et al., "Oxygen Vacancies in ZnO", Appl. Phys. Lett. (Applied Physics Letters), 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of SOL-GEL-Derived Zinc Oxide Films by Irradiation With Ultraviolet Lamp", Journal of SOL-GEL Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al.. "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
International Search Report (Application No. PCT/JP2014/063136) dated Aug. 12, 2014.
Written Opinion (Application No. PCT/JP2014/063136) dated Aug. 12, 2014.
Align, http://www.thefreedictionary.com/align, The Free Dictionary by Farlex.
Taiwanese Office Action (Application No. 103117141) dated Aug. 9, 2017.
Taiwanese Office Action (Application No. 107109126) dated Oct. 15, 2018.
http://www.Thesaurus.com/align, 2018.

\* cited by examiner

CAAC-OS nc-OS

SEMICONDUCTOR DEVICE INCLUDING A OXIDE SEMICONDUCTOR TRANSISTOR

TECHNICAL FIELD

The present invention relates to a semiconductor device.

In this specification, a "semiconductor device" refers to a device that can function by utilizing semiconductor characteristics; an electro-optical device, a semiconductor circuit, and an electronic device are all included in the category of the semiconductor device.

BACKGROUND ART

Attention has been focused on a technique for forming a transistor using a semiconductor thin film formed over a substrate having an insulating surface. The transistor is used in a wide range of electronic devices such as an integrated circuit (IC) and an image display device (display device). A silicon-based semiconductor material is widely known as a material for a semiconductor thin film applicable to a transistor. As another example, an oxide semiconductor has been attracting attention.

For example, a transistor whose active layer includes an amorphous oxide semiconductor containing indium (In), gallium (Ga), and zinc (Zn) is disclosed in Patent Document 1.

Techniques for improving carrier mobility by stacking oxide semiconductor films are disclosed in Patent Documents 2 and 3.

REFERENCE

Patent Document

[Patent Document 1] Japanese Published Patent Application No. 2006-165528
[Patent Document 2] Japanese Published Patent Application No. 2011-124360
[Patent Document 3] Japanese Published Patent Application No. 2011-138934

DISCLOSURE OF INVENTION

In general, high integration of a circuit requires miniaturization of a transistor. However, it is known that miniaturization of a transistor causes deterioration of electric characteristics, such as on-state current, threshold voltage, and an S value (subthreshold value), of the transistor.

For example, it is known that shortening the channel length in a transistor using silicon causes a short-channel effect such as an increase in subthreshold swing (S value) or a shift of threshold voltage to the negative side.

In contrast, a transistor using an oxide semiconductor is an accumulation-type transistor (a transistor in which a channel is formed in an accumulation layer) in which electrons are majority carriers, and drain-induced barrier lowering (DIBL) is less likely to occur in a short-channel transistor using an oxide semiconductor than in a short-channel inversion-type transistor (a transistor in which a channel is formed in an inversion layer) using silicon. In other words, the transistor using an oxide semiconductor has resistance to a short-channel effect.

It is concerned that on-state current is decreased by shortening the channel width of a transistor. As a technique for improving on-state current, known is a technique in which a thick active layer is formed so that a channel is formed also on a side surface of the active layer. In that case, however, a surface area where a channel is formed is increased, which increases carriers scattering at an interface between a channel formation region and a gate insulating film; thus, achieving sufficiently high on-state current is not easy.

One object of one embodiment of the present invention is to provide a semiconductor device in which deterioration of electric characteristics which becomes more noticeable as the semiconductor device is miniaturized can be suppressed. Another object is to provide a semiconductor device having a high degree of integration. Another object is to provide a semiconductor device in which deterioration of on-state current characteristics is reduced. Another object is to provide a semiconductor device with low power consumption. Another object is to provide a semiconductor device with high reliability. Another object is to provide a semiconductor device which can retain data even when power supply is stopped. Another object is to provide a novel semiconductor device.

Note that the descriptions of these objects do not disturb the existence of other objects. Note that in one embodiment of the present invention, there is no need to achieve all the objects. Other objects are apparent from and can be derived from the description of the specification, the drawings, the claims, and the like.

One embodiment of the present invention relates to a semiconductor device including stacked oxide semiconductor films.

One embodiment of the present invention is a semiconductor device including a first oxide film, an oxide semiconductor film over the first oxide film, a source electrode and a drain electrode in contact with the oxide semiconductor film, a second oxide film over the oxide semiconductor film, the source electrode, and the drain electrode, a gate insulating film over the second oxide film, and a gate electrode in contact with the gate insulating film. A top end portion of the oxide semiconductor film is curved when seen in a channel width direction.

Note that in this specification and the like, ordinal numbers such as "first" and "second" are used in order to avoid confusion among components and do not limit the components numerically.

In the above structure, a top surface of the oxide semiconductor film may have a flat portion.

In the above structure, a curvature radius r of an end portion (in the case of two end portions, each of curvature radiuses $r_1$ and $r_2$) of the oxide semiconductor film when seen in the channel width direction is greater than 0 and less than or equal to a half of a channel width W ($0 < r$ (or $r_1$ or $r_2$) $\leq W/2$).

In the above structure, a top end portion of the second oxide film may be aligned with a bottom end portion of the gate insulating film, and a top end portion of the gate insulating film may be aligned with a bottom end portion of the gate electrode.

In the above structure, conduction band minimum of each of the first oxide film and the second oxide film is preferably closer to a vacuum level than conduction band minimum of the oxide semiconductor film by 0.05 eV or more and 2 eV or less.

The above structure may include a barrier film covering and being in contact with the first oxide film, the oxide semiconductor film, the source electrode, the drain electrode, the second oxide film, the gate insulating film, and the gate electrode.

The above structure may include a first sidewall insulating film on side surfaces of the first oxide film, the oxide semiconductor film, the source electrode, and the drain electrode, with the barrier film positioned between the first sidewall insulating film and the side surfaces.

The above structure may include a second sidewall insulating film on side surfaces of the second oxide film, the gate insulating film, and the gate electrode, with the barrier film positioned between the second sidewall insulating film and the side surfaces.

According to one embodiment of the present invention, any of the following semiconductor devices can be provided; a semiconductor device in which deterioration of electric characteristics which becomes more noticeable as the semiconductor device is miniaturized cam be suppressed, a semiconductor device having a high degree of integration, a semiconductor device in which deterioration of on-state current characteristics is reduced, a semiconductor device with low power consumption, a semiconductor device with high reliability, a semiconductor device which can retain data even when power supply is stopped, and a novel semiconductor device. Note that the descriptions of these effects do not disturb the existence of other effects. In one embodiment of the present invention, there is no need to obtain all the effects. Other effects are apparent from and can be derived from the description of the specification, the drawings, the claims, and the like.

BEST MODE FOR CARRYING OUT THE INVENTION

Figure 1A:
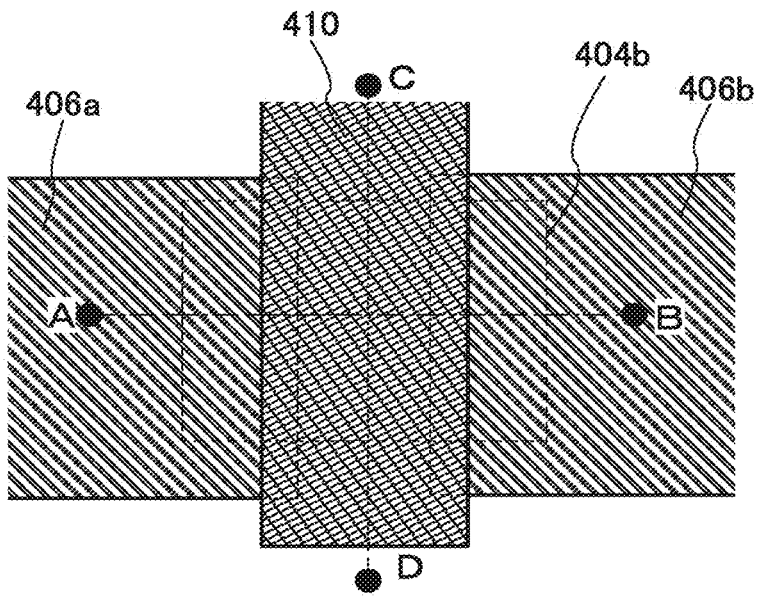
FIGS. 1A to 1C are a top view and cross-sectional views illustrating a transistor.

Embodiments are described in detail with reference to the drawings. Note that the present invention is not limited to the following description and it is readily appreciated by those skilled in the art that modes and details can be modified in various ways without departing from the spirit and the scope of the present invention. Therefore, the present invention should not be limited to the descriptions of the embodiments below. Note that in structures of the present invention described below, the same portions or portions having similar functions are denoted by the same reference numerals in different drawings, and description thereof is omitted in some cases.

Embodiment 1

In this embodiment, a semiconductor device of one embodiment of the present invention is described with reference to drawings.

Figure 1B:
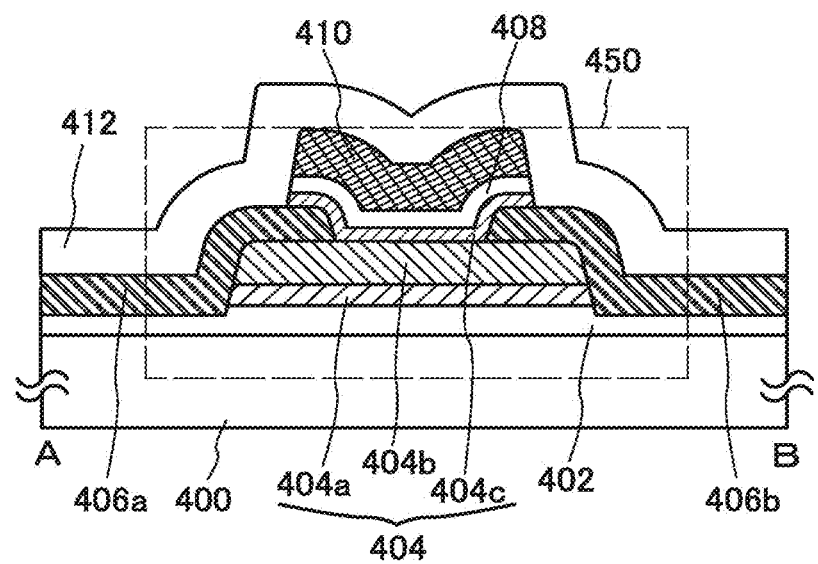
Figure 1C:
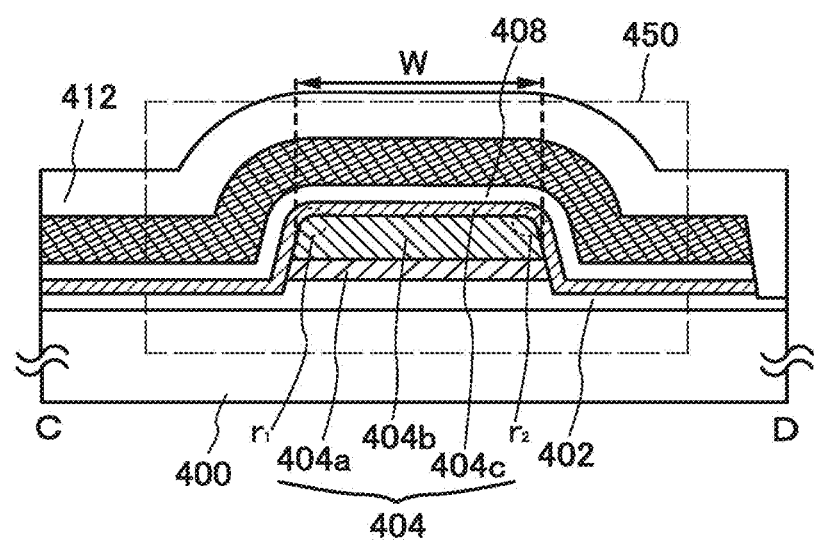

FIGS. 1A to 1C are a top view and cross-sectional views which illustrate a transistor of one embodiment of the present invention. FIG. 1A is the top view. FIG. 1B illustrates a cross section taken along the dashed-dotted line A-B in FIG. 1A. FIG. 1C illustrates a cross section taken along the dashed-dotted line C-D in FIG. 1A. Note that for simplification of the drawing, some components are not illustrated in the top view in FIG. 1A. In some cases, the direction of the dashed-dotted line A-B is referred to as a channel length direction, and the direction of the dashed-dotted line C-D is referred to as a channel width direction. Note that the channel length is a length of a channel formation region in the direction in which carriers flow. The channel width is a length of the channel formation region, which is perpendicular to the channel length direction.

A transistor 450 illustrated in FIGS. 1A to 1C includes a base insulating film 402 over a substrate 400; a first oxide film 404a and an oxide semiconductor film 404b over the base insulating film 402; a source electrode 406a and a drain electrode 406b over the first oxide film 404a and the oxide semiconductor film 404b; a second oxide film 404c over the oxide semiconductor film 404b, the source electrode 406a, and the drain electrode 406b; a gate insulating film 408 over the second oxide film 404c; a gate electrode 410 over the gate insulating film 408; and an oxide insulating film 412 over the source electrode 406a, the drain electrode 406b, and the gate electrode 410. The first oxide film 404a, the oxide semiconductor film 404b, and the second oxide film 404c are collectively referred to as a multilayer film 404.

When the channel length and the channel width of a transistor are shortened, an electrode, a semiconductor film, or the like which is processed using a resist mask has a round end portion (curved surface) in some cases. A top end portion of the oxide semiconductor film 404b in this embodiment is round and has a semicircle shape when seen in cross section. With this structure, the coverage with the gate insulating film 408, the gate electrode 410, and the oxide insulating film 412, which are to be formed over the oxide semiconductor film 404b, can be improved. In addition, electric field concentration which might occur at end portions of the source electrode 406a and the drain electrode 406b can be reduced, which can suppress deterioration of the transistor.

The oxide semiconductor film 404b has a curvature of an osculating circle whose radius of curvature is r. Note that the radius of curvature is equal to the radius of an osculating circle of a curve. The oxide semiconductor film 404b may have two or more portions with curvatures of different osculating circles.

Specifically, in the oxide semiconductor film 404b illustrated in FIGS. 1A to 1C, a curvature radius $r_1$ of a top end portion seen in the channel width direction is preferably greater than 0 and less than or equal to a half of the channel width W; similarly, a curvature radius $r_2$ of a top end portion seen in the channel width direction (the top end portion with the curvature radius $r_2$ is apart from the top end portion with the curvature radius $r_1$ by the channel width W) is preferably greater than 0 and less than or equal to a half of the channel width W ($0<r_1, r_2 \leq W/2$). In the case where a top surface of the oxide semiconductor film 404b does not have a flat portion when seen in the channel width direction as illustrated in FIG. 6C, a curvature radius $r_3$ of a top end portion is preferably greater than 0 and less than or equal to a half of the channel width W ($0<r_3 \leq W/2$).

Note that functions of a "source" and a "drain" of a transistor are sometimes replaced with each other when a transistor of opposite polarity is used or when the direction of current flowing is changed in circuit operation, for example. Thus, the terms "source" and "drain" can be used to denote the drain and the source, respectively, in this specification.

The substrate 400 is not limited to a simple supporting substrate, and may be a substrate where another device such as a transistor is formed. In that case, at least one of the gate electrode 410, the source electrode 406a, and the drain electrode 406b of the transistor 450 may be electrically connected to the above device.

The base insulating film 402 can have a function of supplying oxygen to the multilayer film 404 as well as a function of preventing diffusion of impurities from the substrate 400. For this reason, the base insulating film 402 is preferably an insulating film containing oxygen and more preferably, the base insulating film 402 is an insulating film containing oxygen in which the oxygen content is higher than that in the stoichiometric composition. In the case where the substrate 400 is provided with another device as described above, the base insulating film 402 also has a function as an interlayer insulating film. In that case, since the base insulating film 402 has an uneven surface, the base insulating film 402 is preferably subjected to planarization treatment such as chemical mechanical polishing (CMP) treatment so as to have a flat surface.

An aluminum oxide film that can supply oxygen is preferably used for the base insulating film 402. The aluminum oxide film has not only a function of supplying oxygen but also a function of blocking hydrogen, water, and oxygen. An aluminum oxide film containing silicon oxide, which is formed using a target in which an aluminum oxide and silicon oxide are mixed, can be used. In that case, the content of silicon oxide is preferably greater than or equal to 0.1 wt % and less than or equal to 30 wt %.

The multilayer film 404 in the channel formation region of the transistor 450 has a structure in which the first oxide film 404a, the oxide semiconductor film 404b, and the second oxide film 404c are stacked in this order from the substrate 400 side. The oxide semiconductor film 404b is surrounded by the first oxide film 404a and the second oxide film 404c. As in FIG. 1C, the gate electrode 410 electrically covers the oxide semiconductor film 4041 when seen in the channel width direction.

Here, for the oxide semiconductor film 404b, for example, an oxide semiconductor whose electron affinity (an energy difference between a vacuum level and the conduction band minimum) is higher than those of the first oxide film 404a and the second oxide film 404c is used. The electron affinity can be obtained by subtracting an energy difference between the conduction band minimum and the valence band maximum (what is called an energy gap) from an energy difference between the vacuum level and the valence band maximum (what is called an ionization potential).

The first oxide film 404a and the second oxide film 404c each contain one or more kinds of metal elements forming the oxide semiconductor film 404b. For example, the first oxide film 404a and the second oxide film 404c are preferably formed using an oxide semiconductor whose conduction band minimum is closer to a vacuum level than that of the oxide semiconductor film 404b. Further, the energy difference of the conduction band minimum between the oxide semiconductor film 404b and the first oxide film 404a and the energy difference of the conduction band minimum between the oxide semiconductor film 404b and the second oxide film 404c are each preferably greater than or equal to 0.05 eV, 0.07 eV, 0.1 eV, or 0.15 eV and smaller than or equal to 2 eV, 1 eV, 0.5 eV, or 0.4 eV.

In such a structure, when an electric field is applied to the gate electrode 410, a channel is formed in the oxide semiconductor film 404b whose conduction band minimum is the lowest in the multilayer film 404. In other words, the second oxide film 404c is formed between the oxide semiconductor film 404b and the gate insulating film 408, whereby a structure in which the channel of the transistor is not in contact with the gate insulating film 408 is obtained.

Further, since the first oxide film 404a contains one or more metal elements contained in the oxide semiconductor film 404b, an interface state is less likely to be formed at the interface of the oxide semiconductor film 404b with the first oxide film 404a than at the interface with the base insulating film 402 on the assumption that the oxide semiconductor film 404b is in contact with the base insulating film 402. The interface state sometimes forms a channel, leading to a change in the threshold voltage of the transistor. Thus, with the first oxide film 404a, variation in the electrical characteristics of the transistor, such as a threshold voltage, can be reduced. Further, the reliability of the transistor can be improved.

Furthermore, since the second oxide film 404c contains one or more metal elements contained in the oxide semiconductor film 404b, scattering of carriers is less likely to occur at the interface of the oxide semiconductor film 404b with the second oxide film 404c than at the interface with the gate insulating film 408 on the assumption that the oxide semiconductor film 404b is in contact with the gate insulating film 408. Thus, with the second oxide film 404c, the field-effect mobility of the transistor can be increased.

For the first oxide film 404a and the second oxide film 404c, for example, a material containing Al, Ti, Ga, Ge, Y, Zr, Sn, La, Ce, or Hf with a higher atomic ratio than that used for the oxide semiconductor film 404b can be used. Specifically, an atomic ratio of any of the above metal elements in the first oxide film 404a and the second oxide film 404c is 1.5 times or more, preferably 2 times or more, further preferably 3 times or more as much as that in the oxide semiconductor film 404b. Any of the above metal elements is strongly bonded to oxygen and thus has a function of suppressing generation of an oxygen vacancy in the first oxide film 404a and the second oxide film 404c. That is, an oxygen vacancy is less likely to be generated in the first oxide film 404a and the second oxide film 404c than in the oxide semiconductor film 404b.

Note that when each of the first oxide film 404., the oxide semiconductor film 404b, and the second oxide film 404c is an In-M-Zn oxide containing at least indium, zinc, and M (M is a metal such as Al, Ti, Ga, Ge, Y, Zr, Sn, La, C, or Hf), and the first oxide film 404a has an atomic ratio of In to M and Zn which is $x_1:y_1:z_1$, the oxide semiconductor film 404b has an atomic ratio of In to M and Zn which is $x_2:y_2:z_2$ and the second oxide film 404c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or morn as large as $y_2/x_2$. At this time, when $y_2$ is greater than or equal to $x_2$ in the oxide semiconductor film 404b, the transistor can have stable electrical characteristics. However, when $y_2$ is 3 times or more as large as $x_2$, the field-effect mobility of the transistor is reduced; accordingly, $y_2$ is preferably less than 3 times $x_2$.

In the case where Zn and O are not taken into consideration, the proportion of In and the proportion of M in the first oxide film 404a and the second oxide film 404c are preferably less than 50 atomic % and greater than or equal to 50 atomic %, respectively, and further preferably greater than or equal to 34 atomic % and less than 66 atomic %, respectively.

The thicknesses of the first oxide film 404a and the second oxide film 404c are each greater than or equal to 3 nm and less than or equal to 100 nm, preferably greater than or equal to 3 nm and less than or equal to 50 m. The thickness of the oxide semiconductor film 404b is greater than or equal to 3 nm and less than or equal to 200 nm, preferably greater than or equal to 3 nm and less than or equal to 100 nm, further preferably greater than or equal to 3 nm and less than or equal to 50 nm.

For the first oxide film 404a, the oxide semiconductor film 404b, and the second oxide film 404c, an oxide semiconductor containing indium, zinc, and gallium can be used, for example. Note that the oxide semiconductor film 404b preferably contains indium because carrier mobility can be increased.

Note that stable electrical characteristics can be effectively imparted to a transistor in which an oxide semiconductor film serves as a channel by reducing the concentration of impurities in the oxide semiconductor film to make the oxide semiconductor film intrinsic or substantially intrinsic. The term "substantially intrinsic" refers to the state where an oxide semiconductor film has a carrier density lower than $1\times10^{17}/cm^3$, preferably lower than $1\times10^{15}/cm^3$, further preferably lower than $1\times10^{13}/cm^3$.

Some of hydrogen atoms contained in the oxide semiconductor film are trapped by oxygen vacancies, which makes the oxide semiconductor film have n-type conductivity. Accordingly, the Fermi level ($E_f$) is closer to the bottom of a conduction bend ($E_c$) in an oxide semiconductor film containing a large amount of hydrogen than the Fermi level ($E_f$) in a highly purified intrinsic oxide semiconductor film is; therefore, an improvement in field-effect mobility of a transistor is expected. When an oxide semiconductor film is made to be intrinsic or substantially intrinsic, the Fermi energy of the oxide semiconductor film becomes the same or substantially same as the mid gap (the middle energy of the energy gap of the oxide semiconductor film). In that case, it is concerned that the field-effect mobility is decreased because of a reduction in the number of carriers in the oxide semiconductor film.

However, in the transistor of one embodiment of the present invention, a gate electric field is applied to the oxide semiconductor film not only in the vertical direction but also in the side surface directions. That is, the gate electric field is applied to the whole oxide semiconductor film, so that current flows in the whole oxide semiconductor film. Thus, variations in electric characteristics due to a highly purified intrinsic oxide semiconductor film can be suppressed and the field-effect mobility of a transistor can be increased.

In the oxide semiconductor film, hydrogen, nitrogen, carbon, silicon, and a metal element other than main components of the oxide semiconductor film are impurities. For example, hydrogen and nitrogen form donor levels to increase the carrier density. In addition, silicon in the oxide semiconductor film forms an impurity level. The impurity level might become a trap, which deteriorates the electric characteristics of the transistor. Accordingly, in the first oxide film 404, the oxide semiconductor film 404b, and the second oxide film 404c and at interfaces between these films, the impurity concentration is preferably reduced.

In order to make the oxide semiconductor film intrinsic or substantially intrinsic, in SIMS (secondary ion mass spectrometry), for example, the concentration of silicon at a certain depth of the oxide semiconductor film or in a region of the oxide semiconductor film is preferably lower than $1\times10^{19}$ atoms/cm$^3$, more preferably lower than $5\times10^{18}$ atoms/cm$^3$, still more preferably lower than $1\times10^{18}$ atoms/cm$^3$. Further, the concentration of hydrogen at a certain depth of the oxide semiconductor film or in a region of the oxide semiconductor film is preferably lower than or equal to $2\times10^{20}$ atoms/cm$^3$, more preferably lower than or equal to $5\times10^{19}$ atoms/cm, still more preferably lower than or equal to $1\times10^{19}$ atoms/cm$^3$, yet still more preferably lower than or equal to $5\times10^{18}$ atoms/cm$^3$. Further, the concentration of nitrogen at a certain depth of the oxide semiconductor film or in a region of the oxide semiconductor film is preferably lower than $5\times10^{19}$ atoms/cm$^3$, more preferably lower than or equal to $5\times10^{18}$ atoms/cm$^3$, still more preferably lower than or equal to $1\times10^{18}$=atoms/cm$^3$, yet still more preferably lower than or equal to $5\times10^{17}$ atoms/cm$^3$.

In the case where the oxide semiconductor film includes crystals, high concentration of silicon or carbon might reduce the crystallinity of the oxide semiconductor film. In order not to lower the crystallinity of the oxide semiconductor film, for example, the concentration of silicon at a certain depth of the oxide semiconductor film or in a region of the oxide semiconductor film may be lower than $1\times10^{19}$ atoms/cm$^3$, preferably lower than $5\times10^{18}$ atoms/cm$^3$, more preferably lower than $1\times10^{18}$ atoms/cm$^3$. Further, the concentration of carbon at a certain depth of the oxide semiconductor film or in a region of the oxide semiconductor film may be lower than $1\times10^{19}$ atoms/cm$^3$, preferably lower than $5\times10^{18}$ atoms/cm$^3$, more preferably lower than $1\times10^{18}$ atoms/cm$^3$, for example.

A transistor in which the above-described highly purified oxide semiconductor film is used for a channel formation region has an extremely low off-state current. In the case where the voltage between a source and a drain is set to about 0.1 V, 5 V, or 10 V, for example, the off-state current standardized on the channel width of the transistor can be as low as several yoctoamperes per micrometer to several zeptoamperes per micrometer.

Note that as the gate insulating film of the transistor, an insulating film containing silicon is used in many cases; thus, it is preferable that, as in the transistor of one embodiment of the present invention, a region of the multilayer film, which serves as a channel, be not in contact with the gate insulating film for the above-described reason. In the case where a channel is formed at the interface between the gate insulating film and the multilayer film, scattering of carriers occurs at the interface, whereby the field-effect mobility of the transistor is reduced in some cases. Also from the view of the above, it is preferable that the region of the multilayer film, which serves as a channel, be separated from the gate insulating film.

Accordingly, with the multilayer film 404 having a stacked structure including the first oxide film 404a, the oxide semiconductor film 404b, and the second oxide film 404c in this order, a channel can be formed in the oxide semiconductor film 404b; thus, the transistor can have a high field-effect mobility and stable electric characteristics.

Next, the band structure of the multilayer film 404 is described. For analyzing the band structure, a stacked film corresponding to the multilayer film 404 is formed. In the stacked film, In—Ga—Zn oxide with an energy gap of 3.5 eV is used for layers corresponding to the first oxide film 404a and the second oxide film 404c, and In—Ga—Zn oxide with an energy gap of 3.15 eV is used for a layer corresponding to the oxide semiconductor film 404b.

The thickness of each of the first oxide film 404a, the oxide semiconductor film 404b, and the second oxide film 404c was 10 nm. The energy gap was measured with the use of a spectroscopic ellipsometer (UT-300 manufactured by HORIBA Jobin Yvon). Further, the energy difference between the vacuum level and the valence band maximum was measured using an ultraviolet photoelectron spectroscopy (UPS) device (VersaProbe, ULVAC-PHI, Inc.).

Figure 2A:
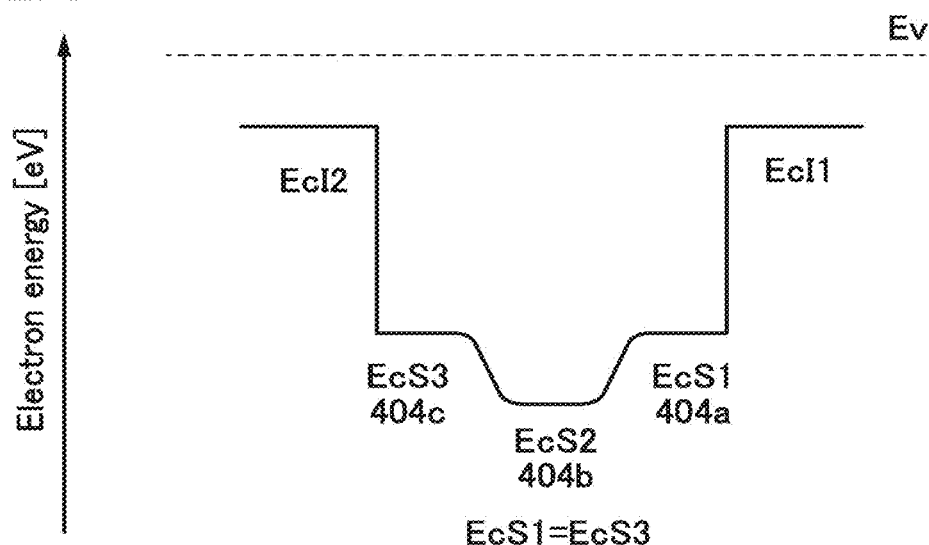
FIGS. 2A and 2B show band structures of multilayer films.

FIG. 2A is part of a schematic band structure showing an energy difference (electron affinity) between the vacuum level and the conduction band minimum of each layer, which is calculated by subtracting the energy gap from the energy difference between the vacuum level and the valence band maximum. FIG. 2A is a band diagram showing the case where silicon oxide films are provided in contact with the first oxide film 404a and the second oxide film 404c. Here, Ev represents energy of the vacuum level, EcI1 and EcI2 each represent the conduction band minimum of the silicon oxide film, EcS1 represents the conduction band minimum of the first oxide film 404a, EcS2 represents the conduction band minimum of the oxide semiconductor film 404b, and EcS3 represents the conduction band minimum of the second oxide film 404c.

As shown in FIG. 2A, the conduction band minimums of the first oxide film 404a, the oxide semiconductor film 404b, and the second oxide film 404c successively vary. This can be understood also from the fact that the compositions of the first oxide film 404a, the oxide semiconductor film 404b, and the second oxide film 404c are close to one another and oxygen is easily diffused among the first oxide film 404a, the oxide semiconductor film 404b, and the second oxide film 404c. Thus, the first oxide film 404a, the oxide semiconductor film 404b, and the second oxide film 404c have a continuous physical property although they have different compositions and form a stack. In the drawings, interfaces between the oxide semiconductor layers of the stack are indicated by dotted lines.

The multilayer film 404 in which layers containing the same main components are stacked is formed to have not only a simple stacked-layer structure of the layers but also a continuous energy band (here, in particular, a well structure having a U shape in which the conduction band minimums successively varies between layers). In other words, the stacked-layer structure is formed such that there exist no impurities which form a defect level such as a trap center or a recombination center at each interface. If impurities exist between the stacked layers in the multilayer film, the continuity of the energy band is lost and carriers disappear by a trap or recombination.

Note that FIG. 2A shows the case where EcS1 and EcS3 are similar to each other; however, EcS1 and EcS3 may be different from each other. For example, part of the band structure in the case where EcS1 is higher than EcS3 is shown in FIG. 2B.

For example, when EcS1 is equal to EcS3, an In—Ga—Zn oxide whose atomic ratio of In to Ga and Zn is 1:3:2, 1:3:3, 1:3:4, 1:3:6, 1:4:5, 1:6:4, or 1:9:6 can be used for the first oxide film 404a and the second oxide film 404c and an In—Ga—Zn oxide whose atomic ratio of In to Ga and Zn is 1:1:1 or 3:1:2 can be used for the oxide semiconductor film 404b. Further, when EcS1 is higher than EcS3, an In—Ga—Zn oxide whose atomic ratio of In to Ga and Zn is 1:6:4 or 1:9:6 can be used for the first oxide film 404a, an In—Ga—Zn oxide whose atomic ratio of In to Ga and Zn is 1:1:1, 1:1:1.2, 1:1:1.5, or 3:1:2 can be used for the oxide semiconductor film 404b, and an In—Ga—Zn oxide whose atomic ratio of In to Ga and Zn is 1:3:2, 1:3:3, or 1:3:4 can be used for the second oxide film 404c, for example.

Figure 2B:
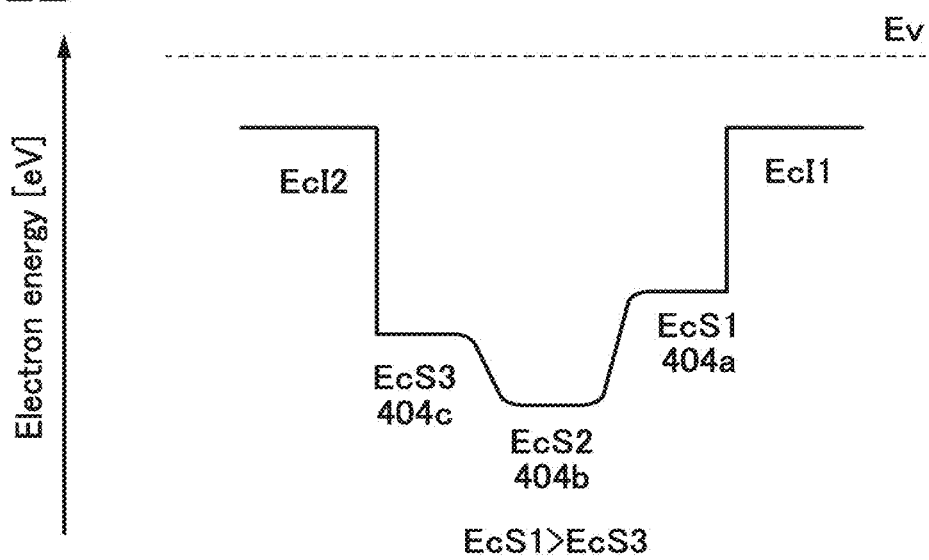

According to FIGS. 2A and 2B, the oxide semiconductor film 404b of the multilayer film 404 serves as a well, so that a channel is formed in the oxide semiconductor film 404b in a transistor including the multilayer film 404. Note that since the conduction band minimum successively varies, the multilayer film 404 can also be referred to as a U-shaped well. Further, a channel formed to have such a structure can also be referred to as a buried channel.

Note that trap levels due to impurities or defects might be formed in the vicinity of the interface between an insulating film such as a silicon oxide film and each of the first oxide film 404a and the second oxide film 404c. The oxide semiconductor film 404b can be distanced away from the trap levels owing to existence of the first oxide film 404a and the second oxide film 404c. However, when the energy differences between EcS2 and EcS1 and EcS2 and EcS3 are small, an electron in the oxide semiconductor film 404b might reach the trap level by passing over the energy differences. When the electron is trapped in the trap level, a negative fixed charge is generated at the interface with the insulating film, whereby the threshold voltage of the transistor is shifted in the positive direction.

Thus, to reduce fluctuations in the threshold voltage of the transistor, energy differences of at least certain values between EcS2 and EcS1 and between EcS2 and EcS3 are necessary. Each of the energy differences is preferably greater than or equal to 0.1 eV, further preferably greater than or equal to 0.15 eV.

The first oxide film 404a, the oxide semiconductor film 404b, and the second oxide film 404c preferably include crystal parts. In particular, when crystals in which c-axes are aligned is used, the transistor can have stable electric characteristics.

In the case where an In—Ga—Zn oxide is used for the multilayer film 404, it is preferable that the second oxide film 404c contain less In than the oxide semiconductor film 404b so that diffusion of In to the gate insulating film is prevented.

For the source electrode 406a and the drain electrode 406b, a conductive material which is easily bonded to oxygen is preferably used. For example, Al, Cr, Cu, Ta, Ti, Mo, or W can be used. Among the materials, in particular, it is preferable to use Ti which is easily bonded to oxygen or to use W with a high melting point, which allows subsequent process temperatures to be relatively high. Note that the conductive material which is easily bonded to oxygen includes, in its category, a material to which oxygen is easily diffused.

When the conductive material which is easily bonded to oxygen is in contact with a multilayer film, a phenomenon occurs in which oxygen in the multilayer film is diffused to the conductive material which is easily bonded to oxygen. The phenomenon noticeably occurs when the temperature is high. Since the fabricating process of the transistor involves some heat treatment steps, the above phenomenon causes generation of oxygen vacancies in the vicinity of a region which is in the multilayer film and is in contact with the source electrode or the drain electrode. The oxygen vacancies bond to hydrogen slightly contained in the film, whereby the region is changed to an n-type region. Thus, the n-type region can serve as a source or a drain of the transistor.

Figure 3:
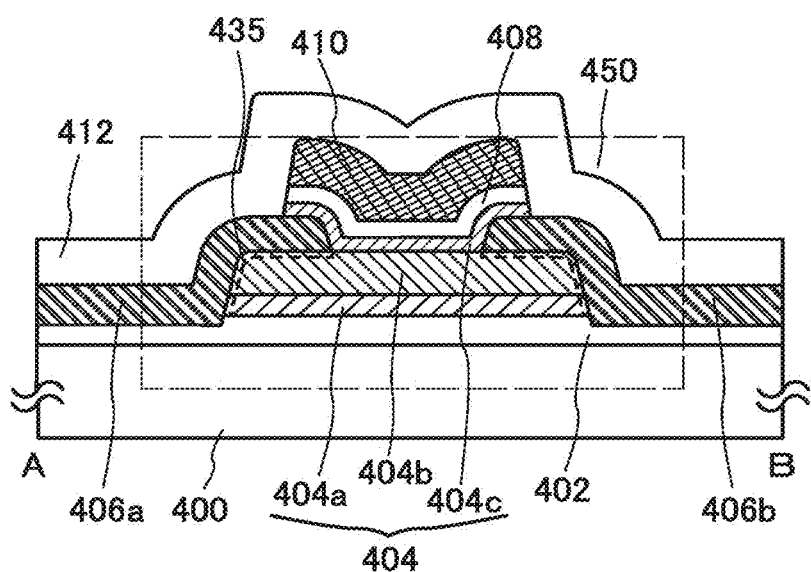
FIG. 3 is an enlarged cross-sectional view of a transistor.

The n-type region is illustrated in an enlarged cross-sectional view of the transistor (a cross section in the channel length direction) in FIG. 3. A boundary 435 indicated by a dotted line in the oxide semiconductor film 404b is a boundary between an intrinsic semiconductor region and an n-type semiconductor region. In the oxide semiconductor film 404b, a region near the source electrode 406a or the drain electrode 406b becomes an n-type region. The boundary 435 is schematically illustrated here, but actually, the boundary is not clearly seen in some cases. Although FIG. 3 shows that the boundary 435 extends in the lateral direction in the oxide semiconductor film 404b, a region in the first oxide film 404a and the oxide semiconductor film 404b, which is sandwiched between the source electrode 406a or the drain electrode 406b and the first oxide film 404a, becomes n-type entirely in the thickness direction, in some cases. Furthermore, although not shown, an n-type region is formed in the first oxide film or the second oxide film in some cases.

In the case of forming a transistor with an extremely short channel length, an n-type region which is formed by the generation of oxygen vacancies might extend in the channel length direction of the transistor. In that case, the electrical characteristics of the transistor change; for example, the threshold voltage is shifted, or on and off states of the transistor cannot be controlled with the gate voltage (in which case the transistor is turned on). Accordingly, when a transistor with an extremely short channel length is formed, it is not always preferable that a conductive material easily bonded to oxygen be used for a source electrode and a drain electrode.

In such a case, a conductive material which is less likely to be bonded to oxygen than the above material is preferably used for the source electrode 406a and the drain electrode 406b. As the conductive material which is not easily bonded to oxygen, for example, a material containing tantalum nitride, titanium nitride, or ruthenium or the like can be used. Note that in the case where the conductive material is in contact with the oxide semiconductor film 404b, the source electrode 406a and the drain electrode 406b may each have a structure in which the conductive material which is not easily bonded to oxygen and the above-described conductive material that is easily bonded to oxygen are stacked.

The gate insulating film 408 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 408 may be a stack including any of the above materials.

For the gate electrode 410, a conductive film formed using Al, Ti, Cr, Co, Ni, Cu, Y, Zr, Mo, Ru, Ag, Ta, W, or the like can be used. The gate electrode may be a stack including any of the above materials. Alternatively, a conductive film containing nitrogen may be used for the gate electrode 410.

The oxide insulating film 412 may be formed over the gate insulating film 408 and the gate electrode 410. The oxide insulating film 412 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The oxide insulating film 412 may be a stack including any of the above materials.

Here, the oxide insulating film 412 preferably contains excess oxygen. An oxide insulating film containing excess oxygen refers to an oxide insulating film from which oxygen can be released by heat treatment or the like. The oxide insulating film containing excess oxygen is preferably a film in which the amount of released oxygen when converted into oxygen atoms is $1.0 \times 10^{19}$ atoms/cm or more in thermal desorption spectroscopy analysis. Oxygen released from the oxide insulating film can be diffused to the channel formation region in the multilayer film 404 through the gate insulating film 408, so that oxygen vacancies formed in the channel formation region can be filled with the oxygen. In this manner, the electrical characteristics of the transistor can be stable.

An aluminum oxide film is preferably used for the oxide insulating film 412. The aluminum oxide film has not only a function of supplying oxygen but also a function of blocking hydrogen, water, and oxygen. Alternatively, an aluminum oxide film containing silicon oxide, which is formed using a target in which an aluminum oxide and silicon oxide are mixed, can be used. In that case, the content of silicon oxide is preferably greater than or equal to 0.1 wt % and less than or equal to 30 wt %.

High integration of a semiconductor device requires miniaturization of a transistor. However, it is known that miniaturization of a transistor causes deterioration of the electrical characteristics of the transistor. In particular, on-state current, which is directly caused by a decrease in channel width, is significantly reduced.

Figure 4A:
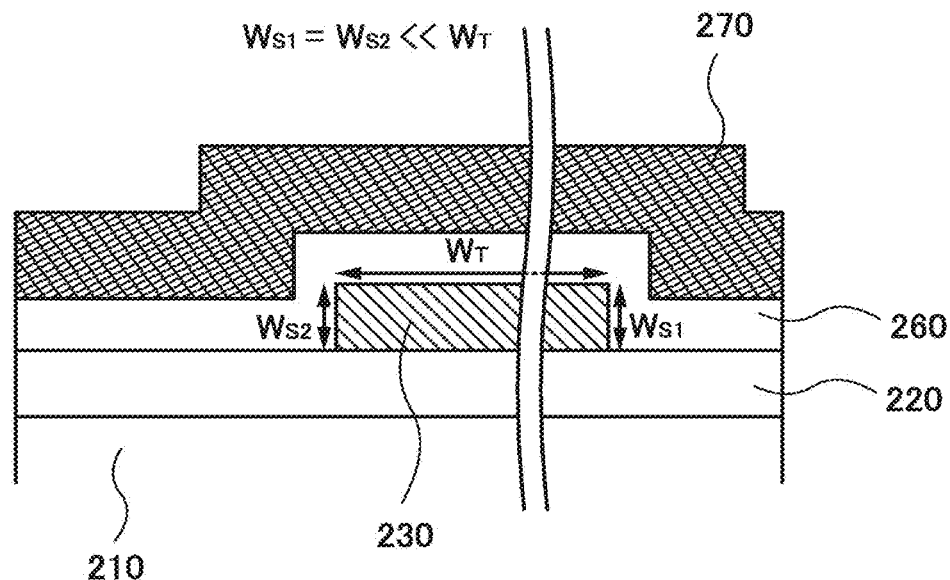
FIGS. 4A and 4B are each a cross-sectional view of a transistor in the channel width direction.
Figure 4B:
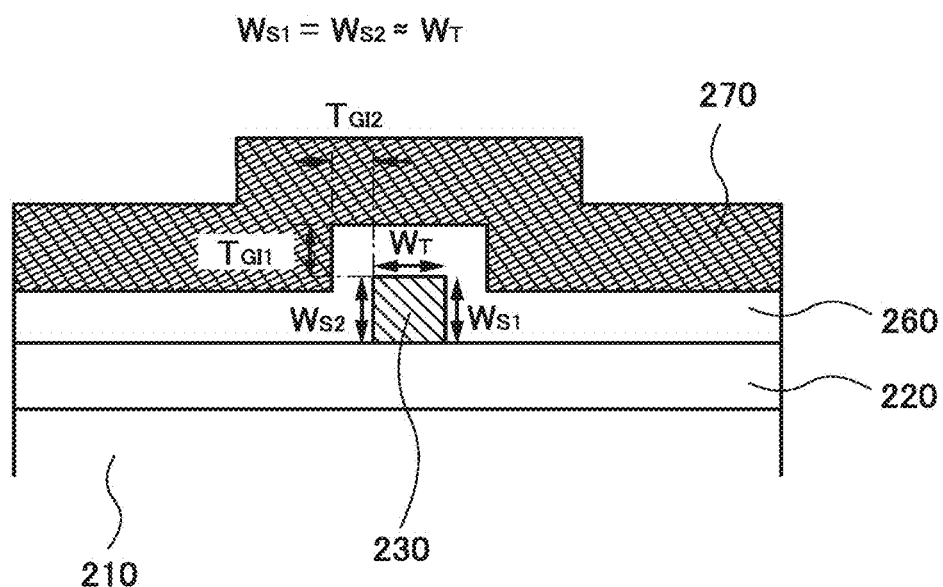

FIGS. 4A and 4B are each a cross-sectional view in the channel width direction of a conventional transistor including an oxide semiconductor film. Each transistor includes a base insulating film 220 over a substrate 210, an oxide semiconductor film 230 formed over the base insulating film, a gate insulating film 260 formed over the oxide semiconductor film, and a gate electrode 270.

In the transistor in FIG. 4A, the length ($W_T$) of the top surface of the oxide semiconductor film in the channel width direction is sufficiently larger than the thickness of the oxide semiconductor film 230. In such a case, the channel width can be defined as $W_T$.

Since an electric field from the gate electrode 270 to a side surface of the oxide semiconductor film 230 is not applied to the entire oxide semiconductor film 230, a channel is not sufficiently formed in the side surface of the oxide semiconductor film 230. Further, since a ratio of the length ($W_{S1}$, $W_{S2}$) of the side surface corresponding to the thickness of the oxide semiconductor film 230 to the length ($W_T$) of the top surface is small, even if a channel is formed, the contribution of the channel is estimated to be small, Thus, it can be said that as $W_T$ becomes short, in other words, as the transistor is miniaturized, the on-state current is reduced.

In the case of a transistor in which $W_T$ is as short as the thickness of the oxide semiconductor film 230 as illustrated in FIG. 4B, an electric field from the gate electrode 270 to the side surface of the oxide semiconductor film 230 is applied to the entire oxide semiconductor film 230; thus, a channel is also formed in the side surface of the oxide semiconductor film 230. Accordingly, the on-state current is expected to be increased by making the oxide semiconductor film 230 thick, for example. However, in the conventional transistor, the on-state current is not sufficiently increased because carriers are scattered at the interface between a channel formation layer (the oxide semiconductor film 230) and the gate insulating film 260.

Further, the thickness ($T_{GI2}$) of the gate insulating film 260 which covers the side surface of the oxide semiconductor film 230 is likely to be smaller than the thickness ($T_{GI1}$) of the gate insulating film which covets the top surface of the oxide semiconductor film, depending on the deposition method. Thus, a portion having low withstand voltage is formed in the gate insulating film 260, which might reduce the reliability of the transistor.

In addition, since $T_{GI1}$ and $T_{GI2}$ are different from each other, an electric field applied from the gate electrode 270 to the oxide semiconductor film 230 varies. Thus, the on-state current might vary.

In contrast, in the transistor of one embodiment of the present invention, as described above, the second oxide film 404c is formed between the gate insulating film 408 and the oxide semiconductor film 404b in which a channel is formed. Accordingly, scattering of carriers at the interface between the channel formation layer and the gate insulating film can be reduced and the field-effect mobility of the transistor can be increased.

Further, in the transistor of one embodiment of the present invention, the second oxide film 404c is formed so as to cover the oxide semiconductor film 404b where a channel is formed; thus, scattering of carriers in a side surface of the oxide semiconductor film 404b can be reduced as in the top surface. This means that the on-state current of the transistor of one embodiment of the present invention can be higher than that of the conventional transistor.

Figure 5A:
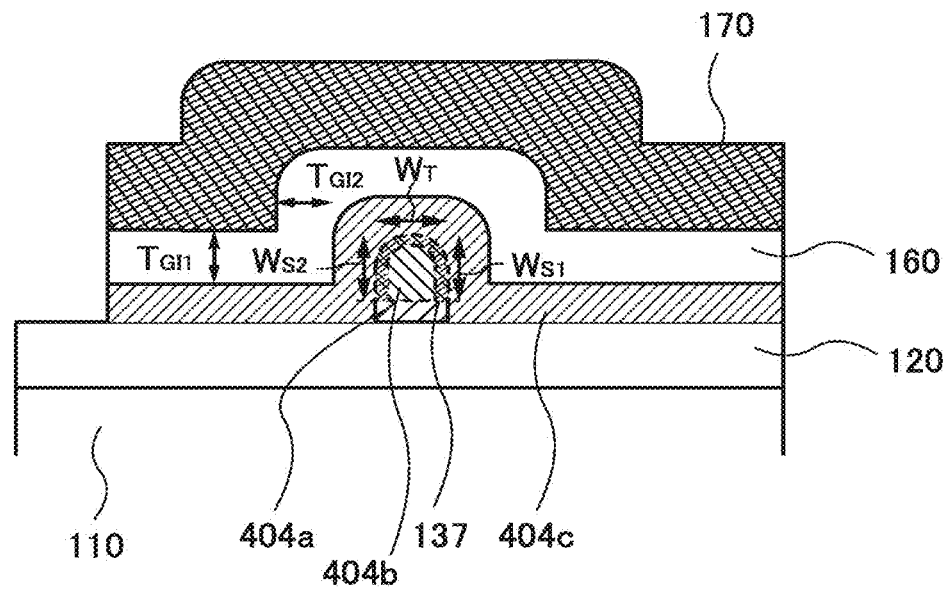
FIGS. 5A and 5B are each a cross-sectional view of a transistor in the channel width direction.
Figure 5B:
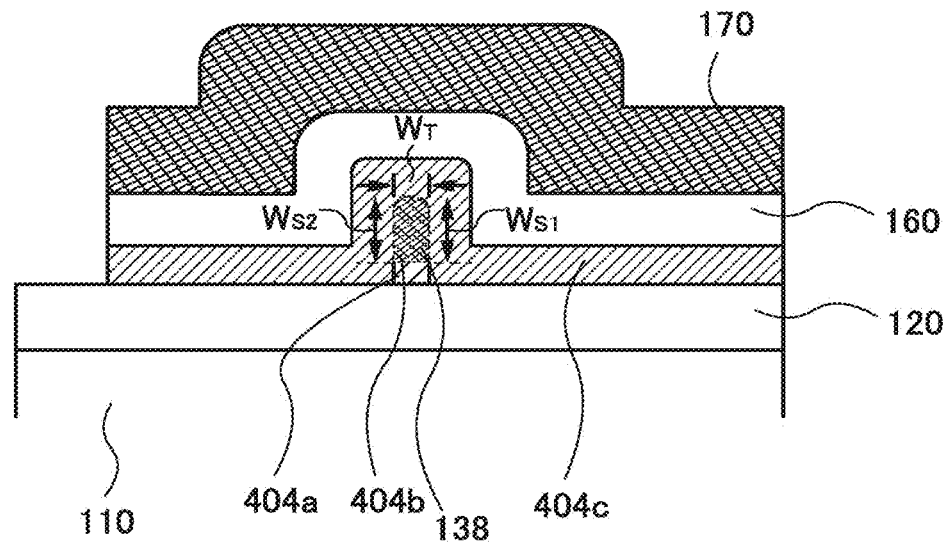

Therefore, the transistor of one embodiment of the present invention produces excellent effects particularly when having a structure in which $W_T$ shown in FIG. 5A or FIG. 5B is reduced to be substantially the same as the thickness of the oxide semiconductor film 404b or smaller.

In the case of a transistor illustrated in FIG. 5A or FIG. 5B, an electric field from the gate electrode 170 to the side surface of the oxide semiconductor film 404b is applied to the entire oxide semiconductor film 404b; thus, a channel is formed equally in the side and top surfaces of the oxide semiconductor film 404b.

In the case where a channel region 137 as in FIG. 5A is formed in the transistor, the channel width can be defined as the sum of $W_T$, $W_{S1}$, and $W_{S2}$, and on-state current flows in the transistor in accordance with the channel width.

In the case of a transistor with an extremely small $W_T$ as illustrated in FIG. 5B, a channel region 138 is formed entirely in the oxide semiconductor film 404b in the $W_T$ direction, in some cases. In this case, current flows in the entire oxide semiconductor film 404b; thus, extremely high on-state current flows in the transistor. In the case where $W_T$ and $W_{S1}$ of the transistor illustrated in FIG. 5A are sufficiently small, current flows in the entire oxide semiconductor film 404b.

One feature of the transistor of one embodiment of the present invention is that $T_{GI1}$ and $T_{GI2}$ of the gate insulating film 160 are substantially equal. In such a case, an electric field applied from the gate electrode 170 to the oxide semiconductor film 404b does not vary and a channel is formed uniformly in the top surface and the side surface of the oxide semiconductor film 404b, Thus, in the case where $W_{S1}$ and $W_{S2}$ are equal to $W_T$, on-state current can be approximately three times as high as that in the case where a channel is formed only in the top surface. In the case where $W_{S1}$ and $W_{S2}$ are each twice as long as $W_T$, on-state current can be approximately five times as high as that in the case where a channel is formed only in the top surface.

Since $T_{GI1}$ and $T_{GI2}$ of the gate insulating film 160 of the transistor of one embodiment of the present invention are substantially equal, a portion having low withstand voltage is not formed in the gate insulating film 260 and a highly reliable transistor can be formed.

To efficiently improve the on-state current of the transistor, $W_T/W_{S1}$ ($W_T/W_{S2}$) is less than or equal to 3, preferably, $W_T/W_{S1}$ ($W_T/W_{S2}$) is approximately 1. Specifically, $W_T/W_{S1}$ ($W_T/W_{S2}$) is 0.7 to 1.3. In the case where $W_T/W_{S1}$ ($W_T/W_{S2}$) is larger than 3, the S value and the off-state current might be increased.

As described above, with the transistor of one embodiment of the present invention, sufficiently high on-state current can be obtained even when the transistor is miniaturized. The structure of such a transistor in which a gate electrode electrically covers an oxide semiconductor film and on-state current is increased is also referred to as a surrounded channel (s-channel) structure.

In the transistor of one embodiment of the present invention, the oxide semiconductor film 404b is formed over the first oxide film 404a, so that an interface state is less likely to be formed. In addition, impurities do not enter the oxide semiconductor film 404b from above and below because the oxide semiconductor film 404b is an intermediate layer in a three-layer structure. With the structure in which the oxide semiconductor film 404b is surrounded by the first oxide film 404a and the second oxide film 404c, on-state current of the transistor is increased as described above, and in addition, threshold voltage can be stabilized and an S value can be reduced. Thus, Icut (current when gate voltage VG is 0 V) can be reduced and power consumption can be reduced. Further, the threshold voltage of the transistor becomes stable; thus, long-term reliability of the semiconductor device can be improved.

The transistor of one embodiment of the present invention may include a conductive film between the base insulating film 120 and the substrate 110. When the conductive film is used as a second gate electrode, the on-state current can be further increased and the threshold voltage can be controlled. In order to increase the on-state current, for example, the gate electrode 170 and the conductive film are set to have the same potential, and the transistor is driven as a dual-gate transistor. Further, to control the threshold voltage, a fixed potential, which is different from a potential of the gate electrode 170, is supplied to the conductive film.

Figure 6A:
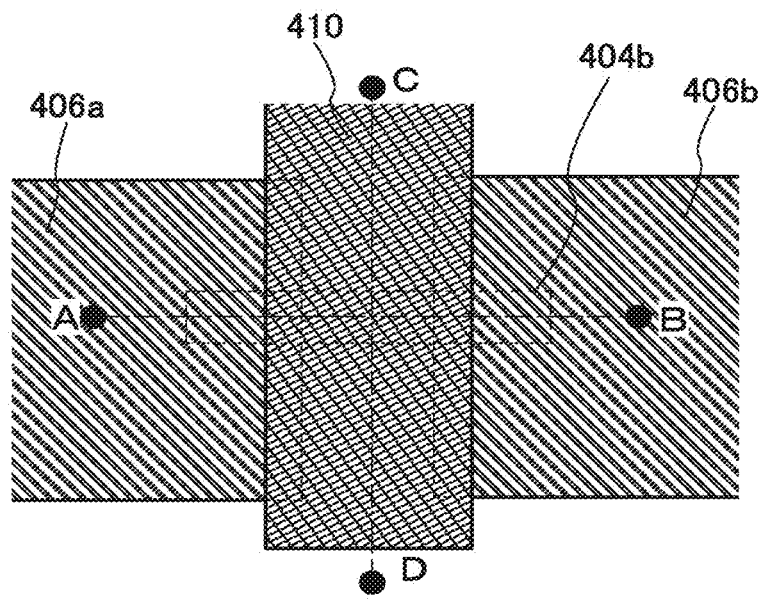
FIGS. 6A to 6C are a top view and cross-sectional views illustrating a transistor.
Figure 6B:
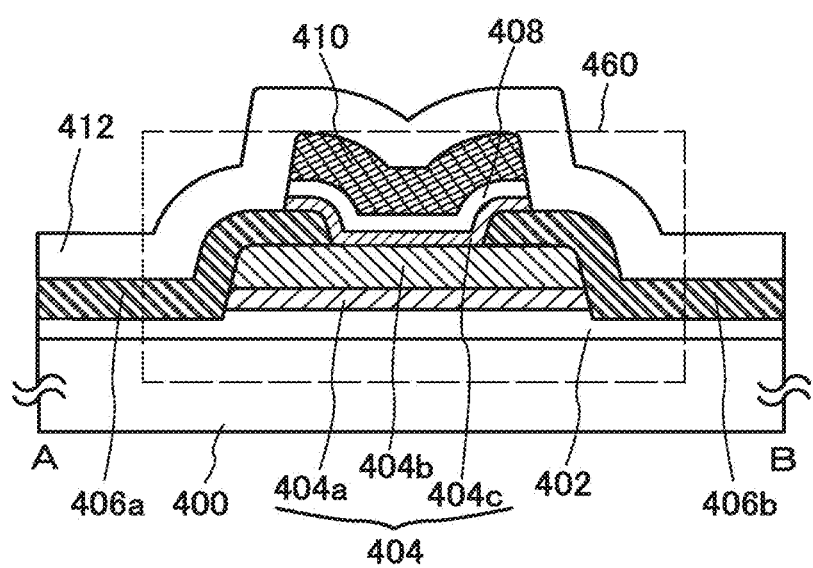
Figure 6C:
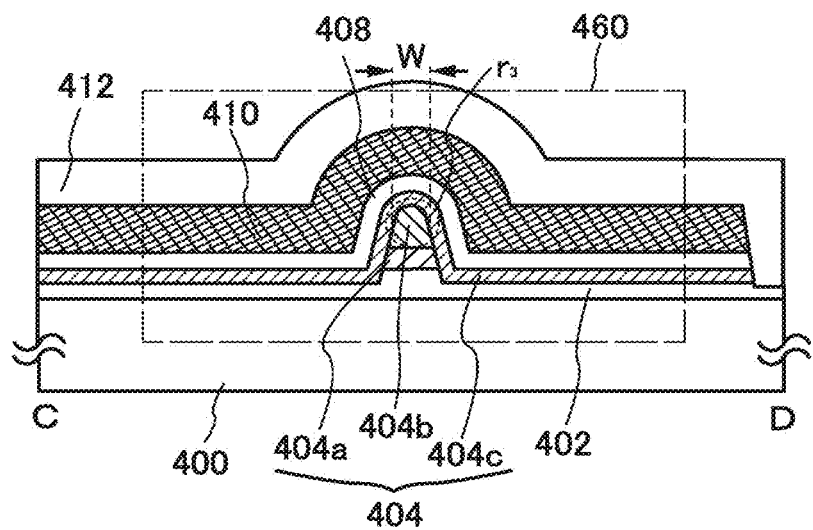

A transistor 460 illustrated in FIGS. 6A to 6C can be used. FIGS. 6A to 6C are a top view and cross-sectional views which illustrate the transistor 460. FIG. 6A is the top view. FIG. 6B illustrates a cross section taken along the dashed-dotted line A-B in FIG. 6A. FIG. 6C illustrates a cross section taken along the dashed-dotted line C-D in FIG. 6A. Note that for simplification of the drawing, some components are not illustrated in the top view in FIG. 6A.

A difference of the transistor FIGS. 6A to 6C from the transistor in FIGS. 1A to 1C is that the top surface of the oxide semiconductor film 404b does not have a flat portion when seen in the channel width direction as shown in FIG. 6C.

Figure 7:
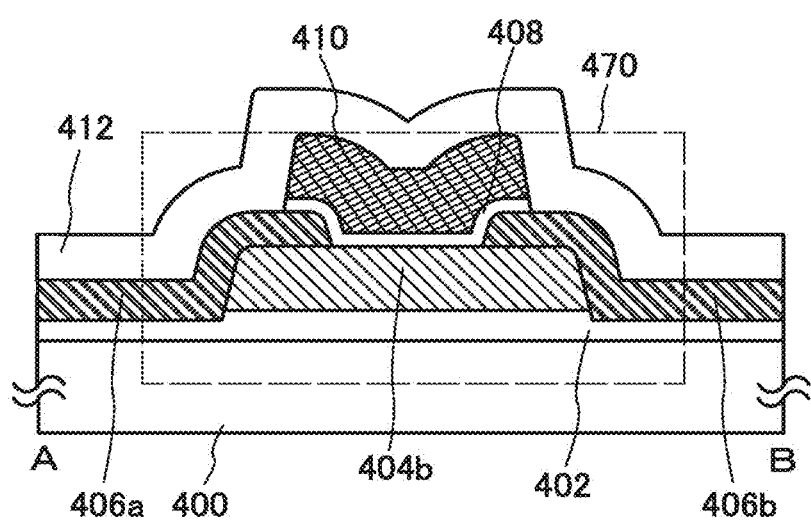
FIG. 7 is a cross-sectional view of a transistor.

In the transistor 450 in FIGS. 1A to 1C and the transistor 460 in FIGS. 6A to 6C, the multilayer film 404 has a structure in which the oxide semiconductor film 404b is sandwiched by the first oxide film 404a and the second oxide film 404c. The structure of the multilayer film 404 is not limited to this structure, and may be a structure of a transistor 470 in FIG. 7, in which the first oxide film 404a and the second oxide film 404c are not provided and only the oxide semiconductor film 404b is provided.

This embodiment can be combined as appropriate with any of the other embodiments in this specification.

Embodiment 2

In this embodiment, a method for forming the transistor 450, which is described in Embodiment 1 with reference to FIGS. 1A to 1C, is described with reference to FIGS. 8A to 8C and FIGS. 9A to 9C.

Figure 8A:
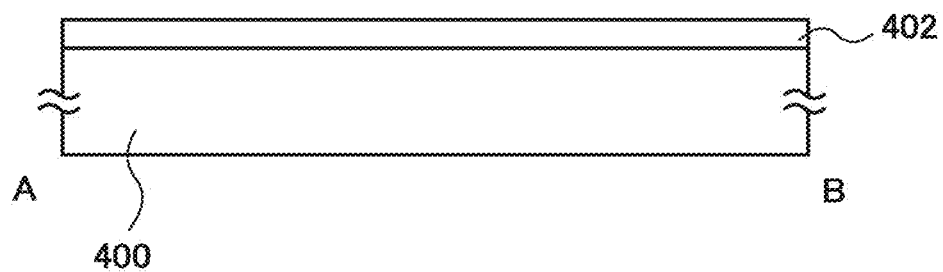
FIGS. 8A to 8C are cross-sectional views illustrating a method for fabricating a transistor.

First, the base insulating film 402 is formed over the substrate 400 (see FIG. 8A).

For the substrate 400, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like can be used. Further alternatively, any of these substrates further provided with a semiconductor element can be used.

The base insulating film 402 can be formed by a plasma CVD method, a sputtering method, or the like using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a film in which any of the above materials are mixed. Alternatively, a stack including any of the above materials may be used, and at least an upper layer of the base insulating film 402 which is in contact with the multilayer film 404 is preferably formed using a material containing excess oxygen that might serve as a supply source of oxygen to the multilayer film 404.

Oxygen may be added to the base insulating film 402 by an ion implantation method, an ion doping method, a plasma immersion ion implantation method, or the like. Adding oxygen enables the base insulating film 402 to supply oxygen much easily to the multilayer film 404.

In the case where a surface of the substrate 400 is made of an insulator and there is no influence of impurity diffusion to the multilayer film 404 to be formed later, the base insulating film 402 is not necessarily provided.

Figure 8B:
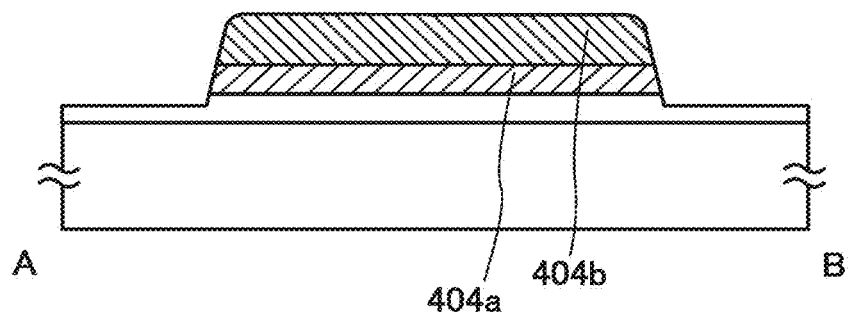

Next, the first oxide film 404a and the oxide semiconductor film 404b are formed over the base insulating film 402 by a sputtering method, a CVD method, an MBE method, an ALD method, or a PLD method (see FIG. 8B). At this time, as shown in FIG. 8B, the base insulating film 402 can be slightly over-etched. By over-etching of the base insulating film 402, the gate electrode 410 to be formed later can cover the second oxide film 404c easily.

For processing the first oxide film 404a and the oxide semiconductor film 404b into island shapes, first, a film to be a hard mask (e.g., a tungsten film) and a resist mask are provided over the oxide semiconductor film 404b, and the film to be a hard mask is etched into a hard mask. Then, the resist mask is removed, and the first oxide film 404a and the oxide semiconductor film 404b are etched using the hard mask. After that, the hard mask is removed. At this step, the hard mask is gradually reduced as the etching progresses; as a result, end portions of the hard mask become round and a surface of the hard mask is curved. With this structure, the coverage with the second oxide film 404c, the gate insulating film 408, the gate electrode 410, and the oxide insulating film 412, which are to be formed over the oxide semiconductor film 404b, can be improved; thus, occurrence of a shape defect such as disconnection can be inhibited. In addition, electric field concentration which might occur at end portions of the source electrode 406a and the drain electrode 406b can be reduced, which can suppress deterioration of the transistor.

In order to form a continuous energy band in a stack including the first oxide film 404a and the oxide semiconductor film 404b, or a stack including the first oxide film 404a, the oxide semiconductor film 404b, and the second oxide film 404c to be formed in a later step, the layers need to be formed successively without exposure to the air with the use of a multi-chamber deposition apparatus (e.g., a sputtering apparatus) including a load lock chamber. It is preferable that each chamber of the sputtering apparatus be able to be evacuated to a high vacuum (to approximately higher than or equal to $5\times10^{-7}$ Pa and lower than or equal to $1\times10^{-4}$ Pa) by an adsorption vacuum evacuation pump such as a cryopump and that the chamber be able to heat a substrate over which a film is to be deposited to 100° C. or higher, preferably 500° C. or higher, so that water and the like acting as impurities of an oxide semiconductor are removed as much as possible. Alternatively, a combination of a turbo molecular pump and a cold trap is preferably used to prevent back-flow of a gas containing a carbon component, moisture, or the like from an evacuation system into the chamber.

Not only high vacuum evacuation of the chamber but also high purity of a sputtering gas is necessary to obtain a highly purified intrinsic oxide semiconductor. An oxygen gas or an argon gas used as the sputtering gas is highly purified to have a dew point of −40° C. or lower, preferably −80° C. or lower, further preferably −100° C. or lower, so that entry of moisture and the like into the oxide semiconductor film can be prevented as much as possible.

The materials described in Embodiment 1 can be used for the first oxide film 404a, the oxide semiconductor film 404b, and the second oxide film 404c that is to be formed in a later step. For example, an In—Ga—Zn oxide whose atomic ratio of In to Ga and Zn is 1:3:4 or 1:3:2 can be used for the first oxide film 404a, an In—Ga—Zn oxide whose atomic ratio of In to Ga and Zn is 1:1:1 can be used for the oxide semiconductor film 404b, and an In—Ga—Zn oxide whose atomic ratio of In to Ga and Zn is 1:3:4 or 1:3:2 can be used for the second oxide film 404c.

An oxide semiconductor that can be used for each of the first oxide film 404a, the oxide semiconductor film 404b, and the second oxide film 404c preferably contains at least indium (In) or zinc (Zn). Alternatively, the oxide semiconductor preferably contains both In and Zn. In order to reduce variations in the electrical characteristics of the transistor including the oxide semiconductor, the oxide semiconductor preferably contains a stabilizer in addition to In and/or Zn.

Examples of a stabilizer include gallium (Ga), tin (Sn), hafnium (Hf), aluminum (Al), and zirconium (Zr). Other examples of a stabilizer are lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

Note that here, for example, an "In—Ga—Zn oxide" means an oxide containing In, Ga, and Zn as its main components. The In—Ga—Zn oxide may contain a metal element other than In, Ga, and Zn. Further, in this specification, a film formed using an In—Ga—Zn oxide is also referred to as an IGZO film.

Alternatively, a material represented by $InMO_3(ZnO)_m$ (m>0, where n is not an integer) may be used. Note that M represents one or more metal elements selected from Ga, Fe, Mn, and Co. Further alternatively, a material represented by $In_2SnO_5(ZnO)_n$ (n>0, where n is an integer) may be used.

Note that as described in Embodiment 1 in detail, materials an selected so that the first oxide film 404a and the second oxide film 404a each have an electron affinity lower than that of the oxide semiconductor film 404b.

The oxide films and the oxide semiconductor film are each preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

In the case of using an In—Ga—Zn oxide, a material whose atomic ratio of In to Ga and Zn is any of 1:1:1, 1:1:1.2, 1:1:1.5, 2:2:1, 3:1:2, 1:3:2, 1:3:4, 1:4:3, 1:5:4, 1:6:6, 2:1:3 1:6:4, 1:9:6, 1:1:4, and 1:1:2 is used for the first oxide film 404a, the oxide semiconductor film 404b, and/or the second oxide film 404c so that the first oxide film 404a and the second oxide film 404c each have an electron affinity lower than that of the oxide semiconductor film 404b.

Note that for example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1) a, b, and c satisfy the following relation: $(a-A)^2+(b-B)^2+(c-C)^2 r^2$, and r may be 0.05, for example. The same applies to other oxides.

The indium content of the oxide semiconductor film 404b is preferably higher than the indium content of the first oxide film 404a and the indium content of the second oxide film 404c. In an oxide semiconductor, the s orbital of heavy metal mainly contributes to carrier transfer, and when the proportion of In in the oxide semiconductor is increased, overlap of the s orbitals is likely to be increased. Thus, an oxide having a composition in which the proportion of In is higher than that of Ga has higher mobility than an oxide having a composition in which the proportion of In is equal to or lower than that of Ga. For this reason, with the use of an oxide having a high indium content for the oxide semiconductor film 404b, a transistor having high mobility can be achieved.

A structure of an oxide semiconductor film is described below.

Note that in this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (bright spots) having alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 37A).

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when p scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axes of the crystal are aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a reduction in crystallinity. Further, a heavy metal such as iron or nickel, argon, carbon dioxide, or the like has a large atomic radius (or molecular radius), and thus disturbs the atomic arrangement of the oxide semiconductor film and causes a reduction in crystallinity when it is contained in the oxide semiconductor film. Note that the impurity contained in the oxide semiconductor film might serve as a carrier trap or a carrier generation source.

Further, the CAAC-OS film is an oxide semiconductor film having a low density of defect states. For example, an oxygen vacancy in the oxide semiconductor film serves as a carrier trap or a carrier generation source in some cases when hydrogen is captured therein.

The state in which the impurity concentration is low and the density of defect states is low (the number of oxygen vacancies is small) is referred to as a highly purified intrinsic state or a substantially highly purified intrinsic state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small variations in electrical characteristics and high reliability. Electric charge trapped by the carrier traps in the oxide semiconductor film takes a long time to be released, and might behave like fixed electric charge. Thus, the transistor that includes the oxide semiconductor film having high impurity concentration and a high density of defect states has unstable electrical characteristics in some cases.

With the use of the CAAC-OS film in a transistor, variations in the electrical characteristics of the transistor due to irradiation with visible light or ultraviolet light are small.

Next, a polycrystalline oxide semiconductor film is described.

In an image obtained with a TEM, for example, crystal grains can be found in the polycrystalline oxide semiconductor film. In most cases, the size of a crystal grain in the polycrystalline oxide semiconductor film is greater than or equal to 2 an and less than or equal to 300 nm, greater than or equal to 3 nm and less than or equal to 100 nm, or greater than or equal to 5 am and less than or equal to 50 nm in an image obtained with the TEM, for example. Moreover, in an image obtained with the TEM, a boundary between crystals can be found in the polycrystalline oxide semiconductor film in some cases.

The polycrystalline oxide semiconductor film may include a plurality of crystal grains, and alignment of crystals may be different in the plurality of crystal grains. The polycrystalline oxide semiconductor film is subjected to structural analysis with an XRD apparatus. For example, when the polycrystalline oxide semiconductor film including an $InGaZnO_4$ crystal is analyzed by an out-of-plane method, peaks of $2\theta$ appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary between the crystals in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has larger variation in electrical characteristics and lower reliability than a transistor including a CAAC-OS film in some cases.

Next, a microcrystalline oxide semiconductor film is described.

In an image obtained with a TEM, crystal parts cannot be found clearly in the microcrystalline oxide semiconductor in some cases. In most cases, the size of a crystal part in the microcrystalline oxide semiconductor film is greater than or equal to 1 nm and less than or equal to 100 am, or greater than or equal to 1 nm and less than or equal to 10 nm. An oxide semiconductor film including nanocrystal (nc), which is a microcrystal with a size greater than or equal to 1 nm and less than or equal to 10 nm, or a size greater than or equal to 1 nm and less than or equal to 3 nm, is specifically referred to as a nanocrystalline oxide semiconductor (nc-OS) film. In an image of the nc-OS film obtained with a TEM, for example, a crystal grain cannot be observed clearly in some cases.

In the nc-OS film, a microscopic region (e.g., a region with a size greater than or equal to 1 m and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is observed in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are observed in a nanobeam electron diffraction pattern of the nc-OS film obtained by using an electron beam having a probe diameter close to, or smaller than or equal to the diameter of a crystal part. In same cases, in a nanobeam electron diffraction pattern of the nc-OS film, regions with high luminance in a circular (ring) pattern are observed. Further in a nanobeam electron diffraction pattern of the nc-OS film, a plurality of spots are shown in a ring-like region in some cases (see FIG. 37B).

Since an nc-OS film is an oxide semiconductor film having more regularity than an amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than a CAAC-OS film.

Thus, the nc-OS film may have a higher carrier density than the CAAC-OS film. The oxide semiconductor film having a high carrier density may have high electron mobility. Thus, a transistor including the nc-OS film may have high field-effect mobility. The nc-OS film has a higher defect state density than the CAAC-OS film, and thus may have a lot of carrier traps. Consequently, a transistor including the nc-OS film has larger variation in electrical characteristics and lower reliability than a transistor including the CAAC-OS film. The nc-OS film can be formed easily as compared to the CAAC-OS film because nc-OS film can be formed even when a relatively large amount of impurities are included; thus, depending on the purpose, the nc-OS film can be favorably used in some cases. Therefore, a semiconductor device including the transistor including the nc-OS film can be manufactured with high productivity in some cases.

Next, an amorphous oxide semiconductor film is described.

The amorphous oxide semiconductor film has disordered atomic arrangement and no crystal part. For example, the amorphous oxide semiconductor film does not have a specific state as in quartz.

In an image obtained with a TEM, crystal parts cannot be found in the amorphous oxide semiconductor film.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has a much higher carrier density than the nc-OS film. Therefore, a transistor including the amorphous oxide semiconductor film tends to be normally on. Thus, in some cases, such an amorphous oxide semiconductor layer can be applied to a transistor which needs to be normally on. Since the amorphous oxide semiconductor film has a high density of defect states, carrier traps might be increased. Consequently, a transistor including the amorphous oxide semiconductor film has larger variation in electrical characteristics and lower reliability than a transistor including the CAAC-OS film or the nc-OS film.

Next, a single-crystal oxide semiconductor film is described.

The single-crystal oxide semiconductor film has a lower impurity concentration and a lower density of defect states (a small amount of oxygen vacancy). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may be a stacked film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 38B:
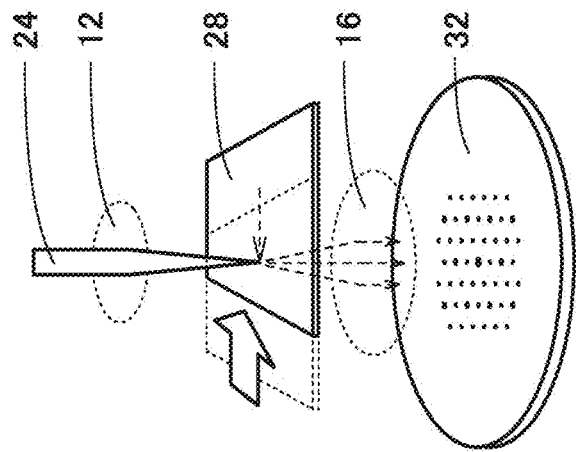
FIGS. 38A and 38B illustrate an example of a transmission electron diffraction measurement apparatus.
Figure 38A:
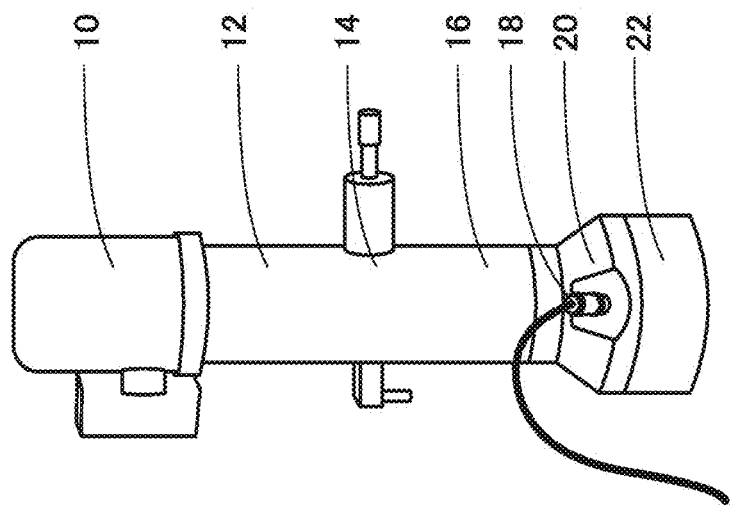

FIG. 38A illustrates a transmission electron diffraction measurement apparatus which includes an electron gun chamber 10, an optical system 12 below the electron gun chamber 10, a sample chamber 14 below the optical system 12, an optical system 16 below the sample chamber 14, an observation chamber 20 below the optical system 16, a camera 18 installed in the observation chamber 20, and a film chamber 22 below the observation chamber 20. The camera 18 is provided to ace toward the inside of the observation chamber 20. Note that the film chamber 22 is not necessarily provided.

FIG. 38B illustrates an internal structure of the transmission electron diffraction measurement apparatus illustrated in FIG. 38A. In the transmission electron diffraction measurement apparatus, a substance 28 which is positioned in the sample chamber 14 is irradiated with electrons emitted from an electron gun installed in the electron gun chamber 10 through the optical system 12. Electrons passing through the substance 28 enter a fluorescent plate 32 provided in the observation chamber 20 through the optical system 16. On the fluorescent plate 32, a pattern corresponding to the intensity of entered electron appears, which allows measurement of a transmission electron diffraction pattern.

The camera 18 is installed so as to face the fluorescent plate 32 and can take a picture of a pattern appearing in the fluorescent plate 32. An angle formed by a straight line which passes through the center of a lens of the camera 18 and the center of the fluorescent plate 32 and an upper surface of the fluorescent plate 32 is, for example, 15° or more and 80° or less, 30° or more and 75° or less, or 45° or more and 70° or less. As the angle is reduced, distortion of the transmission electron diffraction pattern taken by the camera 18 becomes larger. Note that if the angle is obtained in advance, the distortion of an obtained transmission electron diffraction pattern can be corrected. Note that the film chamber 22 may be provided with the camera 18. For example, the camera 18 may be set in the film chamber 22 so as to be opposite to the incident direction of electrons 24. In this case, a transmission electron diffraction pattern with less distortion can be taken from the rear surface of the fluorescent plate 32.

A holder for fixing the substance 28 that is a sample is provided in the sample chamber 14. The holder transmits electrons passing through the substance 28. The holder may have, for example, a function of moving the substance 28 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 28.

Then, a method for measuring a transmission electron diffraction pattern of a substance by the transmission electron diffraction measurement apparatus described above is described.

Figure 37A:
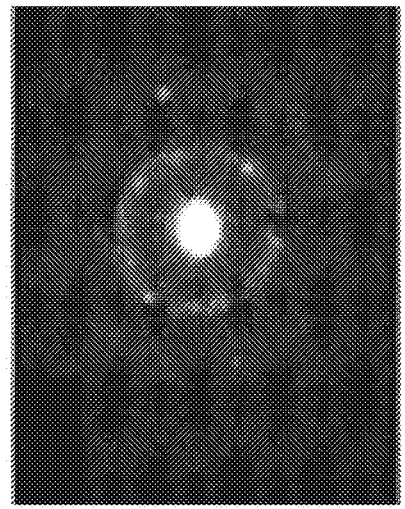
FIGS. 37A and 37B each show a nanobeam electron diffraction pattern of an oxide semiconductor film.
Figure 37B:
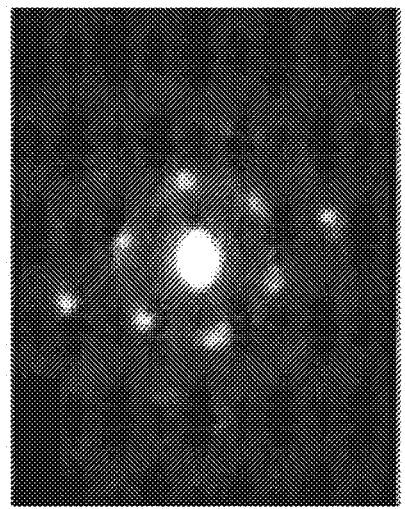

For example, changes in the structure of a substance can be observed by changing (scanning) the irradiation position of the electrons 24 that are a nanobeam in the substance, as illustrated in FIG. 38B. At this time, when the substance 28 is a CAAC-OS film, a diffraction pattern as shown in FIG. 37A is observed. When the substance 28 is an nc-OS film, a diffraction pattern shown in FIG. 37B is observed.

Even when the substance 28 is a CAAC-OS film, a diffraction pattern similar to that of an nc-OS film or the like is partly observed in some cases. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 60%, preferably higher than or equal to 80%, further preferably higher than or equal to 90%, still further preferably higher than or equal to 95%. Note that a proportion of a region where a diffraction pattern different from that of a CAAC-OS film is observed is referred to as the proportion of not-CAAC.

For example, transmission electron diffraction patterns were obtained by scanning a top surface of a sample including a CAAC-OS film obtained just after deposition (represented as "as-depo") and a top surface of a sample including a CAAC-OS subjected to heat treatment at 350° C. or 450° C. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used.

Figure 39:
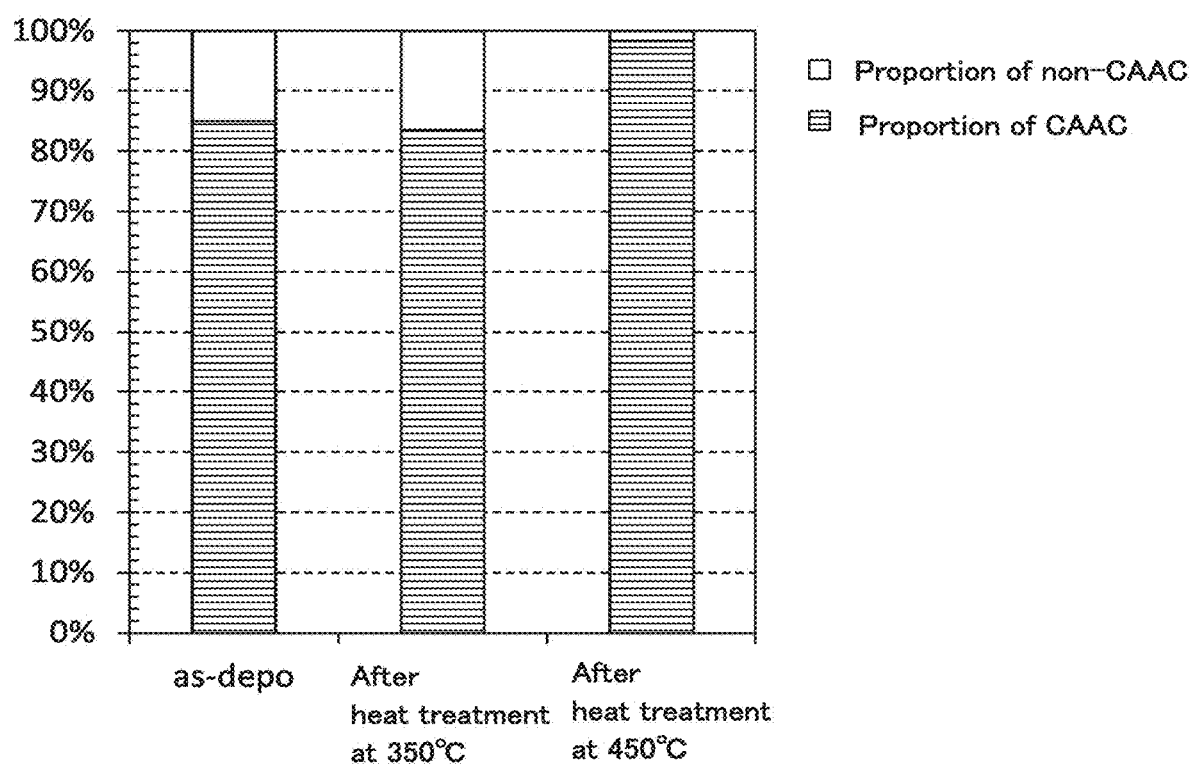
FIG. 39 illustrates an example of a structure analysis by transmission electron diffraction measurement.

FIG. 39 shows the proportion of CAAC in each sample. These results show that the proportion of CAAC obtained after the beat treatment at 450° C. is higher than that obtained just after the deposition or after the heat treatment at 350° C. That is, heat treatment at a temperature higher than 350° C. (e.g., higher than or equal to 400° C.) reduces the proportion of non-CAAC (increases the proportion of CAAC). Here, most of diffraction patterns different from that of a CAAC-OS film are diffraction patterns similar to that of an nc-OS film. Therefore, the above results suggest that the region having a structure similar to that of an nc-OS film is rearranged by the heat treatment owing to the influence of the structure of the adjacent region, whereby the region becomes CAAC.

With such a measurement method, the structure of an oxide semiconductor film having a plurality of structures can be analyzed in some cases.

A CAAC-OS film can be deposited by a sputtering method with a polycrystalline oxide semiconductor sputtering target, for example. When ions collide with the sputtering target, a crystal region included in the sputtering target may be separated from the target along the a-b plane; in other words, a sputtered particle having a plane parallel to the a-b plane (a flat-plate-like sputtered particle or a pellet-like sputtered particle) might flake off from the target. In this case, the flat-plate-like sputtered particle or the pellet-like sputtered particle is electrically charged and thus reaches a substrate while maintaining its crystal state without being aggregated in plasma, whereby a CAAC-OS film can be formed.

First heat treatment may be performed after the oxide semiconductor film 404b is formed. The first heat treatment may be performed at a temperature higher than or equal to 250° C. and lower than or equal to 650° C., preferably higher than or equal to 300° C. and lower than or equal to 500° C., in an inert gas atmosphere, in an atmosphere containing an oxidizing gas at 10 ppm or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more in order to compensate desorbed oxygen. By the first heat treatment, the crystallinity of the oxide semiconductor film 404b can be improved, and in addition, impurities such as hydrogen and water can be removed from the base insulating film 402 and the first oxide film 404a. Note that the first heat treatment may be performed before etching for formation of the oxide semiconductor film 404b.

A first conductive film to be the source electrode 406a and the drain electrode 406b is formed over the first oxide film 404a and the oxide semiconductor film 404b. For the first conductive film, Al, Cr, Cu, Ta, Ti, Mo, W, or an alloy material containing any of these as its main component can be used. For example, a 100-nm-thick titanium film is formed by a sputtering method or the like. Alternatively, a tungsten film may be formed by a CVD method.

Figure 8C:
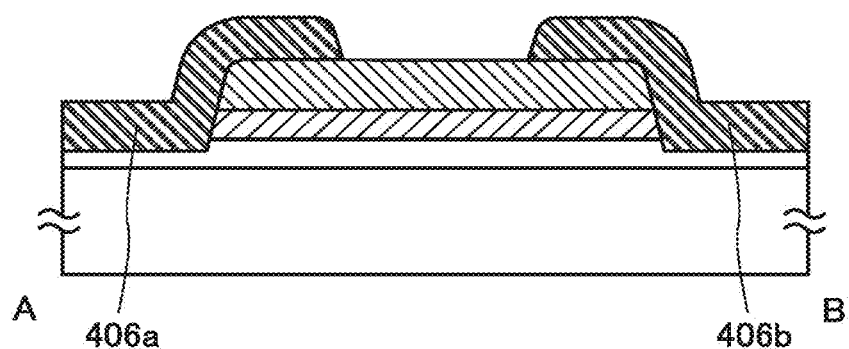

Then, the first conductive film is etched so as to be divided over the oxide semiconductor film 404b to form the source electrode 406a and the drain electrode 406b (see FIG. 8C). At this time, the first conductive film may be over-etched, so that the base insulating film 402 is partly etched.

Next, the second oxide film 403c is formed over the first oxide film 404a, the oxide semiconductor film 404b, the source electrode 406a, and the drain electrode 406b.

Note that second beat treatment may be performed after the second oxide film 403c is formed. The second heat treatment can be performed under conditions similar to those of the first heat treatment. The second heat treatment can remove impurities such as hydrogen and water from the second oxide film 403c. In addition, impurities such as hydrogen and water can be further removed from the first oxide film 404a and the oxide semiconductor film 404b.

Figure 9A:
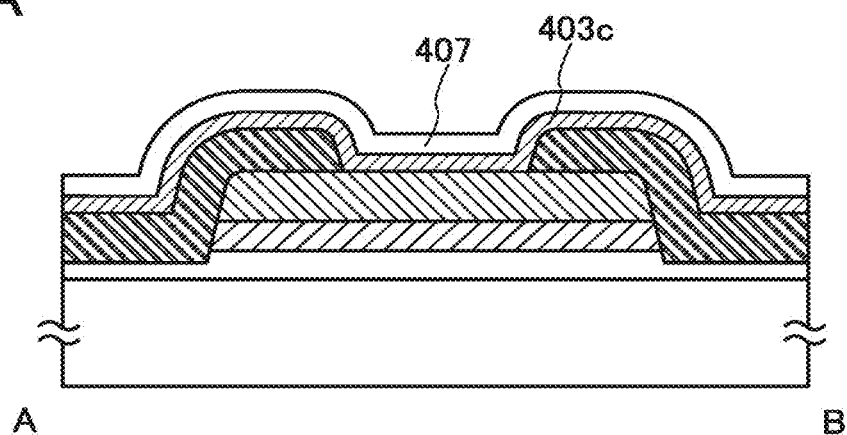
FIGS. 9A to 9C are cross-sectional views illustrating the method for fabricating a transistor.

Next, an insulating film 407 to be the gate insulating film 408 is formed over the second oxide film 403c (see FIG. 9A). The insulating film 407 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The insulating film 407 may be a stack including any of the above materials. The insulating film 407 can be formed by a sputtering method, a CVD method, an MBE method, an ALD method, a PLD method, or the like. It is preferable to form the gate insulating film 408 by selecting a raw material, temperature, pressure, the distance between electrodes, applied power, and the like so that the coverage can be improved and $T_{GI1}$, and $T_{GI2}$ are substantially equal to each other as illustrated in FIG. 5A. For example, the coverage can be improved by deposition under the conditions of high temperature and high pressure in a range where the film quality as a gate insulating film can be maintained.

Figure 9B:
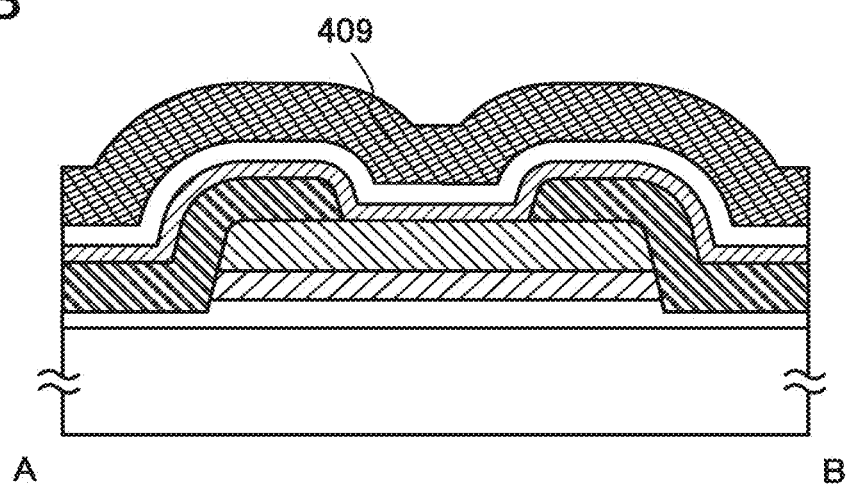

Then, a second conductive film 409 to be the gate electrode 410 is formed over the insulating film 407 (see FIG. 9B). For the second conductive film 409, Al, Ti, Cr, Co, Ni, Cu, Y, Zr, Mo, Ru, Ag, Ta, W, or an alloy material containing any of these as its main component can be used. The second conductive film 409 can be formed by a sputtering method, a CVD method, or the like. A stack including a conductive film containing any of the above materials and a conductive film containing nitrogen, or a conductive film containing nitrogen may be used for the second conductive film 409.

Figure 9C:
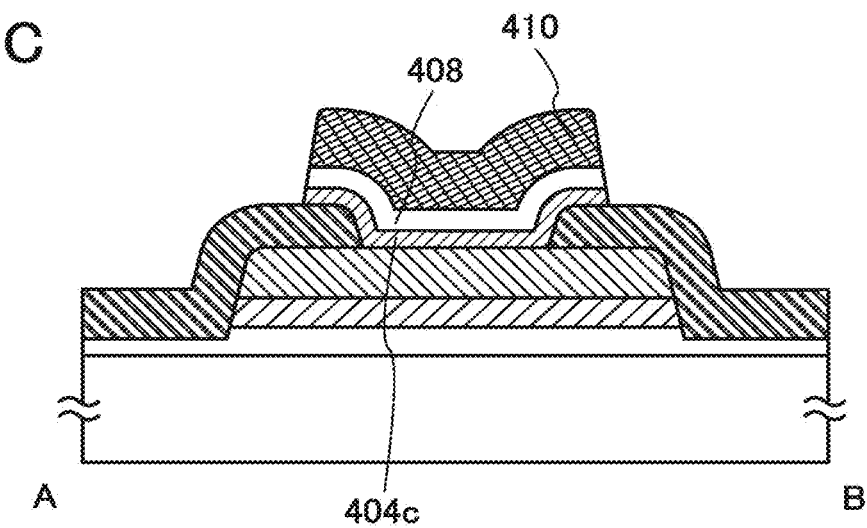

After that, the second conductive film 409 is selectively etched using a resist mask to form the gate electrode 410 (see FIG. 9C).

Then, the insulating film 407 is selectively etched using the resist mask or the gate electrode 410 as a mask to form the gate insulating film 408.

Subsequently, the second oxide film 403c is etched using the resist mask or the gate electrode 410 as a mask to form the second oxide film 404c.

A top end portion of the second oxide film 404c is aligned with a bottom end portion of the gate insulating film 408. A top end portion of the gate insulating film 408 is aligned with a bottom end portion of the gate electrode 410. Although the gate insulating film 408 and the second oxide film 404c are formed using the gate electrode 410 as a mask, the gate insulating film 408 and the second oxide film 404c may be formed before the second conductive film 409 is formed.

Next, the oxide insulating film 412 is formed over the source electrode 406a, the drain electrode 406b, and the gate electrode 410 (see FIG. 1B). A material and a method for the oxide insulating film 412 can be similar to those of the base insulating film 402. The oxide insulating film 412 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or an oxide insulating film containing nitrogen. The oxide insulating film 412 can be formed by a sputtering method, a CVD method, an MBE method, an ALD method, or a PLD method, and is preferably formed to contain excess oxygen so as to be able to supply oxygen to the multilayer film 404.

Oxygen may be added to the oxide insulating film 412 by an ion implantation method, an ion doping method, a plasma immersion ion implantation method, or the like. Adding oxygen enables the oxide insulating film 412 to supply oxygen much easily to the multilayer film 404.

Next, third best treatment may be performed. The third heat treatment can be performed under conditions similar to those of the first heat treatment. By the third heat treatment, excess oxygen is easily released from the base insulating film 402, the gate insulating film 408, and the oxide insulating film 412, so that oxygen vacancies in the multilayer film 404 can be reduced.

Through the above process, the transistor 450 illustrated in FIGS. 1A to 1C can be fabricated.

This embodiment can be combined as appropriate with any of the other embodiments in this specification.

Embodiment 3

In this embodiment, a transistor having a structure different from that of the transistor described in Embodiment 1 is described.

Figure 14A:
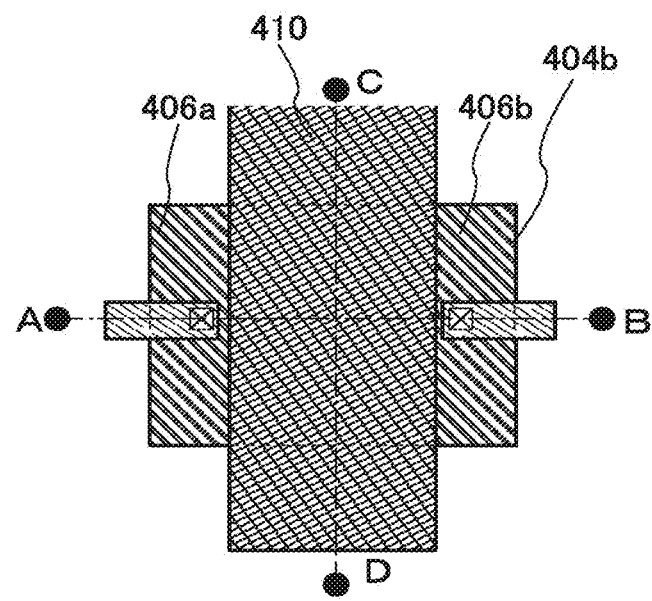
FIGS. 14A to 14C are a top view and cross-sectional views illustrating a transistor.
Figure 14B:
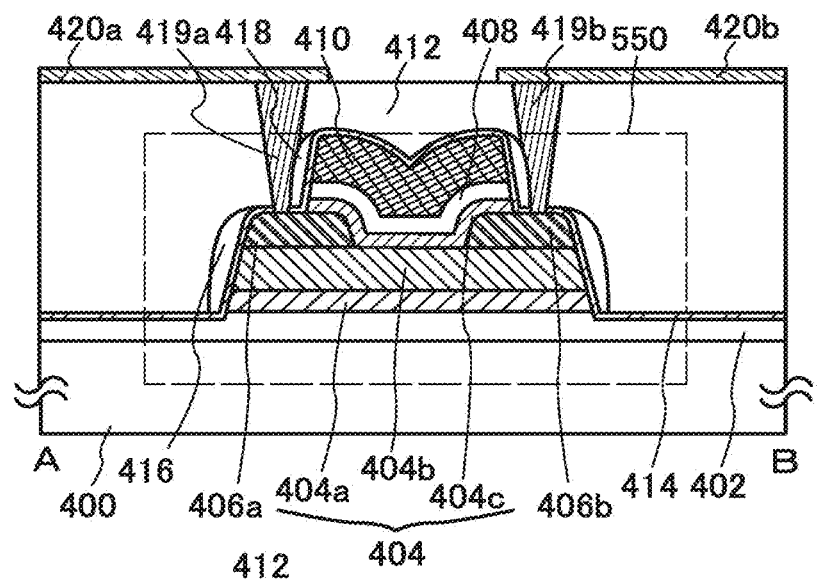
Figure 14C:
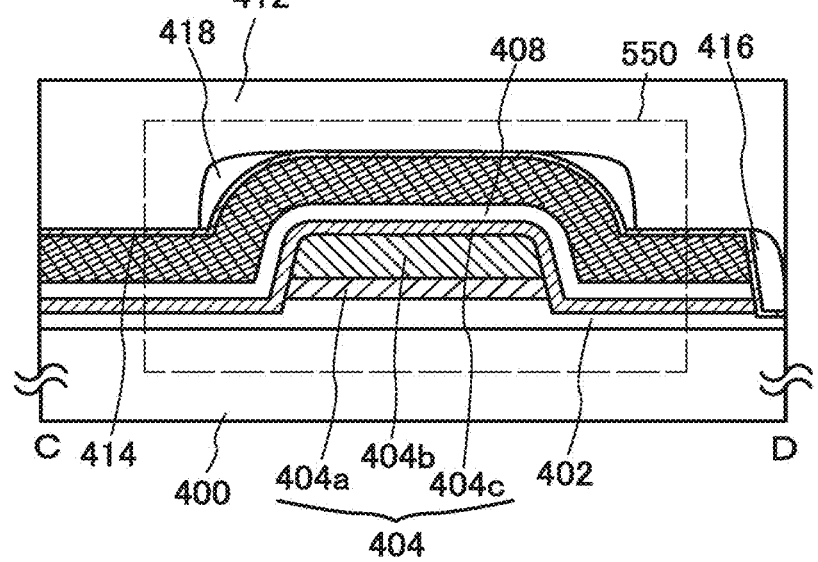

FIGS. 14A, 14B, and 14C are a top view and cross-sectional views of a transistor of one embodiment of the present invention. FIG. 14A is the top view, FIG. 14B is a cross section taken along the dashed-dotted line A-B in FIG. 14A, and FIG. 14C is a cross section taken along the dashed-dotted line C-D in FIG. 14A. Note that for simplification of the drawing, some components are not illustrated in the top view of FIG. 14A. The dashed-dotted line A-B direction is referred to as a channel length direction and the dashed-dotted line C-D direction is referred to as a channel width direction, in some cases.

A transistor 550 illustrated in FIGS. 14A to 14C includes the base insulating film 402 over the substrate 400; the first oxide film 404a and the oxide semiconductor film 404b over the base insulating film 402; the source electrode 406a and the drain electrode 406b over the first oxide film 404a and the oxide semiconductor film 404b; the second oxide film 404c over the oxide semiconductor film 404b, the source electrode 406a, and the drain electrode 406b; the gate insulating film 408 over the second oxide film 404c; the gate electrode 410 over the gate insulating film 408; a barrier film 414 over the source electrode 406a, the drain electrode 406b, the second oxide film 404c, and the gate electrode 410; a sidewall insulating film 416 covering side surfaces of the first oxide film 404a, the oxide semiconductor film 404b, the source electrode 406a, and the drain electrode 406b with the barrier film 414 positioned between the sidewall insulating film 416 and the side surfaces; a sidewall insulating film 418 covering side surfaces of the second oxide film 404c, the gate insulating film 408, and the gate electrode 410 with the barrier film 414 positioned between the sidewall insulating film 418 and the side surfaces; the oxide insulating film 412 over the source electrode 406a, the drain electrode 406b, the gate electrode 410, the sidewall insulating film 416, and the sidewall insulating film 418; an electrode 419a and an electrode 419b which are embedded in openings formed in the oxide insulating film 412 and electrically connected to the source electrode 406a and the drain electrode 406b, respectively, via the openings; and a wiring 420a and a wiring 420b which are electrically connected to the electrode 419a and the electrode 419b, respectively. The first oxide film 404a, the oxide semiconductor film 404b, and the second oxide film 404c are collectively referred to as the multilayer film 404.

The oxide semiconductor film 404b has rounded end portions and a semicircle shape. With this structure, the coverage with the gate insulating film 408 and the gate electrode 410, which are to be formed over the oxide semiconductor film 404b, can be improved.

The barrier film 414 is preferably formed with an insulating film that has a blocking effect against hydrogen, water, and oxygen. Typically, an aluminum oxide film is used. The aluminum oxide film is an insulating film having not only a blocking effect but also a function of supplying oxygen. An aluminum oxide film containing silicon oxide, which is formed using a target in which an aluminum oxide and silicon oxide are mixed, can be used. In that case, the content of silicon oxide is preferably greater than or equal to 0.1 wt % and less than or equal to 30 wt %.

Although the barrier film 414 in contact with the side surfaces of the multilayer film 404 and the gate electrode 410 might have poor coverage, the portions with poor coverage are covered with the sidewall insulating film 416 and the sidewall insulating film 418, so that hydrogen, water, and oxygen can be blocked. For the sidewall insulating film 416 and the sidewall insulating film 418, materials similar to those for the base insulating film 402 and the gate insulating film 408 can be used.

The electrode 419a and the electrode 419b are electrically connected to the source electrode 406a and the drain electrode 406b, respectively. The wiring 420a and the wiring 420b are electrically connected to the electrode 419a and the electrode 419b, respectively. In a microfabrication process, when openings are formed in the oxide insulating film 412 and the wiring 420a and the wiring 420b are formed to be electrically connected to the source electrode 406a and the drain electrode 406b via the openings, the wiring 420a and the wiring 420b do not reach the bottoms of the openings, so that the wiring 420a and the wiring 420b cannot be electrically connected to the source electrode 406a and the drain electrode 406b, respectively. For this reason, it is necessary that the openings be filled with the electrode 419a and the electrode 419b, and then the wiring 420a and the wiring 420b be formed. Note that in the case where a materials which enable the wiring 420a and the wiring 420b to be in contact with the source electrode 406a and the drain electrode 406b, respectively is used, the electrode 419a and the electrode 419a are not necessary.

For the electrode 419a, the electrode 419b, the wiring 420a, and the wiring 420b, materials similar to those for the source electrode 406a, the drain electrode 406b, and the gate electrode 410 can be used.

Figure 18A:
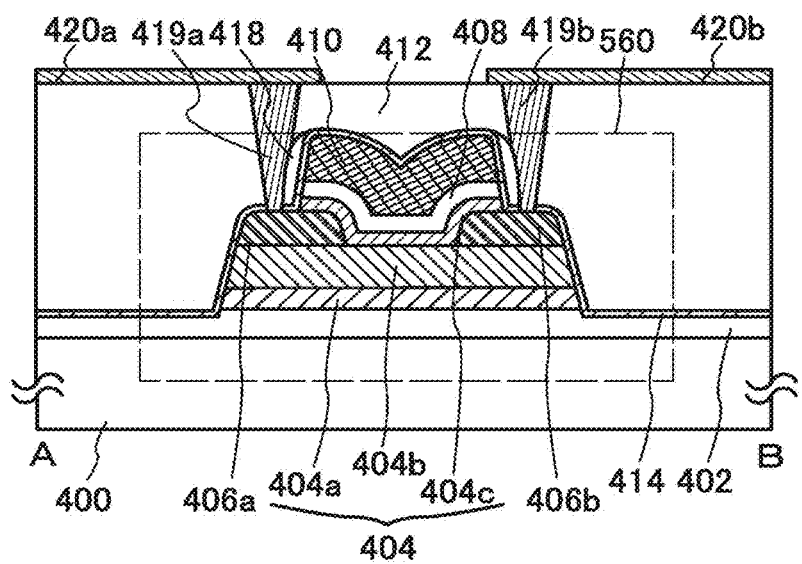
FIGS. 18A to 18C each illustrate a method for fabricating a transistor.
Figure 18B:
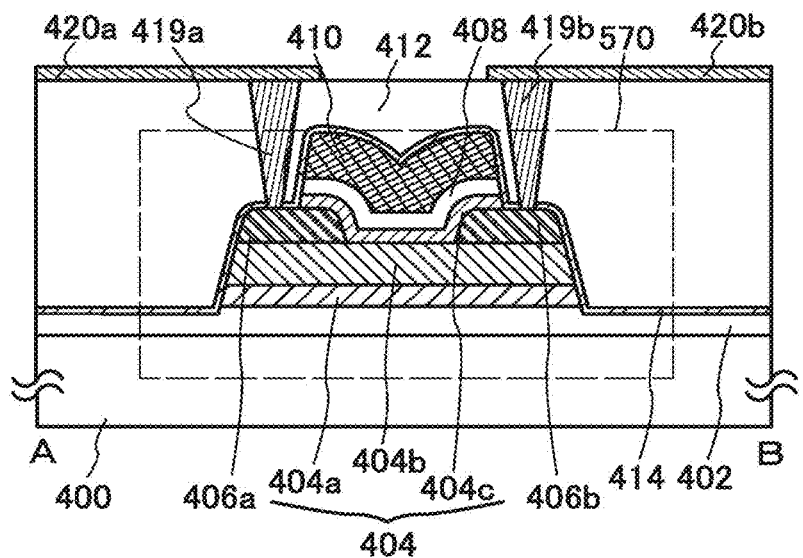

A structure of a transistor 560 illustrated in FIG. 18A in which the sidewall insulating film 416 is not provided may be employed. Alternatively, a structure of a transistor 570 illustrated in FIG. 18B in which the sidewall insulating film 416 and the sidewall insulating film 418 are not provided may be employed.

Figure 18C:
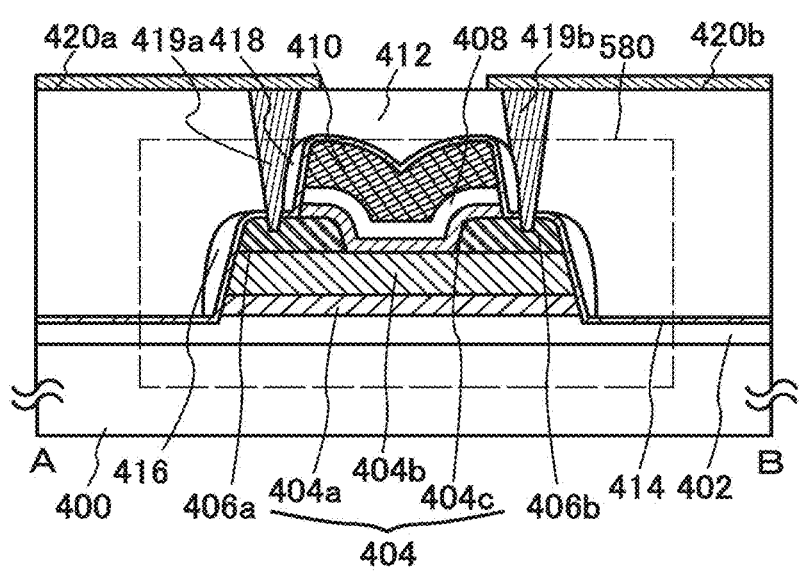

Still alternatively, a structure of a transistor 580 illustrated in FIG. 18C in which the electrode 419a and the electrode 419b are extended into the source electrode 406a and the drain electrode 406b may be employed.

This embodiment can be combined as appropriate with any of the other embodiments in this specification.

Embodiment 4

In this embodiment, a method for forming the transistor 550, which is described in Embodiment 3 with reference to FIGS. 14A to 14C, is described with reference to FIGS. 15A to 15C, 16A to 16C, and FIGS. 17A to 17C.

Figure 15A:
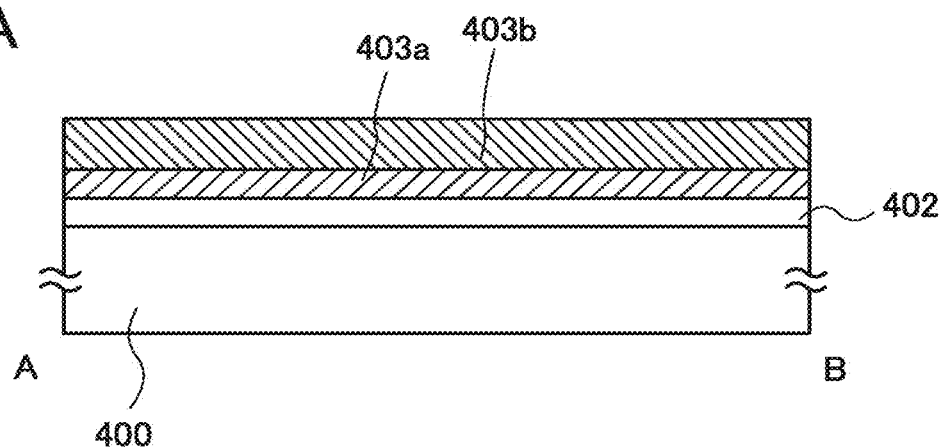
FIGS. 15A to 15C illustrate a method for fabricating a transistor.
Figure 15B:
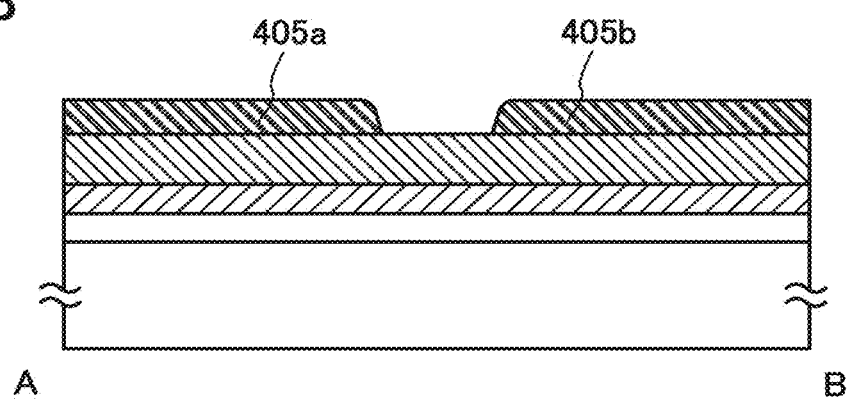

First, the base insulating film 402, a first oxide film 403a, and an oxide semiconductor film 403b are formed over the substrate 400 (see FIG. 15A). The above embodiments can be referred to for materials and formation methods of the substrate 400, the base insulating film 402, the first oxide film 403a, and the oxide semiconductor film 403b.

A conductive film to be the source electrode 406a and the drain electrode 406b is formed over the oxide semiconductor film 403b. The conductive film is etched in a region overlapping with a region where a channel is to be formed, whereby a conductive film 405a and a conductive film 405b are formed (see FIG. 15B). The above embodiments can be referred to for materials and formation methods of the conductive film to be the source electrode 406a and the drain electrode 406b.

Figure 15C:
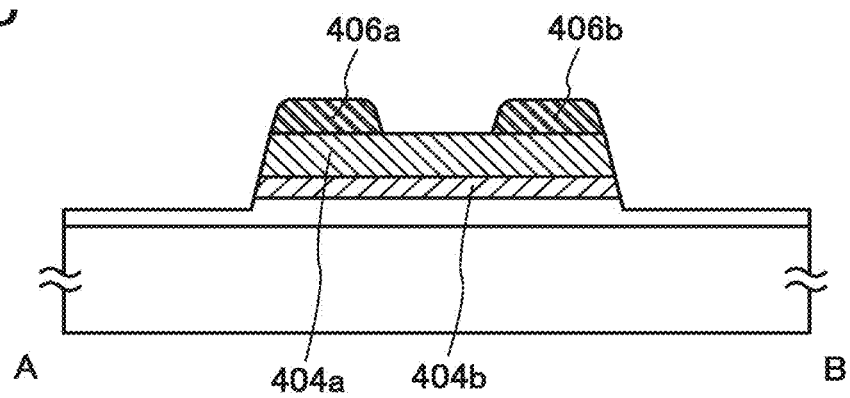

Next, a resist mask is formed over the conductive film 405a and the conductive film 405b, and the first oxide film 403a, the oxide semiconductor film 403b, the conductive film 405a, and the conductive film 405b are selectively etched, whereby the first oxide film 404, the oxide semiconductor film 404b, the source electrode 406a, and the drain electrode 406b are formed (see FIG. 15C). At this time, the resist, which is formed to be thin and minute, is gradually reduced in size as the etching progresses; as a result, the end portions of the source electrode 406a and the drain electrode 406b become round and curved in some cases. With this structure, the coverage with the second oxide film 404c, the gate insulating film 408, the gate electrode 410, and the oxide insulating film 412, which are to be formed over the source electrode 406a and the drain electrode 406b, can be improved; thus, occurrence of a shape defect such as disconnection can be inhibited.

Figure 16A:
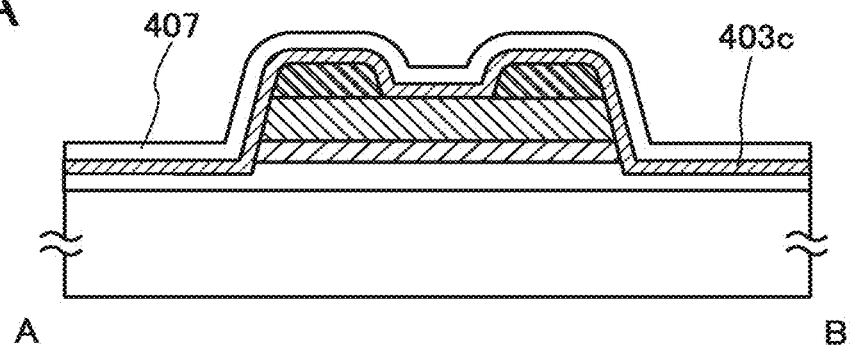
FIGS. 16A to 16C illustrate the method for fabricating a transistor.

Then, the second oxide film. 403c and the insulating film 407 are formed over the first oxide film 404a, the oxide semiconductor film 404b, the source electrode 406a, and the drain electrode 406b (see FIG. 16A). Embodiments 1 to 3 can be referred to for materials and formation methods of the second oxide film 403c and the insulating film 407.

Note that second heat treatment may be performed after the second oxide film 403c is formed. The second beat treatment can be performed under conditions similar to those of the first heat treatment. The second beat treatment can remove impurities such as hydrogen and water from the second oxide film 404c. In addition, impurities such as hydrogen and water can be further removed from the first oxide film 404a and the oxide semiconductor film 404b.

Figure 16B:
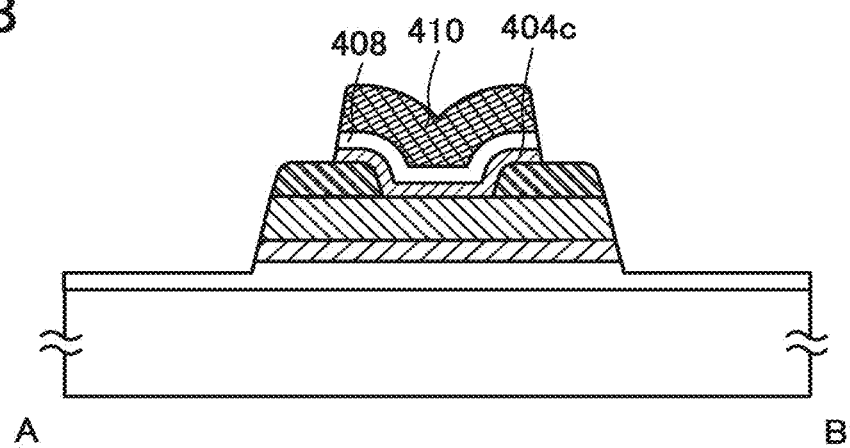

A second conductive film to be the gate electrode 410 is formed over the insulating film 407, and is selectively etched using a resist mask to form the gate electrode 410 (see FIG. 16B). Embodiments 1 to 3 can be referred to for a material and a method of forming the gate electrode 410.

Then, the insulating film 407 is selectively etched using the resist mask or the gate electrode 410 as a mask to form the gate insulating film 408.

Subsequently, the second oxide film 403c is etched using the resist mask or the gate electrode 410 as a mask to form the second oxide film 404c.

Figure 16C:
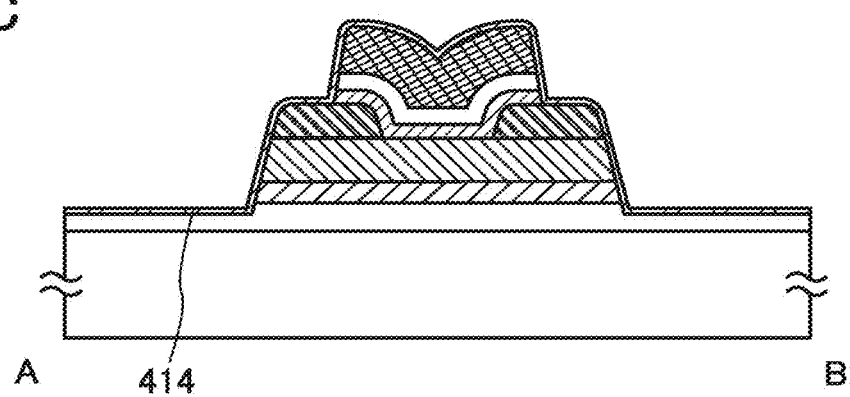

Next, the barrier film 414 is formed over the base insulating film 402, the source electrode 406a, the drain electrode 406b, and the gate electrode 410 (see FIG. 16C).

The barrier film 414 is an insulating film having a blocking effect against hydrogen, water, and oxygen, so that oxygen contained in the multilayer film 404, the base insulating film 402, and the gate insulating film 408 can be prevented from diffusing to the outside; thus, oxygen can be efficiently supplied to the oxide semiconductor film and oxygen vacancies can be reduced, resulting in excellent electric characteristics. Therefore, a highly reliable semiconductor device can be provided.

Figure 17A:
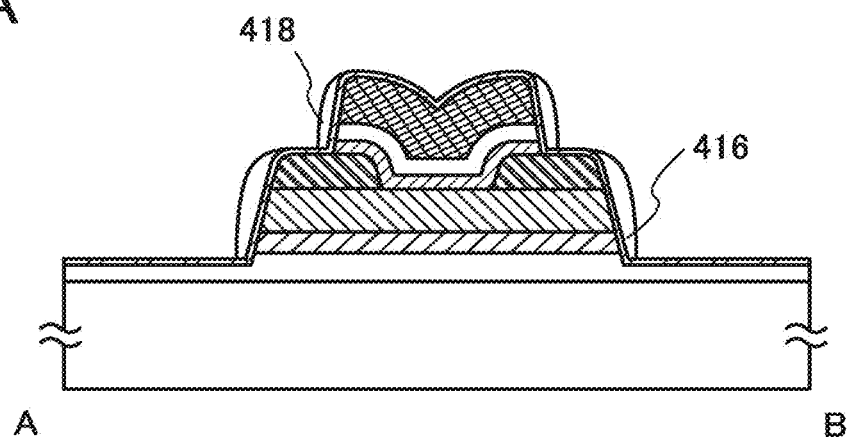
FIGS. 17A to 17C illustrate the method for fabricating a transistor.

Next, an insulating film to be the sidewall insulating film 416 and the sidewall insulating film 418 is provided and subjected to highly anisotropic etching treatment, whereby the sidewall insulating film 416 and the sidewall insulating film 418 can be formed on side surfaces of the multilayer film 404, the source electrode 406a, the drain electrode 406b, the gate insulating film 408, and the gate electrode 410 with the barrier film 414 positioned between the sidewall insulating film 416 or 418 and the side surfaces (see FIG. 17A).

Figure 17B:
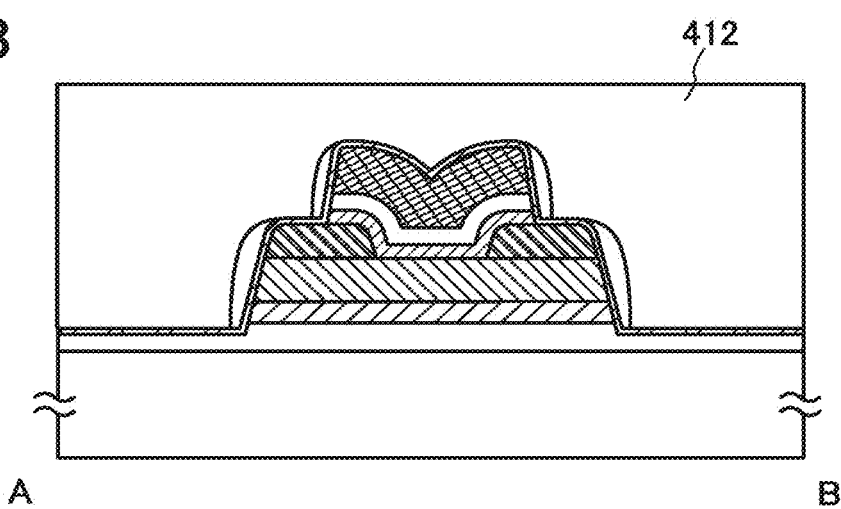

Next, the oxide insulating film 412 is formed over the barrier film 414 (see FIG. 17B). Embodiments 1 to 3 can be referred to for materials and formation methods of the oxide insulating film 412.

Next, third heat treatment may be performed. The third heat treatment can be performed under conditions similar to those of the first heat treatment. By the third heat treatment, excess oxygen is easily released from the base insulating film 402, the gate insulating film 408, and the oxide insulating film 412, so that oxygen vacancies in the multilayer film 404 can be reduced.

Next, openings are formed in the oxide insulating film 412 and the barrier film 414, and the electrode 419a and the electrode 419b electrically connected to the source electrode 406a and the drain electrode 406b, respectively, via the openings are formed over the oxide insulating film 412 and in the openings.

Figure 17C:
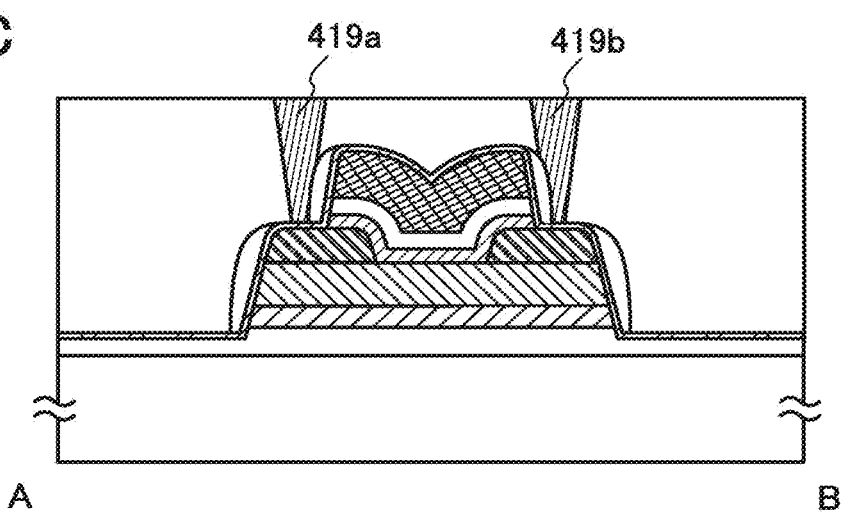

The electrode 419a and the electrode 419b are embedded in the openings in such a manner that a conductive film to be the electrode 419a and the electrode 419b is formed over the oxide insulating film 412 and in the openings, and removing (polishing) treatment is performed on the conductive film to remove part of the conductive film and expose the oxide insulating film 412 (see FIG. 17C).

For the removing treatment, chemical mechanical polishing (CMP) treatment is preferably used.

Note that in this embodiment, the CMP treatment is employed to remove part of the conductive film; however, another removing treatment may be employed. Alternatively, the polishing treatment such as the CMP treatment may be combined with etching (dry etching or wet etching) treatment or plasma treatment. For example, after the CMP treatment, dry etching treatment or plasma treatment (e.g., reverse sputtering) may be performed in order to improve the flatness of a surface to be processed. In the case where in the removing treatment, the etching treatment, the plasma treatment, or the like is combined with the CMP treatment, the order of steps is not particularly limited and may be set as appropriate depending on the materials, the film thicknesses, and the surface roughness of the conductive film. Alternatively, a large part of the conductive film may be removed by CMP treatment and the other part of the conductive film may be removed by dry etching treatment.

Note that the CMP treatment may be performed only once or plural times. In the case where the CMP treatment is performed plural times, first polishing is preferably performed with a high polishing rate followed by final polishing with a low polishing rate. By performing polishing steps with different polishing rates in combination, the surface of the conductive film (the electrode 419a and the electrode 419b) can be further improved.

Next, the wiring 420a and the wiring 420b electrically connected to the electrode 419a and the electrode 419b, respectively, are formed over the oxide insulating film 412, the electrode 419a, and the electrode 419b (see FIG. 14B).

Through the above process, the transistor 550 illustrated in FIGS. 14A to 14C can be fabricated.

This embodiment can be combined as appropriate with any of the other embodiments in this specification.

Embodiment 5

In this embodiment, an example of a circuit including the transistor of one embodiment of the present invention is described with reference to the drawings.

Figure 19A:
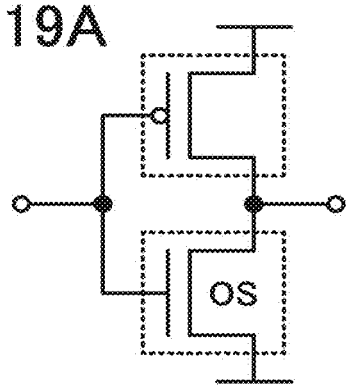
FIGS. 19A to 19D each illustrate an inverter including a semiconductor device of one embodiment of the present invention.
Figure 19B:
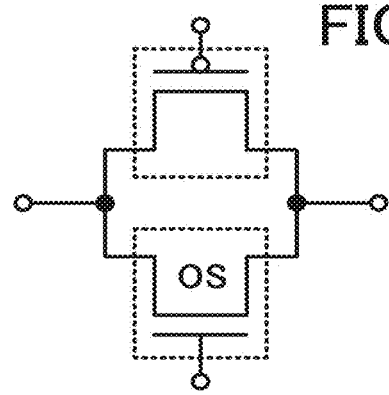
Figure 19C:
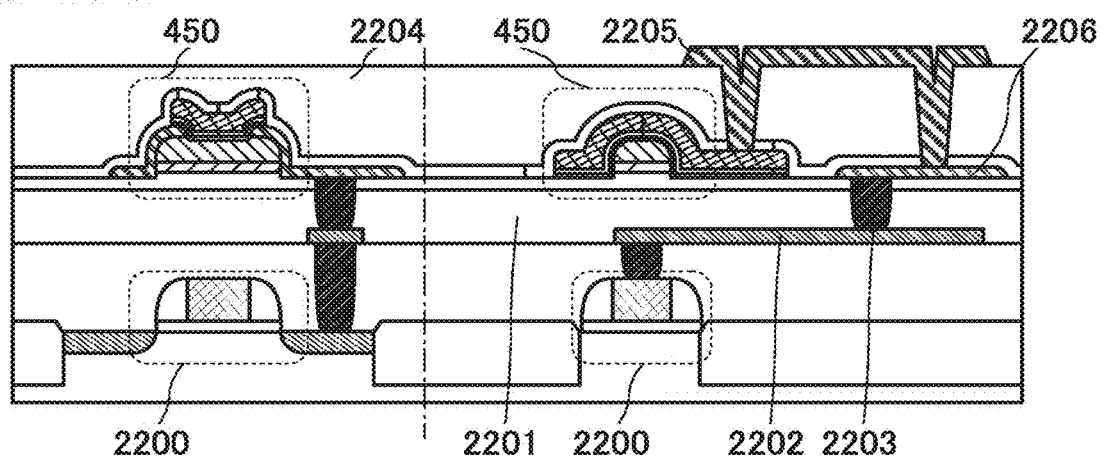
Figure 19D:
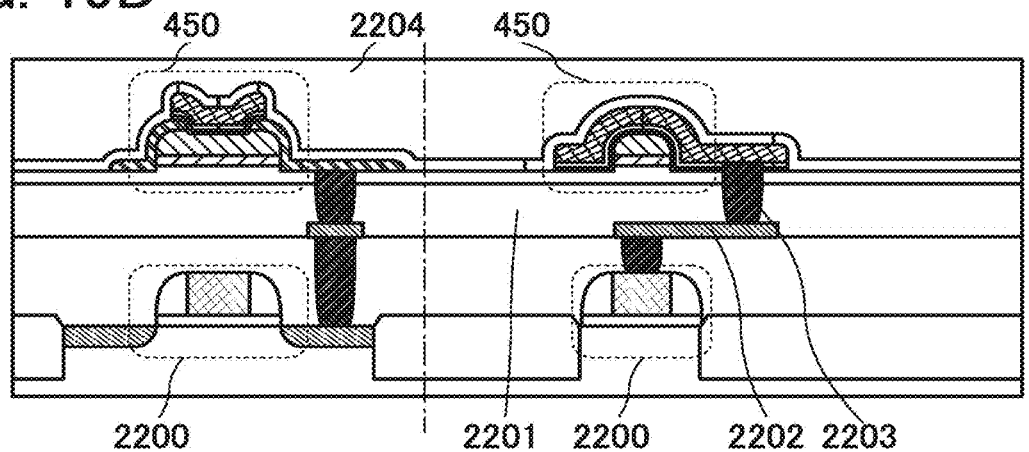

FIG. 19A is a circuit diagram of a semiconductor device and FIGS. 19C and 19D are each a cross-sectional view of a semiconductor device. FIGS. 19C and 19D each illustrate a cross-sectional view of the transistor 450 in a channel length direction on the left and a cross-sectional view of the transistor 450 in a channel width direction on the right. In the circuit diagram, "OS" is written beside a transistor in order to clearly demonstrate that the transistor includes an oxide semiconductor.

The semiconductor devices illustrated in FIGS. 19C and 19D each include a transistor 2200 containing a first semiconductor material in a lower portion and a transistor containing a second semiconductor material in an upper portion. Here, an example is described in which the transistor 450 described in Embodiment 1 as an example is used as the transistor containing the second semiconductor material.

Here, the first semiconductor material and the second semiconductor material preferably have different energy gaps. For example, the first semiconductor material may be a semiconductor material (e.g., silicon, germanium, silicon germanium, silicon carbide, or gallium arsenic) other than an oxide semiconductor, and the second semiconductor material may be the oxide semiconductor described in Embodiment 1. A transistor including single crystal silicon or the like as a material other than an oxide semiconductor can operate at high speed easily. In contrast, a transistor including an oxide semiconductor has the low off-state current.

Although the transistor 2200 is a p-channel transistor here, it is needless to say that an n-channel transistor can be used to form a circuit having a different configuration. The specific structure of the semiconductor device, such as a material used for the semiconductor device and the structure of the semiconductor device, does not need to be limited to that described here except for the use of the transistor described in Embodiment 1, which is formed using an oxide semiconductor.

FIGS. 19A, 19C, and 19D each illustrate a configuration example of what is called a CMOS circuit, in which a p-channel transistor and an n-channel transistor are connected in series and gates of the transistors are connected.

The transistor using an oxide semiconductor of one embodiment of the present invention has high on-state current, which can achieve high-speed operation of a circuit.

In the structure illustrated in FIG. 19C, the transistor 450 is provided over the transistor 2200 with an insulating film 2201 positioned therebetween. Wirings 2202 are provided between the transistor 2200 and the transistor 450. Wirings and electrodes over and under insulating films are electrically connected via plugs 2203 embedded in the insulating films. An insulating film 2204 covering the transistor 450, a wiring 2205 over the insulating film 2204, and a wiring 2206 formed by processing the same conductive film as the pair of electrodes of the transistor 450 are provided.

By stacking two transistors in the above manner, an area occupied by a circuit can be reduced; accordingly, a plurality of circuits can be arranged in high density.

In FIG. 19C, one of the source and the drain of the transistor 450 is electrically connected to one of a source and a drain of the transistor 2200 via the wiring 2202 and the plug 2203. The gate of the transistor 450 is electrically connected to a gate of the transistor 2200 via the wiring 2205, the wiring 2206, the plug 2203, the wiring 2202, and the like.

In the configuration illustrated in FIG. 19D, an opening portion in which the plug 2203 is embedded is provided in a gate insulating layer of the transistor 450, and the gate of the transistor 450 is in contact with the plug 2203. Such a configuration makes it possible to achieve the integration of the circuit easily and to make the lengths and the number of wirings and plugs to be smaller than those in the configuration illustrated in FIG. 19C; thus, the circuit can operate at higher speed.

Note that when a connection between the electrodes of the transistor 450 and the transistor 2200 is changed from that in the configuration illustrated in FIG. 19C or FIG. 19D, a variety of circuits can be formed. For example, a circuit having a configuration in which a source and a drain of a transistor are connected to those of another transistor as illustrated in FIG. 19B can operate as what is called an analog switch.

A semiconductor device having an image sensor function for reading data of an object can be fabricated with the use of the transistor described in any of the above embodiments.

Figure 24:
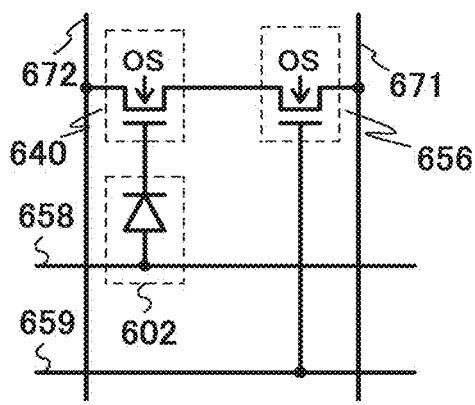
FIG. 24 is an equivalent circuit diagram illustrating an example of a semiconductor device.

FIG. 24 illustrates an example of an equivalent circuit of a semiconductor device having an image sensor function.

In a photodiode 602, one electrode is electrically connected to a photodiode reset signal line 658, and the other electrode is electrically connected to a gate of a transistor 640. One of a source and a drain of the transistor 640 is electrically connected to a photosensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photosensor output signal line 671.

As the photodiode 602, for example, a pin photodiode in which a semiconductor layer having p-type conductivity, a high-resistance semiconductor layer (semiconductor layer having i-type conductivity) and a semiconductor layer having n-type conductivity are stacked can be used.

With detection of light that enters the photodiode 602, data of an object can be read. Note that a light source such as a backlight can be used at the time of reading data of an object.

As each of the transistor 640 and the transistor 656, the transistor in which a channel is formed in an oxide semiconductor, which is described in any of the above embodiments, can be used. In FIG. 24, "OS" is written beside the transistor 640 and the transistor 656 so that the transistors 640 and 656 can be identified as transistors including an oxide semiconductor.

It is preferable that each of the transistor 640 and the transistor 656 be one of the transistors described in the above embodiments, in which the oxide semiconductor film is electrically covered with the gate electrode. Since the oxide semiconductor film has round top end portions and a curved surface, coverage with a film formed over the oxide semiconductor film can be improved. In addition, electric field concentration which might occur at end portions of the source electrode and the drain electrode can be reduced, which can suppress deterioration of the transistor. Therefore, variation in the electric characteristics of the transistor 640 and the transistor 656 is suppressed, and the transistor 640 and the transistor 656 are electrically stable. The semiconductor device having an image sensor function illustrated in FIG. 24 can have high reliability by including the transistor.

This embodiment can be combined as appropriate with any of the other embodiments in this specification.

Embodiment 6

In this embodiment, an example of a semiconductor device (storage device) which includes the transistor of one embodiment of the present invention, which can retain stored data even when not powered, and which has an unlimited number of write cycles is described with reference to drawings.

Figure 20:
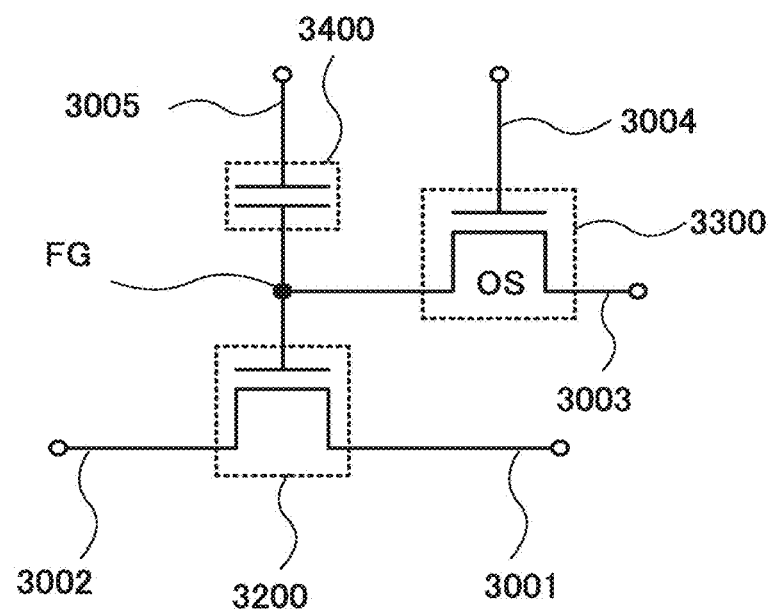
FIG. 20 is a circuit diagram of a semiconductor device of one embodiment of the present invention.

FIG. 20 is a circuit diagram of the semiconductor device.

The semiconductor device illustrated in FIG. 20 includes a transistor 3200 including a first semiconductor material, a transistor 3300 including a second semiconductor material, and a capacitor 3400. Note that the transistor described in Embodiment 1 can be used as the transistor 3300.

The transistor 3300 is a top-gate transistor in which a channel is formed in a semiconductor layer including an oxide semiconductor. Since the off-state current of the transistor 3300 is low, stored data can be retained for a long period owing to such a transistor. In other words, refresh operation becomes unnecessary or the frequency of the refresh operation in a semiconductor storage device can be extremely low, which leads to a sufficient reduction in power consumption.

In FIG. 20, a first wiring 3001 is electrically connected to a source electrode of the transistor 3200. A second wiring 3002 is electrically connected to a drain electrode of the transistor 3200. A third wiring 3003 is electrically connected to one of the source electrode and the drain electrode of the transistor 3300. A fourth wiring 3004 is electrically connected to the gate electrode of the transistor 3300. The gate electrode of the transistor 3200 and the other of the source electrode and the drain electrode of the transistor 3300 are electrically connected to the one electrode of the capacitor 3400. A fifth wiring 3005 is electrically connected to the other electrode of the capacitor 3400.

The semiconductor device in FIG. 20 utilizes a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off so that the transistor 3300 is turned off. Thus, the charge supplied to the gate electrode of the transistor 3200 is retained (retaining).

Since the off-state current of the transistor 3300 is extremely low, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in general, in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$ whereby charge supplied to the gate electrode of the transistor 3200 can be determined. For example, in the case where the high-level charge is supplied in writing and the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$), the transistor 3200 remains off. Thus, the data retained in the gate electrode can be read by determining the potential of the second wiring 3002.

Note that in the case where memory cells are arrayed, it is necessary that only data of a desired memory cell be able to be read. The fifth wiring 3005 in the case where data is not read may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode, that is, a potential higher than $V_{th\_L}$.

When including a transistor having a channel formation region formed using an oxide semiconductor and having an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating layer does not occur. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

As described above, a miniaturized and highly integrated semiconductor device having high electrical characteristics can be provided.

Embodiment 7

In this embodiment, a CPU in which the transistor described in any of the above embodiments can be used and the storage device described in the above embodiment is included is described.

Figure 21:
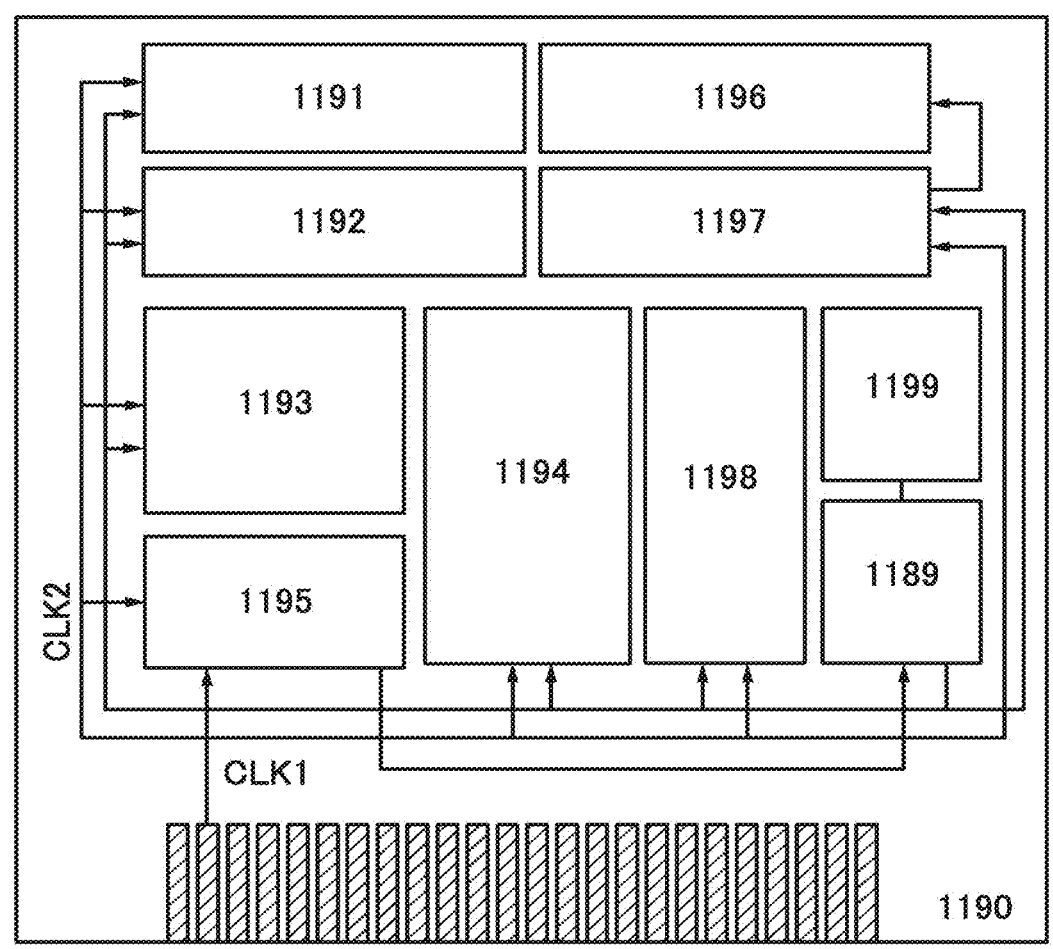
FIG. 21 is a block diagram of a semiconductor device of one embodiment of the present invention.

FIG. 21 is a block diagram illustrating a configuration example of a CPU at least partly including the transistor described in Embodiment 1.

The CPU illustrated in FIG. 21 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189. A semiconductor substrate, an SOI substrate, a glass substrate, or the like is used as the substrate 1190. The rewritable ROM 1199 and the ROM interface 1189 may be provided over a separate chip. Needless to say, the CPU in FIG. 21 is just an example in which the configuration has been simplified, and an actual CPU may have various configurations depending on the application. For example, the CPU may have the following configuration: a structure including the CPU illustrated in FIG. 21 or an arithmetic circuit is considered as one core; a plurality of the cores is included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/o the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 21, a memory cell is provided in the register 1196. As the memory cell of the register 1196, the transistor described in the above embodiment can be used.

In the CPU illustrated in FIG. 21, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 22:
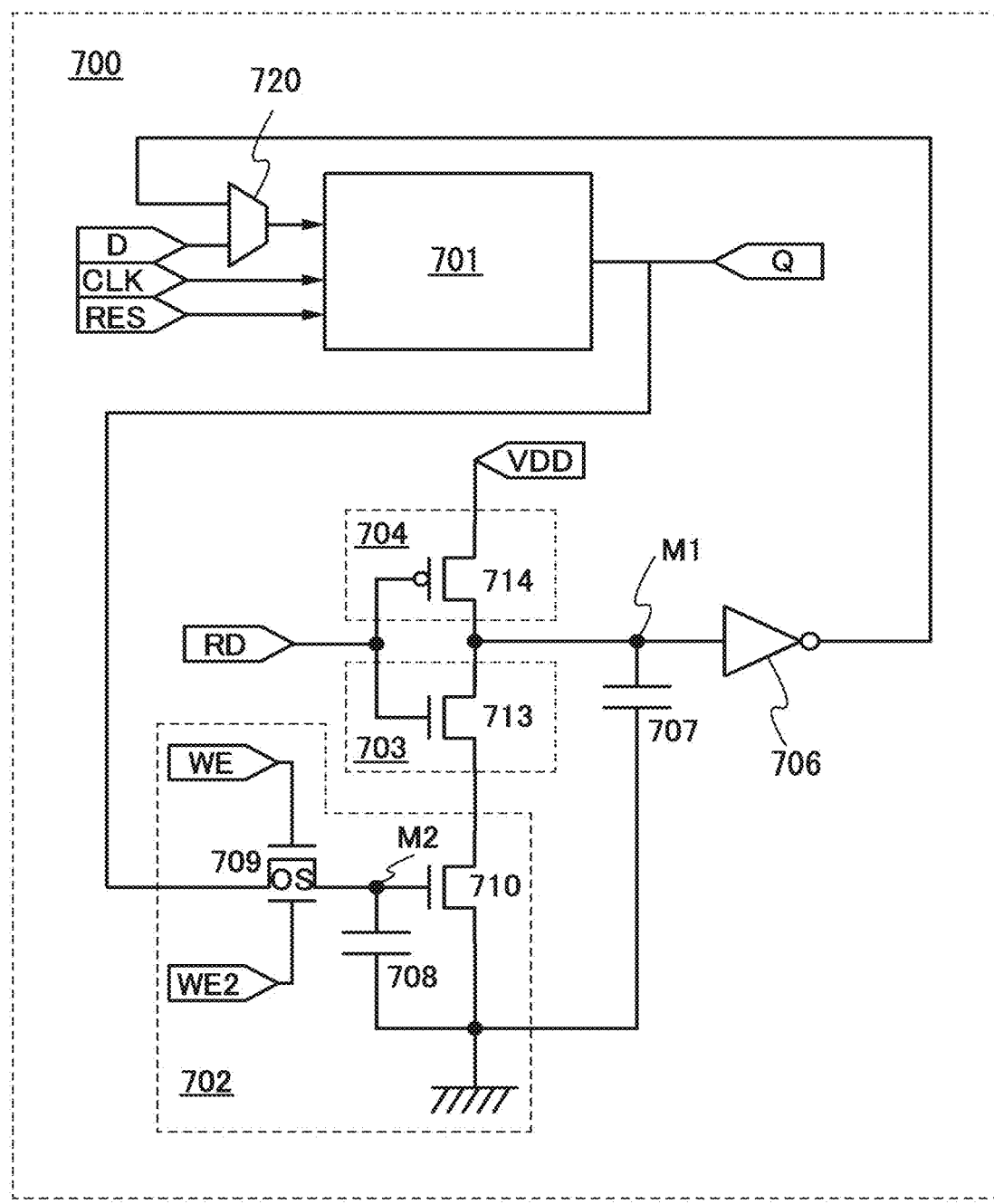
FIG. 22 is a circuit diagram illustrating a memory device of one embodiment of the present invention.

FIG. 22 is an example of a circuit diagram of a storage element that can be used as the register 1196. A memory element 700 includes a circuit 701 in which stored data is volatile when power supply is stopped, a circuit 702 in which stored data is nonvolatile when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 700 may further include another element such as a diode, a resistor, or an inductor, as needed.

Here, the storage device described in the above embodiment can be used as the circuit 702. When supply of the power supply voltage to the memory element 700 is stopped, a ground potential (0 V) or a potential at which the transistor 709 in the circuit 702 is turned off continues to be input to a first gate of the transistor 709. For example, the first gate of the transistor 709 is grounded through a load such as a resistor.

An example in which the switch 703 is a transistor 713 having one conductivity type (e.g., an n-channel transistor) and the switch 704 is a transistor 714 having a conductivity type opposite to the one conductivity type (e.g., a p-channel transistor) is described. Here, a first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a line which can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a line which can supply a power supply potential VDD. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the line which can supply a low power supply potential (e.g., a GND line). The other of the pair of electrodes of the capacitor 708 can be supplied with a constant potential. For example, the other of the pair of electrodes of the capacitor 708 can be supplied with the low power supply potential (e.g., GND) or the high power supply potential (e.g., VDD). The other of the pair of electrodes of the capacitor 708 is electrically connected to the line which can supply a low power supply potential (e.g., a GND line).

The capacitor 707 and the capacitor 708 are not necessarily provided as long as the parasitic capacitance of the transistor, the wiring, or the like is actively utilized.

A control signal WE is input to the first gate (first gate electrode) of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 701 is input to the other of the source and the drain of the transistor 709. FIG. 22 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 22, a signal output from the second terminal of the switch 703 (the other of the source and the drain of the transistor 713) is input to the circuit 701 through the logic element 706 and the circuit 720; however, this embodiment is not limited thereto. The signal output from the second terminal of the switch 703 (the other of the source and the drain of the transistor 713) may be input to the circuit 701 without its logic value being inverted. For example, in the case where a node in which a signal obtained by inversion of the logic value of a signal input from the input terminal is retained is provided in the circuit 701, the signal output from the second terminal of the switch 703 (the other of the source and the drain of the transistor 713) can be input to the node.

As the transistor 709 in FIG. 22, the transistor described in Embodiment 1 can be used. As described in Embodiment 3, the transistor 709 preferably includes a second gate (second gate electrode). The control signal WE can be input to the first gate and the control signal WE2 can be input to the second gate. The control signal WE2 is a signal having a constant potential. As the constant potential, for example, a ground potential GND or a potential lower than a source potential of the transistor 709 is selected. The control signal WE2 is a potential signal for controlling the threshold voltage of the transistor 709, and Icut of the transistor 709 can be further reduced. Note that as the transistor 709, the transistor without the second gate can be used.

Further, in FIG. 22, the transistors included in the memory element 700 except for the transistor 709 can each be a transistor in which a channel is formed in a layer formed using a semiconductor other than an oxide semiconductor or in the substrate 1190. For example, a transistor in which a channel is formed in a silicon layer or a silicon substrate can be used. Alternatively, a transistor in which a channel is formed in an oxide semiconductor film can be used for all the transistors used for the memory element 700. Further alternatively, in the memory element 700, a transistor in which a channel is formed in an oxide semiconductor film can be included besides the transistor 709, and a transistor in which a channel is formed in a layer or the substrate 1190 including a semiconductor other than an oxide semiconductor can be used for the rest of the transistors.

As the circuit 701 in FIG. 22, for example, a flip-flop circuit can be used. As the logic element 706, for example, an inverter, a clocked inverter, or the like can be used.

The semiconductor device of one embodiment of the present invention can, in a period during which the memory element 700 is not supplied with the power supply voltage, retain data stored in the circuit 701 by the capacitor 708 which is provided in the circuit 702.

The off-state current of a transistor in which a channel is formed in an oxide semiconductor film is extremely low. For example, the off-state current of a transistor in which a channel is formed in an oxide semiconductor film is significantly lower than that of a transistor in which a channel is formed in silicon having crystallinity. Thus, when such a transistor including an oxide semiconductor is used for the transistor 709, a signal held in the capacitor 708 is retained for a long time also in a period during which the power supply voltage is not supplied to the memory element 700. The memory element 700 can accordingly retain the stored content (data) also in a period during which the supply of the power supply voltage is stopped.

Since the switch 703 and the switch 704 are provided, the memory element performs pre-charge operation; thus, the time required for the circuit 701 to retain original data again after the supply of the power supply voltage is restarted can be shortened.

In the circuit 702, a signal retained by the capacitor 708 is input to the gate of the transistor 710. Therefore, after supply of the power supply voltage to the memory element 700 is restarted, the signal retained by the capacitor 708 can be converted into the one corresponding to the state (the on state or the off state) of the transistor 710 to be read from the circuit 702. Consequently, an original signal can be accurately read even when a potential corresponding to the signal retained by the capacitor 708 fluctuates to some degree.

By applying the above-described memory element 700 to a storage device such as a register or a cache memory included in a processor, data in the storage device can be prevented from being lost owing to the stop of the supply of the power supply voltage. Further, shortly after the supply of the power supply voltage is restarted, the storage device can be returned to the same state as that before the power supply is stopped. Thus, the power supply can be stopped even for a short time in the processor or one or a plurality of logic circuits included in the processor. Accordingly, power consumption can be suppressed.

Although an example in which the storage element 700 is used in a CPU is described in this embodiment, the storage element 700 can also be used in a digital signal processor (DSP), a custom LSI, an LSI such as a programmable logic device (PLD), and a radio frequency identification (RF-ID).

This embodiment can be combined as appropriate with any of the other embodiments in this specification.

Embodiment 8

In this embodiment, examples of an electronic device which can include the transistor described in Embodiment 1, the storage device described in Embodiment 5 or 6, or the CPU and the like (including a DSP, a custom LSI, a PLD, and an RF-ID) described in Embodiment 7 is described.

The transistor described in Embodiment 1, the storage device described in Embodiment 5 or 6, and the CPU and the like described in Embodiment 7 can be applied to a variety of electronic devices (including game machines). Examples of the electronic devices include display devices of televisions, monitors, and the like, lighting devices, personal computers, word processors, image reproduction devices, portable audio players, radios, tape recorders, stereos, phones, cordless phones, mobile phones, car phones, transceivers, wireless devices, game machines, calculators, portable information terminals, electronic notebooks, e-book readers, electronic translators, audio input devices, video cameras, digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers and X-ray diagnostic equipment. In addition, the examples of the electronic devices include alarm devices such as smoke detectors, heat detectors, gas alarm devices, and security alarm devices. Further, the examples of the electronic devices also include industrial equipment such as guide lights, traffic lights, belt conveyors, elevators, escalators, industrial robots, and power storage systems. In addition, moving objects and the like driven by fuel engines and electric motors using power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircraft, rockets, artificial satellites, space probes, planetary probes, and spacecraft. Some specific examples of these electronic devices are illustrated in FIGS. 23A to 23C.

Figure 23A:
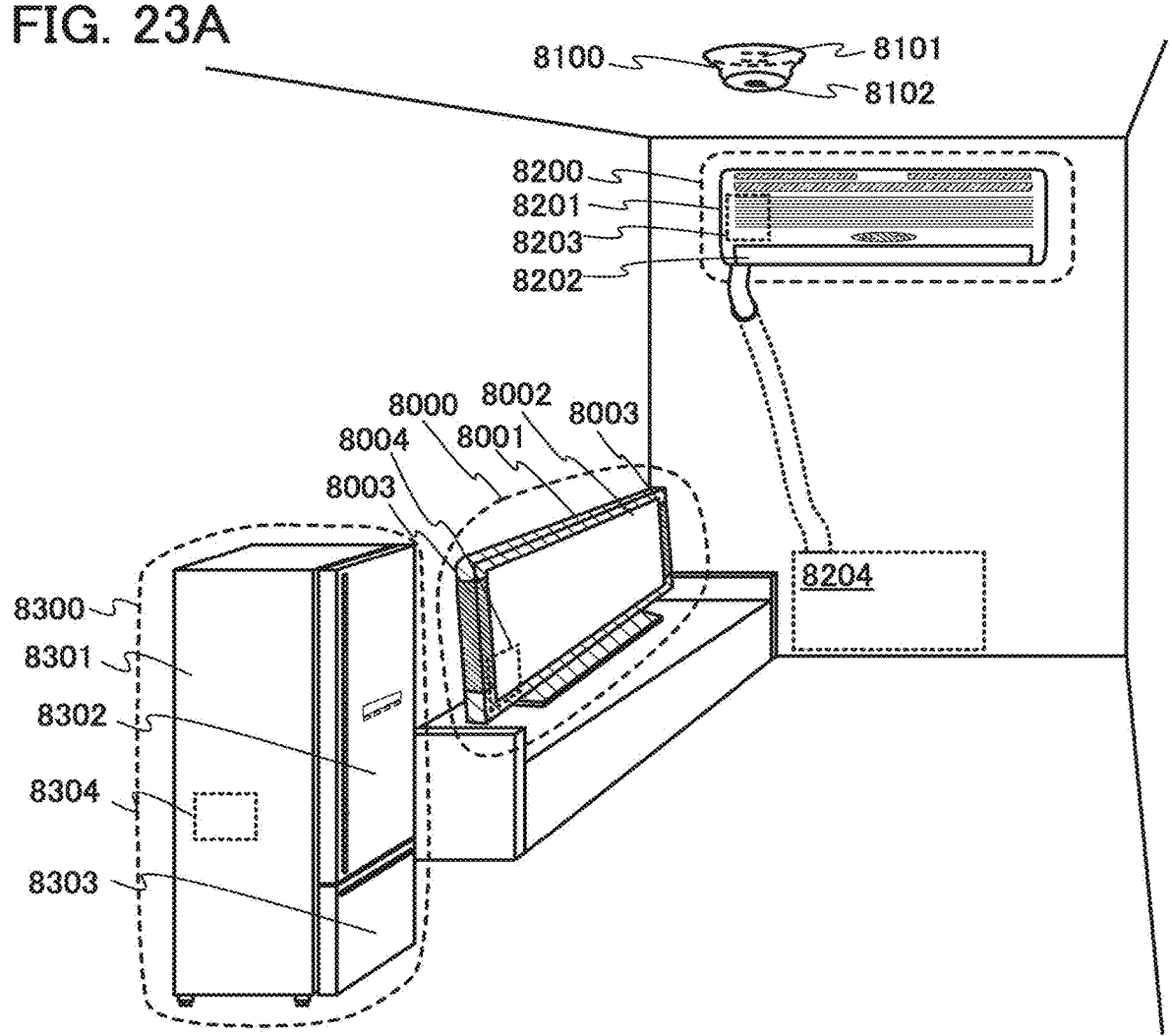
FIGS. 23A to 23C each illustrate an electronic appliance of one embodiment of the present invention.
Figure 23B:
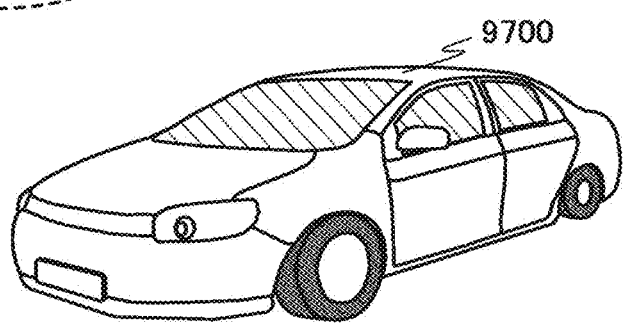
Figure 23C:
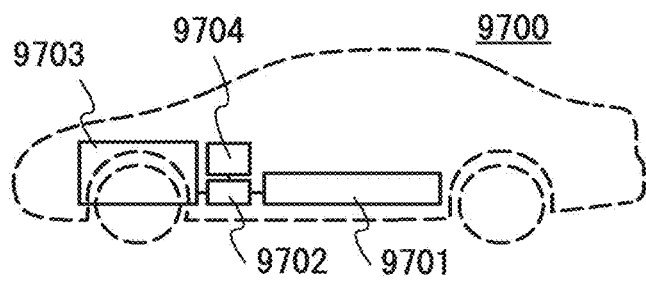

In a television set 8000 illustrated in FIG. 23A, a display portion 8002 is incorporated in a housing 8001. The display portion 8002 can display an image and a speaker portion 8003 can output sound. Any of the transistors described in the above embodiments can be used in a pixel or a driver circuit for operating the display portion 8002 incorporated in the housing 8001.

A semiconductor display device such as a liquid crystal display device, a light-emitting device in which a light-emitting element such as an organic EL element is provided in each pixel, an electrophoretic display device, a digital micromirror device (DMD), or a plasma display panel (PDP) can be used for the display portion 8002.

The television set 8000 may be provided with a receiver, a modem, and the like. With the receiver, a general television broadcast can be received. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU 8004 for performing information communication or a memory. Any of the transistors, the memory device, and the CPU described in the above embodiments is used for the CPU 8004 or the memory, whereby power consumption can be reduced.

An alarm device 8100 illustrated in FIG. 23A is a residential fire alarm, which is an example of an electronic device including a sensor portion 8102 for smoke or beat and a microcomputer 8101. Note that the microcomputer 8101 includes the transistor, the storage device, or the CPU described in any of the above embodiments.

An air conditioner which includes an indoor unit 8200 and an outdoor unit 8204 illustrated in FIG. 23A is an example of an electronic device including the transistor, the storage device, the CPU, or the like described in any of the above embodiments. Specifically, the indoor unit 8200 includes a housing 8201, an air outlet 8202, a CPU 8203, and the like. Although the CPU 8203 is provided in the indoor unit 8200 in FIG. 23A, the CPU 8203 may be provided in the outdoor unit 8204. Alternatively, the CPU 8203 may be provided in both the indoor unit 8200 and the outdoor unit 8204. By using any of the transistors described in the above embodiments for the CPU in the air conditioner, a reduction in power consumption of the air conditioner can be achieved.

An electronic refrigerator-freezer 8300 illustrated in FIG. 23A is an example of an electronic device including the transistor, the storage device, the CPU, or the like described in any of the above embodiments. Specifically, the electric refrigerator-freezer 8300 includes a housing 8301, a door for a refrigerator 8302, a door for a freezer 8303, a CPU 8304, and the like. In FIG. 23A, the CPU 8304 is provided in the housing 8301. When any of the transistors described in the above embodiments is used as the CPU 8304 of the electric refrigerator-freezer 8300, a reduction in power consumption of the electric refrigerator-freezer 8300 can be achieved.

FIGS. 23B and 23C illustrate an example of an electronic vehicle which is an example of an electronic device. An electric vehicle 9700 is equipped with a secondary battery 9701. The output of the electric power of the secondary battery 9701 is adjusted by a circuit 9702 and the electric power is supplied to a driving device 9703. The circuit 9702 is controlled by a processing unit 9704 including a ROM, a RAM, a CPU, or the like which is not illustrated. When any of the transistors described in the above embodiments is used as the CPU in the electric vehicle 9700, a reduction in power consumption of the electric vehicle 9700 can be achieved.

The driving device 9703 includes a DC motor or an AC motor either alone or in combination with an internal-combustion engine. The processing unit 9704 outputs a control signal to the circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts a direct current into an alternate current is also incorporated.

This embodiment can be combined as appropriate with any of the other embodiments in this specification.

Example 1

In this example, a transistor which has the same structure as the transistor 460 illustrated in FIG. 6A was fabricated as an example sample and the cross section of the transistor was examined. The electric characteristics of the fabricated transistor was evaluated.

First, a method for fabricating the example sample is described.

First, a silicon oxynitride (SiON) film to be a base insulating film was formed to a thickness of 300 nm over a silicon substrate. The silicon oxynitride film was formed by sputtering under the following conditions: a mixed atmosphere of argon and oxygen (argon:oxygen=25 sccm 25 sccm); a pressure of 0.4 Pa; a power supply (power supply output) of 5.0 kW; a distance between the silicon substrate and a target of 60 mm; and a substrate temperature of 100° C.

A surface of the silicon oxide film was subjected to polishing treatment, and a 10-nm-thick first oxide film and a 40-nm-thick oxide semiconductor film were stacked. The first oxide film was formed by sputtering using an oxide target of In:Ga:Zn=1:3:2 (atomic ratio) (IGZO(132)) under the following conditions: a mixed atmosphere of argon and oxygen (argon:oxygen=30 sccm: 15 sccm); a pressure of 0.4 Pa; a power supply of 0.5 kW; a distance between the substrate and the target of 60 mm; and a substrate temperature of 200° C. The oxide semiconductor film was formed by sputtering using an oxide target of In:Ga:Zn=1:1:1 (atomic ratio) (IGZO(111)) under the following conditions: a mixed atmosphere of argon and oxygen (argon:oxygen=30 sccm: 15 sccm); a pressure of 0.4 Pa; a power supply of 0.5 kW; a distance between the substrate and the target of 60 mm; and a substrate temperature of 300° C. Note that the first oxide film and the oxide semiconductor film were continuously formed without exposure to the air.

Next, heat treatment was performed. The beat treatment was performed under a nitrogen atmosphere at 450° C. for one hour, and then performed under an oxygen atmosphere at 450° C. for one hour.

A 5-nm-thick tungsten film was formed over the oxide semiconductor film and etched to form a hard mask. An inductively coupled plasma (ICP) etching method was employed for the etching. The etching conditions were as follows: a carbon tetrafluoride ($CF_4$=100 sccm) atmosphere; a power supply of 2000 W; a bias power of 50 W; and a pressure of 0.67 Pa. Then, the etching conditions were changed as follows: a carbon tetrafluoride and oxygen ($CF_4$:$O_2$=60 sccm: 40 sccm) mixed atmosphere; a power supply of 1000 W; a bias power of 25 W; and a pressure of 2.0 Pa.

The first oxide film and the oxide semiconductor film were processed into an island shape by ICP etching under the following conditions: a mixed atmosphere of methane and argon ($CH_4$:Ar=16 sccm: 32 sccm); a power supply of 600 W; a bias power of 100 W; a pressure of 1.0 Pa; and a substrate temperature of 70° C.

Next, a tungsten (W) film to be a source electrode and a drain electrode was formed to a thickness of 10 nm over the first oxide film and the oxide semiconductor film. The film was formed by sputtering using a tungsten target under the following conditions: an argon (80 sccm) atmosphere; a pressure of 0.8 Pa; a power supply (power supply output) of 1.0 kW; a distance between the silicon substrate and the target of 60 mm; and a substrate temperature of 230° C.

Then, a resist mask was formed over the tungsten film and etching was performed using an ICP etching method. As the etching, first etching and second etching were performed. The first etching conditions were as follows: a carbon tetrafluoride ($CF_4$=100 sccm) atmosphere; a power supply of 2000 W; a bias power of 50 W; and a pressure of 0.67 Pa. Then, the second etching conditions were changed as follows: a carbon tetrafluoride and oxygen ($CF_4$:$O_2$=60 sccm: 40 sccm) atmosphere; a power supply of 1000 W; a bias power of 25 W; and a pressure of 2.0 Pa. Thus, the source electrode and the drain electrode were formed.

Next, a second oxide film was formed to a thickness of 5 nm over the oxide semiconductor film, the source electrode, and the drain electrode. The film was formed by sputtering using an oxide target (IGZO (132)) of In:Ga:Zn=1:3:2 (atomic ratio) under the following conditions: a mixed atmosphere of argon and oxygen (argon:oxygen=30 sccm: 15 sccm); a pressure of 0.4 Pa; a power supply of 0.5 kW; a distance between the substrate and the target of 60 mm; and a substrate temperature of 200° C.

Next, a silicon oxynitride film to be a gate insulating film was formed to a thickness of 10 am by a CVD method.

A titanium nitride film was formed to a thickness of 10 nm over the silicon oxynitride film by sputtering under the following conditions: a nitrogen ($N_2$=50 sccm) atmosphere; a pressure of 0.2 Pa; a power supply of 12 kW; and a distance between the substrate and the target of 400 mm. The substrate temperature was set to room temperature. A tungsten film was formed to a thickness of 10 nm over the titanium nitride film under the following conditions: an argon (Ar=100 sccm) atmosphere; a pressure of 2.0 Pa; a power supply of 4 kW; a distance between the substrate and the target of 60 mm; and a substrate temperature of 230° C.

The stack of the 10-nm-thick titanium nitride film and the 10-nm-thick tungsten film was etched by ICP etching. As the etching, first etching and second etching were performed. The first etching conditions were as follows: a mixed atmosphere of chlorine, carbon tetrafluoride, and oxygen ($Cl_2$:$CF_4$:$O_2$=45 sccm: 55 sccm: 55 sccm); a power supply of 3000 W; a bias power of 110 W; and a pressure of 0.67 Pa. The second etching was performed after the first etching under the following conditions: a mixed atmosphere of boron trichloride and chlorine ($BCl_3$:$Cl_2$=150 sccm: 50 sccm); a power supply of 1000 W; a bias power of 50 W; and a pressure of 0.67 Pa. Thus, a gate electrode was formed.

A stack including the gate insulating film and the second oxide film was etched by ICP etching method using the gate electrode as a mask. The etching conditions were as follows: a mixed atmosphere of methane and argon ($CH_4$:Ar=16 scorn: 32 sccm); a power supply of 600 W; a bias power of 100 W; a pressure of 1.0 Pa; and a substrate temperature of 70° C.

Next, a 20-nm-thick aluminum oxide film was formed over the gate electrode by a sputtering method, and a 150-nm-thick silicon oxynitride film was formed thereover by a CVD method.

Figure 10A:
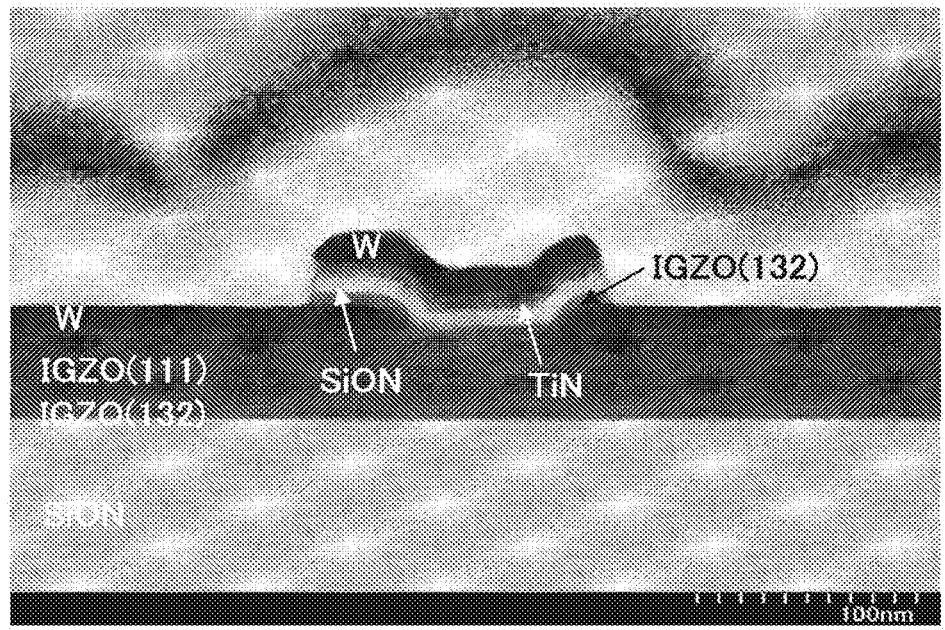
FIGS. 10A and 10B are cross sectional STEM images of a transistor fabricated in Example.
Figure 10B:
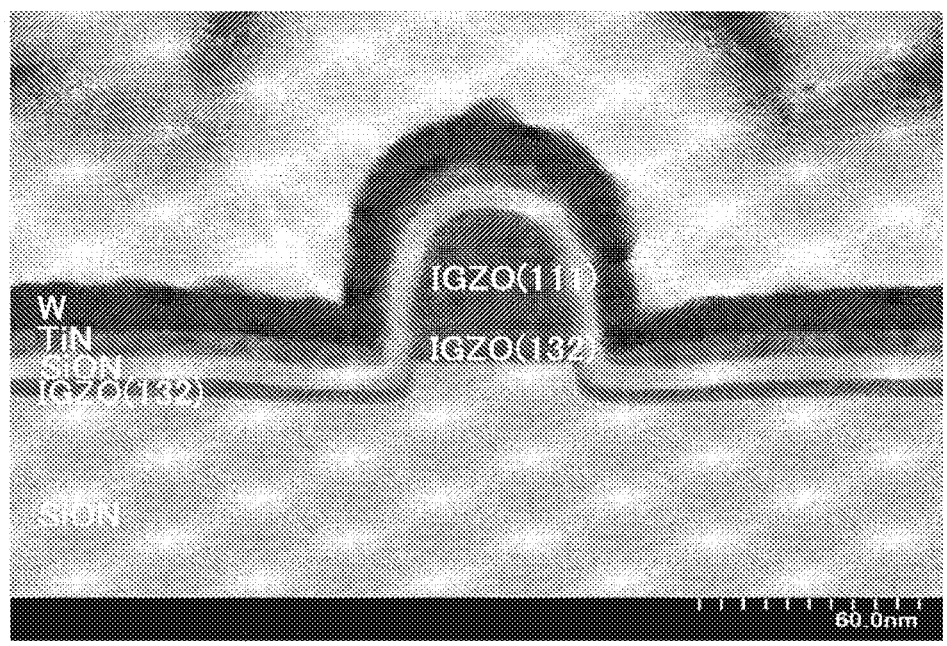

FIGS. 10A and 10B are cross-sectional STEM images of an example sample made by the above-mentioned method. FIG. 10A is a cross-sectional view in the channel length direction. FIG. 10B is a cross-sectional view in the channel width direction.

As shown in FIG. 10B, IGZO(111), which is an oxide semiconductor film, has round end portions and a semicircle shape when seen in the cross section in the channel width direction. It was found that this structure improves the coverage with the second oxide film, the gate insulating film, and the gate electrode, which were formed over the oxide semiconductor film, and prevents occurrence of a shape defect such as disconnection.

The channel length of the fabricated transistor was 68 nm and the channel width was 34 nm.

Figure 29:
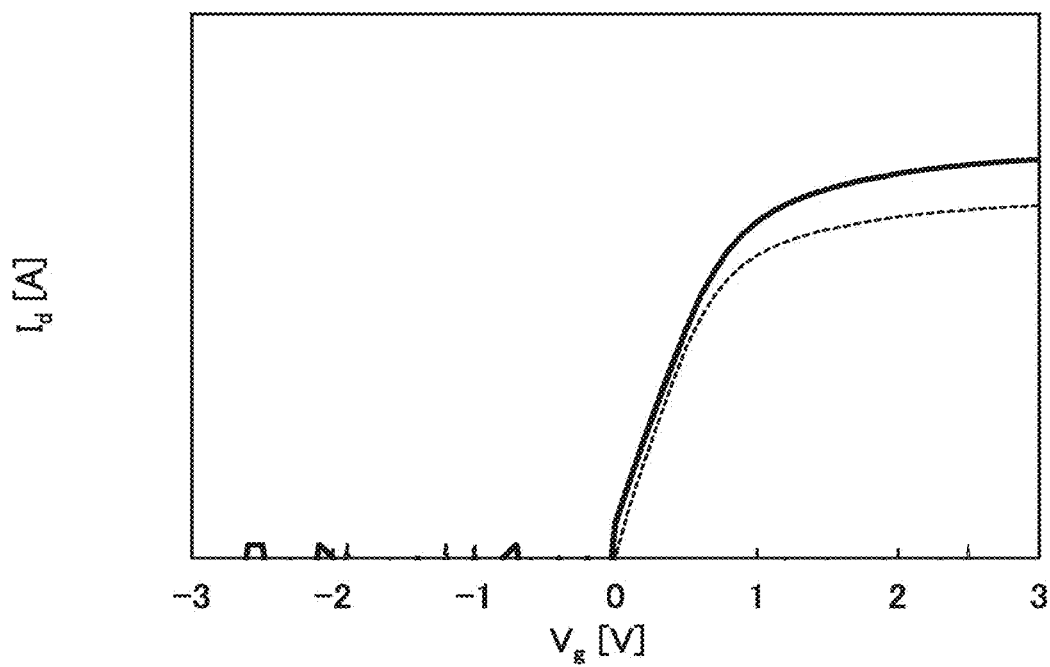
FIG. 29 shows $I_d$-$V_g$ characteristics of a transistor.

Next, the drain current ($I_d$: [A]) of the fabricated transistor was measured. The drain voltage ($V_d$: [V]) was set to 0.1 V or 1 V and the gate voltage ($V_g$: [V]) was swept from −3 V to 3 V. FIG. 29 shows the measurement results of the transistor. In 30 FIG. 29, the solid line represents the measurement results at a drain voltage ($V_d$: [V]) of 1 V, the dotted line represents the measurement results at a drain voltage ($V_d$: [V]) of 0.1 V, the horizontal axis represents the gate voltage ($V_g$: [V]), and the vertical axis represents the drain current ($I_d$: [A]). Note that "drain voltage ($V_d$: [V])"

refers to a potential difference between a drain and a source when the potential of the source is used as a reference potential, and "gate voltage ($V_g$: [V])" refers to a potential difference between a gate and a source when the potential of the source is used as a reference potential.

FIG. 29 shows that when the drain voltage ($V_d$: [V]) of the transistor fabricated in this example is 1 V, the on-state current is 5.31 µA; a shift value is 0.13 A; the threshold voltage is 0.65 V; and the off-state current is lower than or equal to the lower measurement limit. Note that the shift value is a value of the gate voltage at the time when the drain current is $1 \times 10^{-12}$ A. When the drain voltage is 0.1 V, the field-effect mobility is 20.0 cm$^2$/Vs; and the S value is 113.1 mV/dec.

The above results indicate that the transistor of this example has excellent electric characteristics.

Example 2

In this example, the temperature dependence of the transistor fabricated in Example 1 was examined.

Figure 30:
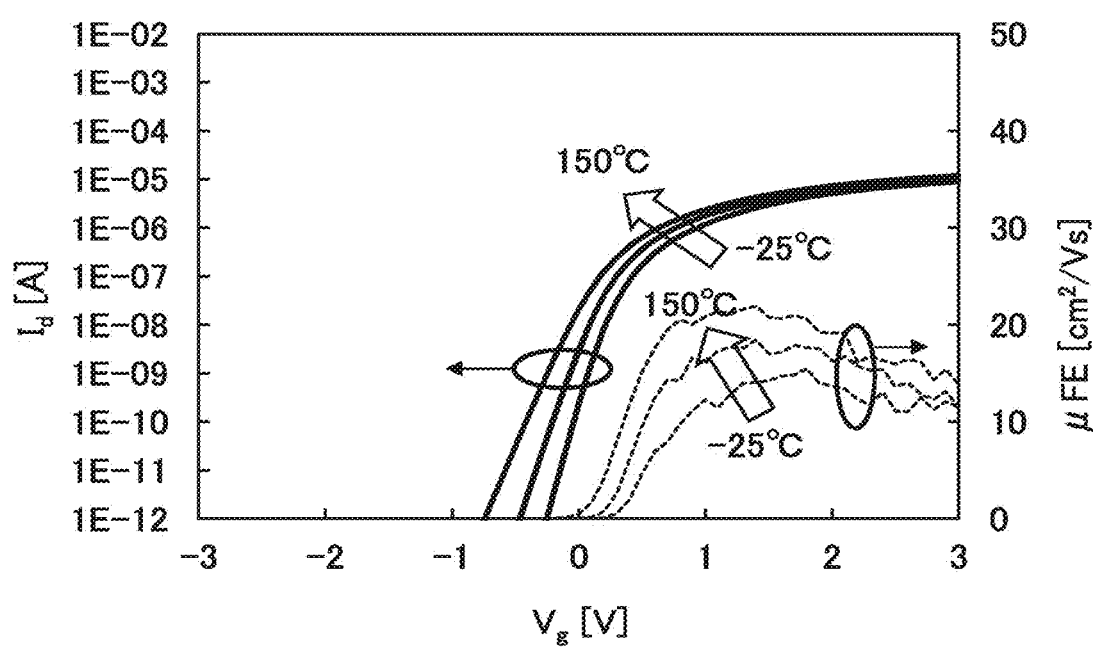
FIG. 30 shows temperature dependence of a transistor.

For the evaluation, the drain current ($I_d$: [A]) and the field-effect mobility (µFE) were measured at −25° C., 50° C., and 150° C. The drain voltage ($V_d$: [V]) was set to 1 V and the gate voltage ($V_g$: [V]) was swept from −3 V to 3 V. FIG. 30 shows the measurement results of the transistor. In FIG. 30, the horizontal axis represents gate voltage ($V_g$: [V]), the vertical axis on the left side represents drain current ($I_d$: [A]), and the vertical axis on the right side represents field-effect mobility (µFE: cm$^2$/Vs).

As shown in FIG. 30, in the transistor fabricated in Example 1, the on-state current and field-effect mobility are hardly changed by temperature change.

Figure 31:
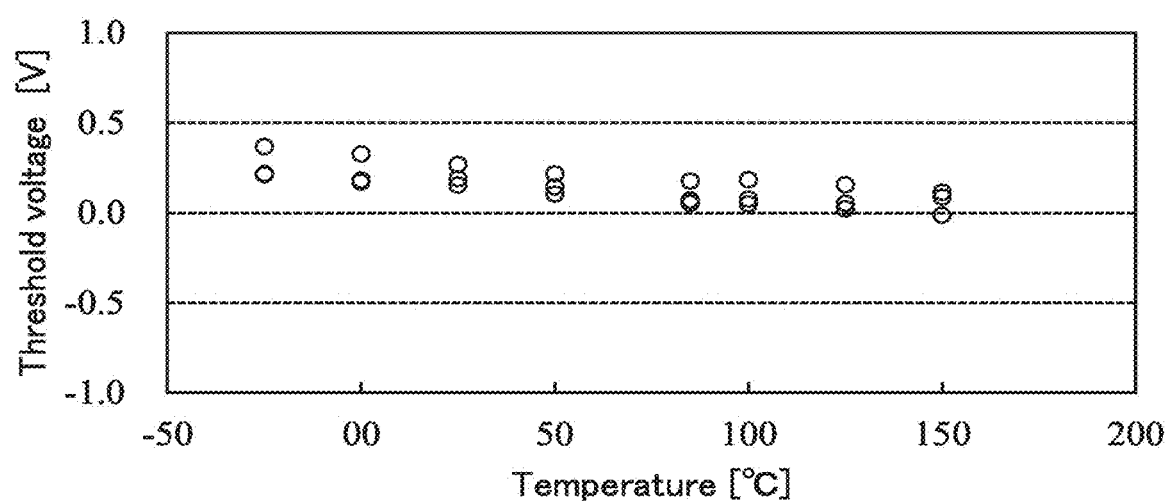
FIG. 31 shows temperature dependence of a transistor.

FIG. 31 shows the temperature dependence of the threshold voltage.

It was found that the threshold voltage is hardly changed by temperature change.

The above results indicate that the transistor of this example has temperature resistance.

Example 3

In this example, the reliability of the transistor fabricated in Example 1 was evaluated.

Figure 32A:
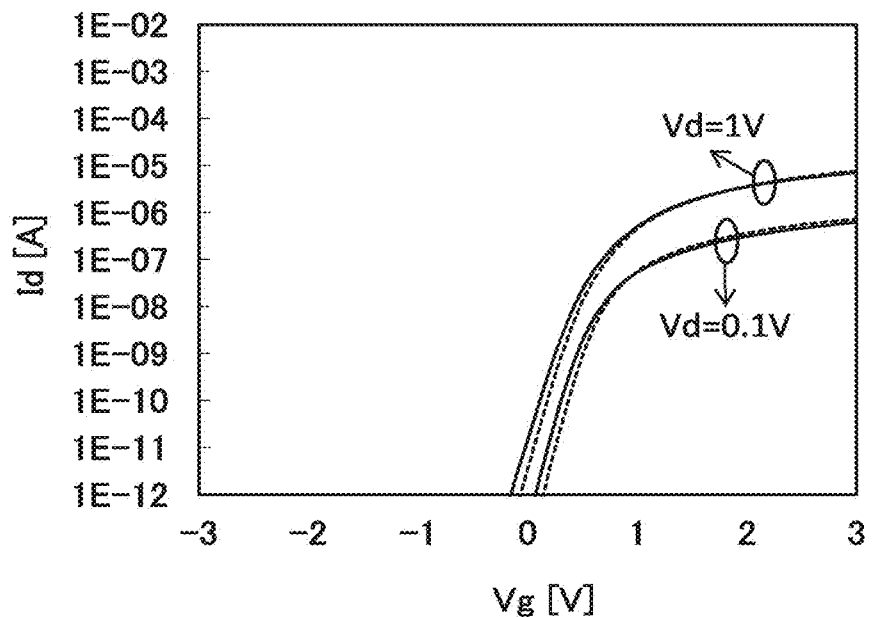
FIGS. 32A and 32B each show the reliability of a transistor.

For the evaluation, the drain current ($I_d$ [A]) was measured under the stress test conditions that the source voltage (Vs: [V]) and the drain voltage ($V_d$: [V]) were set to 0V and a gate voltage of −1.8 V was applied at 150° C. for one hour. FIG. 32A shows the measurement results of the transistor. In FIG. 32A, the solid line represents the result at a drain voltage ($V_d$: [V]) of 1 V and the dotted line represents the result at a drain voltage of 0.1 V, the horizontal axis represents gate voltage ($V_g$: [V]) and the vertical axis represents drain current ($I_d$: [A]).

Figure 32B:
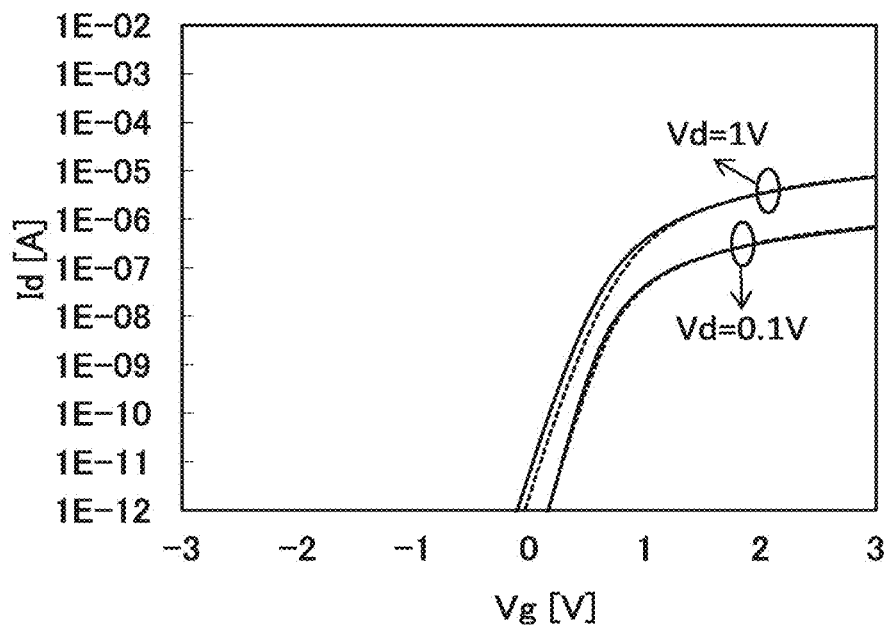

Furthermore, the drain current ($I_d$ [A]) was measured under the stress test conditions that the source voltage (Vs: [V]) and the gate voltage ($V_d$: [V]) were set to 0V and a drain voltage of 1.8 V was applied at 150° C. for one hour. FIG. 32B shows the measurement results of the transistor. In FIG. 32B, the solid line represents the result sat a drain voltage ($V_d$: [V]) of 1 V and the dotted line represents the result at a drain voltage of 0.1 V, the horizontal axis represents gate voltage ($V_g$: [V]) and the vertical axis represents drain current ($I_d$: [A]).

Note that in the graphs, the solid line represents the result before the stress test and the dotted line represents the result after the stress test. As shown in FIGS. 32A and 32B, when the transistor fabricated in Example 1 has a drain voltage ($V_d$: [V]) of 1 V, the amount of change in threshold voltage $\Delta V_{th}$ is small, which is 0.03 V in FIG. 32A and 0.11 V in FIG. 32B.

Figure 33:
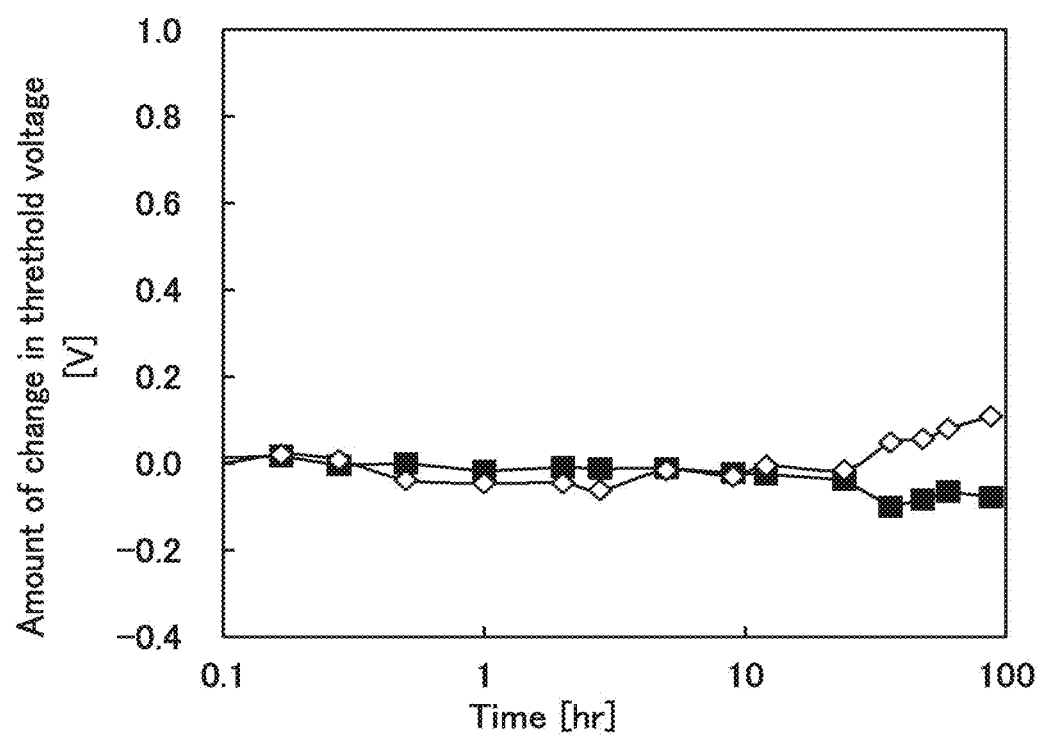
FIG. 33 shows the reliability of a transistor.

The squares in FIG. 33 show the amount of change in threshold voltage in the case where the source voltage ($V_s$: [V]) and the gate voltage ($V_g$ [V]) were set to 0V and a drain voltage ($V_d$: [V]) of 1.8 V was applied at 125° C. for 87.6 hours (that corresponds to 0.01 year).

The diamond shapes in FIG. 33 show the amount of change in threshold voltage in the case where the source voltage ($V_s$: [V]) and the drain voltage ($V_d$: [V]) were set to 0V and a gate voltage ($V_g$: [V]) of −1.8 V was applied at 125° C. for 87.6 hours (that corresponds to 0.01 year).

It can be seen from FIG. 33 that the amount of change in threshold voltage of the transistor fabricated in Example 1 is small even after 0.01 year.

The above results indicate that the transistor of this example has high electric stability.

Example 4

In this example, electric characteristics depending on the channel width of the transistor fabricated in Example 1 were evaluated.

Figure 34A:
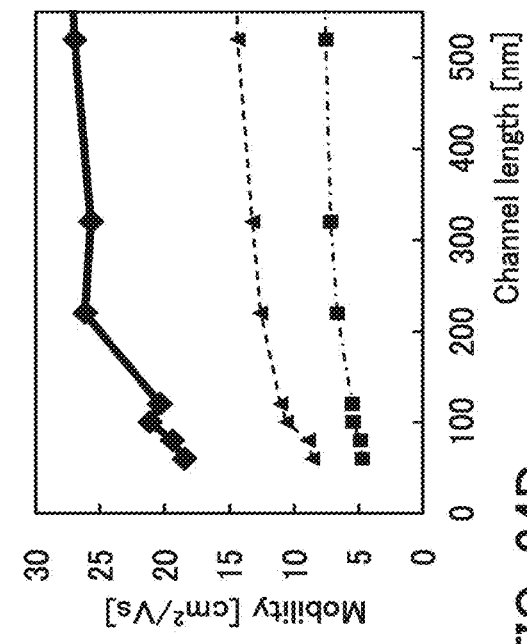
FIGS. 34A to 34D each show electric characteristics of transistors.

First, on-state currents ($I_{on}$: [A]) of transistors with different channel widths were measured at a drain voltage ($V_d$: [V]) of 1 V. FIG. 34A shows the measurement results of the transistors. In FIG. 34A, the horizontal axis represents channel length [nm] and the vertical axis represents on-state current ($I_{on}$: [A]). Note that the diamond shapes in the graph show the results with a channel width of 40 nm; the triangles, a channel width of 100 m; and the squares, a channel width of 500 nm.

FIG. 34A indicates that on-state current $I_{on}$ is high even when the channel width is small.

Figure 34B:
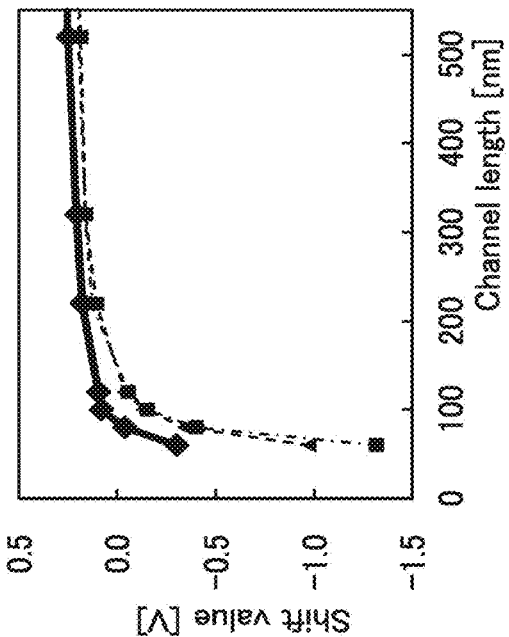

Next, field-effect mobilities of transistors with different channel widths were measured at a drain voltage ($V_d$: [V]) of 0.1 V. FIG. 34B shows the measurement results of the transistors. In FIG. 34B, the horizontal axis represents channel length [nm] and the vertical axis represents field-effect mobility (µFE: cm$^2$/Vs). Note that the diamond shapes in the graph show the results with a channel width of 40 nm; the triangles, a channel width of 100 nm; and the squares, a channel width of 500 nm.

FIG. 34B indicates that the transistor with a smaller channel width has higher mobility.

Figure 34C:
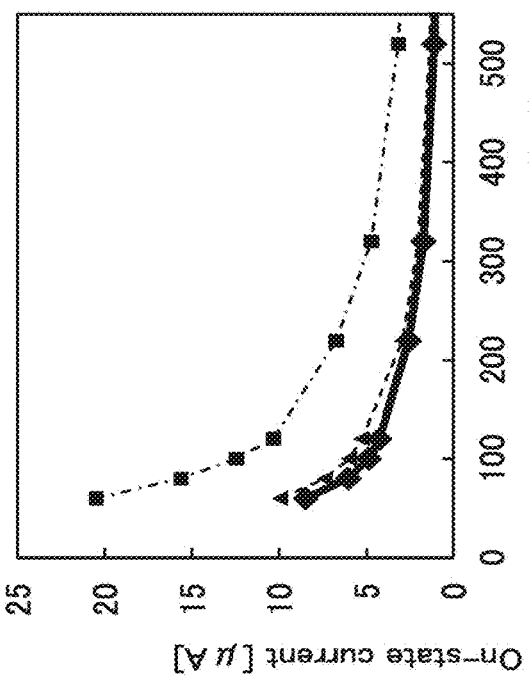

Next, threshold voltages of the transistors with different channel widths were measured at a drain voltage ($V_d$: [V]) of 1 V. FIG. 34C shows the measurement results of the transistors. In FIG. 34C, the horizontal axis represents channel length [nm] and the vertical axis represents threshold voltage ($V_{th}$: [V]). Note that the diamond shapes in the graph show the results with a channel width of 40 nm; the triangles, a channel width of 100 nm; and the squares, a channel width of 500 nm.

It can be seen from FIG. 34C that the threshold voltages hardly change.

Figure 34D:
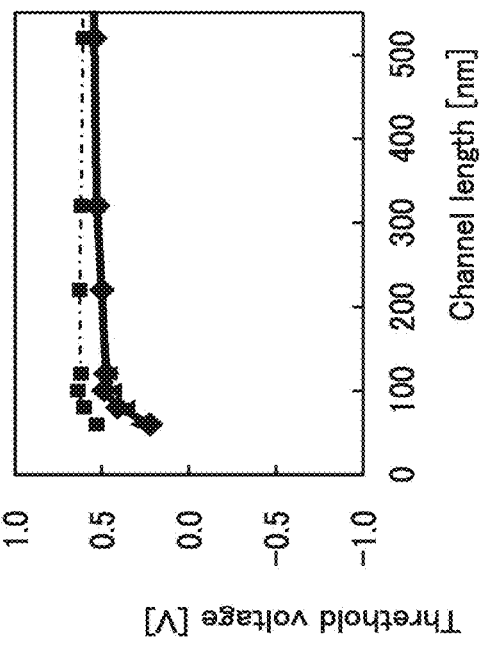

Next, shift values of transistors with different channel widths were measured at a drain voltage ($V_d$: [V]) of 1 V. Here, the shift value represents the rising edge and is defined as the gate voltage ($V_g$ [V]) with respect to a drain current ($I_d$ [A]) of 1E-12A. FIG. 34D shows the measurement results of the transistors. In FIG. 34D, the horizontal axis represents channel length [am] and the vertical axis represents shift value [V]. Note that the diamond shapes in the graph show the results with a channel width of 40 nm; the triangles, a channel width of 100 nm; and the squares, a channel width of 500 nm.

FIG. 34D indicates that the transistor with a smaller channel width has a smaller change in shift value.

Figure 35A:
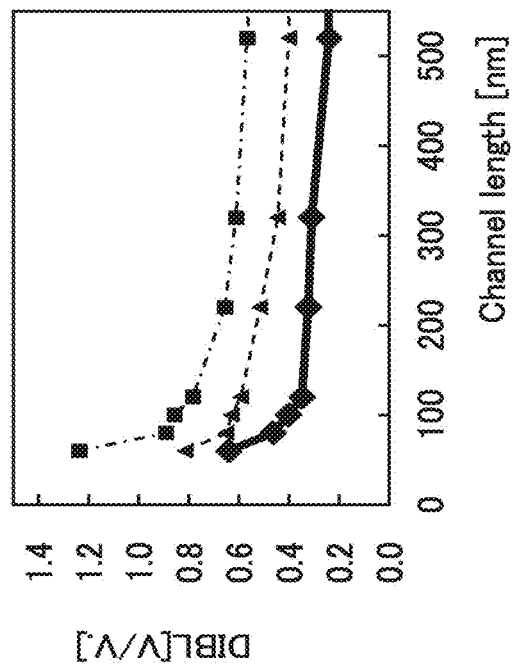
FIGS. 35A and 35B each show electric characteristics of transistors.

Next, S values of transistors with different channel widths were measured at a drain voltage ($V_d$: [V]) of 0.1 V. FIG. 35A shows the measurement results of the transistors. In FIG. 35A, the horizontal axis represents channel length [nm] and the vertical axis represents S value [mV/dec.]. Note that the diamond shapes in the graph show the results with a channel width of 40 nm; the triangles, a channel width of 100 nm; and the squares, a channel width of 500 nm.

FIG. 35A indicates that the transistor with a smaller channel width has a larger amount of decrease in S value.

Figure 35B:
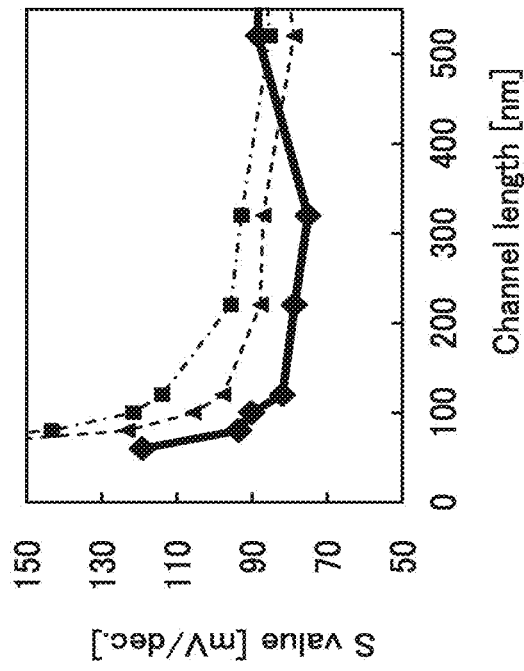

Next, DIBL depending on the channel width was measured. DIBL was obtained in such a manner that a threshold voltage at a drain voltage ($V_d$: [V]) of 1 V is subtracted from a threshold voltage at a drain voltage ($V_d$: [V]) of 0.1 V, and the obtained value is divided by 0.9. FIG. 35B shows the measurement results of the transistors. In FIG. 35B, the horizontal axis represents channel length [nm] and the vertical axis represents DIBL value [V/V.]. Note that the diamond shapes in the graph show the results with a channel width of 40 nm; the triangles, a channel width of 100 nm; and the squares, a channel width of 500 nm.

FIG. 35B indicates that the transistor with a smaller channel width has a lower DIBL.

The above results indicate that the electric characteristics of the transistor of this example become better as the channel width is smaller.

Example 5

In this example, a transistor which has the same structure as the transistor 460 illustrated in FIG. 6A was fabricated as an example sample and the electric characteristics of the transistor was evaluated.

First, a method for fabricating the example sample is described.

Example 1 can be referred to for the method for fabricating the example sample. A difference of the transistor of this example from the transistor of Example 1 is only the first oxide film; the thickness of the first oxide film of the transistor of this example is 10 nm. The film was formed by sputtering using an oxide target of In:Ga:Zn=1:3:4 (atomic ratio) (IGZO(134)) under the following conditions: a mixed atmosphere of argon and oxygen (argon:oxygen=30 sccm: 15 sccm); a pressure of 0.4 Pa; a power supply of 0.5 kW; a distance between the substrate and the target of 60 am; and a substrate temperature of 200° C.

In the transistor fabricated in this example, the channel length was set to 70 nm and the channel width was set to 40 nm.

Figure 11:
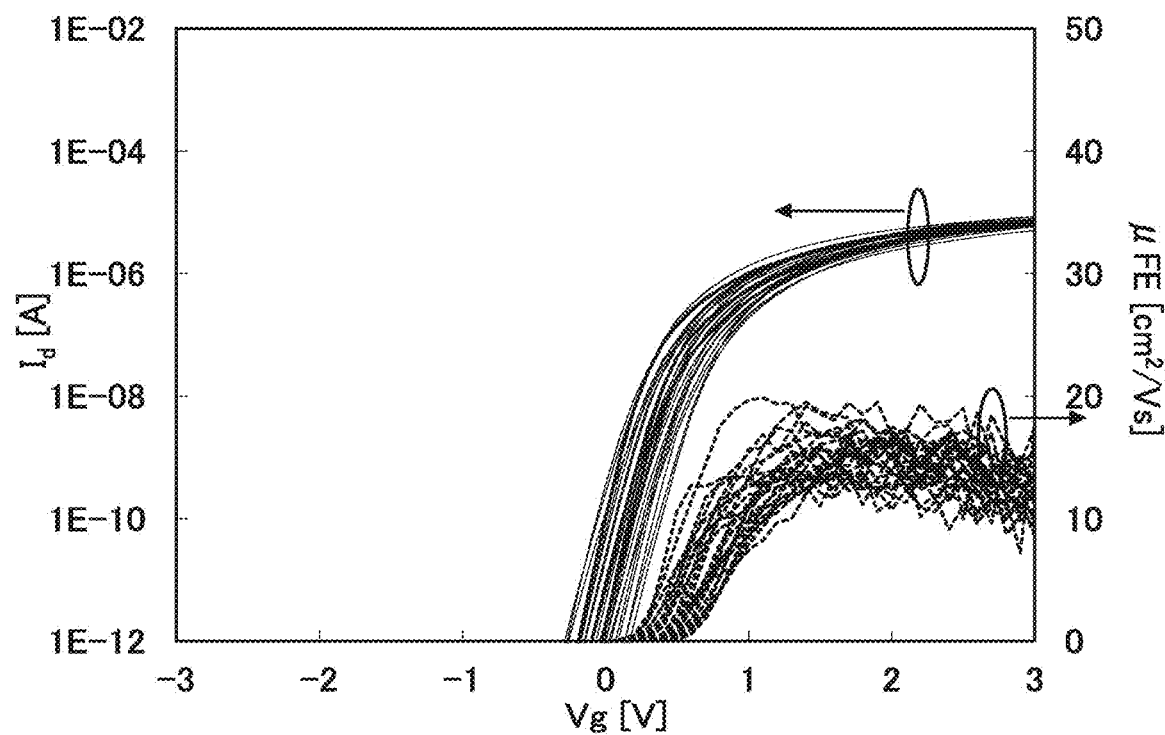
FIG. 11 shows measurement results of the electric characteristics of a transistor fabricated in Example.

Next, the drain current ($I_d$: [A]) of the transistor was measured under the conditions that the drain voltage ($V_d$: [V]) was set to 1 V and the gate voltage ($V_g$: [V]) was swept from −3 V to 3 V. In addition, the field-effect mobility (μFE) at a drain voltage ($V_d$: [V]) of 0.1 V was measured. FIG. 11 shows the measurement results of the transistor at a drain voltage ($V_d$: [V]) of 1 V. In FIG. 11, the horizontal axis represents gate voltage ($V_g$: [V]), the vertical axis on the left side represents drain current ($I_d$: [A]), and the vertical axis on the right side represents field-effect mobility (μFE: cm$^2$/Vs).

As shown in FIG. 11, when the drain voltage ($V_d$: [V]) of the transistor fabricated in this example is 1 V, the on-state current is 5.08 μA. In addition, when the drain voltage is 0.1 V, the field-effect mobility is 17.0 cm$^2$/Vs.

The above results indicate that the transistor of this example has excellent electric characteristics.

Example 6

In this example, a transistor having the same structure as the transistor 460 illustrated in FIG. 6A was fabricated as an example sample, and electric characteristics depending on the channel width was evaluated.

First, a method for fabricating the example sample is described.

Example 1 can be referred to for a method for fabricating the example sample. Sample A is the transistor used in Example 1 (the first oxide film is a 10-nm-thick film of IGZO(132), and the oxide semiconductor film is a 40-nm-thick film of IGZO(111)). Sample B is the transistor used in Example 5 (the first oxide film is a 10-nm-thick film of IGZO(134), and the oxide semiconductor film is a 40-m-thick film of IGZO(111)). Sample C was fabricated in which the first oxide film is a 20-nm-thick film of IGZO(132), and the oxide semiconductor film is a 15-nm-thick film of IGZO(111) and the other components are the same as those in Sample A. The formation conditions for Sample C were as follows. The first oxide film was formed by sputtering using an oxide target of In:Ga:Zn=1:3:2 (atomic ratio) (IGZO(132)) under the following conditions: a mixed atmosphere of argon and oxygen (argon:oxygen=30 sccm: 15 sccm); a pressure of 0.4 Pa; a power supply of 0.5 kW; a distance between the substrate and the target of 60 mm; and a substrate temperature of 200° C. The oxide semiconductor film was formed by sputtering using an oxide target of In:Ga:Zn-=1:1:1 (atomic ratio) (IGZO(111)) under the following conditions: a mixed atmosphere of argon and oxygen (argon oxygen=30 sccm: 15 sccm); a pressure of 0.4 Pa; a power supply of 0.5 kW; a distance between the substrate and the target of 60 mm; and a substrate temperature of 300° C.

In the transistor fabricated in this example, the channel length was set to 40 nm.

In the transistors, on-state currents ($I_{on}$: [A]) depending on channel width W were measured at a drain voltage ($V_d$: [V]) of 1 V. Note that in this example, on-state current is a current measured at a voltage of (the threshold voltage+1 V). FIG. 12 and FIGS. 13A to 13C show the measurement results of the transistors. In FIG. 12 and FIGS. 13A to 13C, the horizontal axis represents channel width (W: [nm]) and the vertical axis on the left side represents on-state current ($I_{on}$: [A]).

Figure 12:
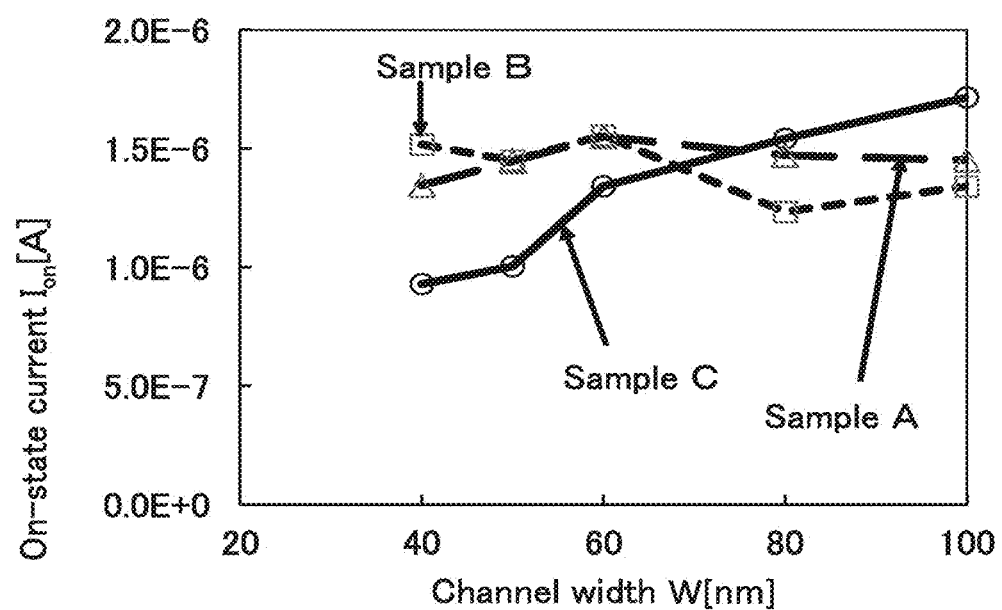
FIG. 12 shows measurement results of the electric characteristics of transistors fabricated in Example.

According to FIG. 12, in Sample C including the 15-nm-thick oxide semiconductor film, the on-state current $I_{on}$ decreases as the channel width W is smaller. On the other hand, in Samples A and B each including the 40-nm-thick oxide semiconductor film, the on-state current $I_{on}$ does not decrease as the channel width W is smaller.

This is probably because a thick oxide semiconductor film increases an electric field of the gate electrode in the horizontal direction in the case of a small channel width, which improves on-state current $I_{on}$.

Figure 13A:
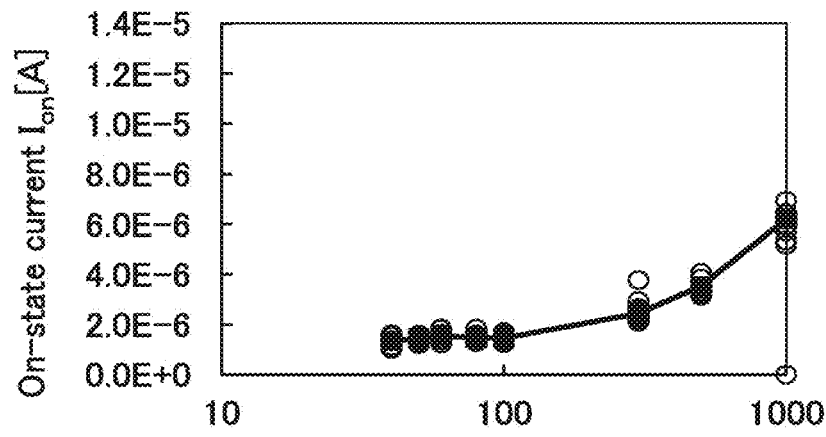
FIGS. 13A to 13C each show measurement results of the electric characteristics of a transistor fabricated in Example.
Figure 13B:
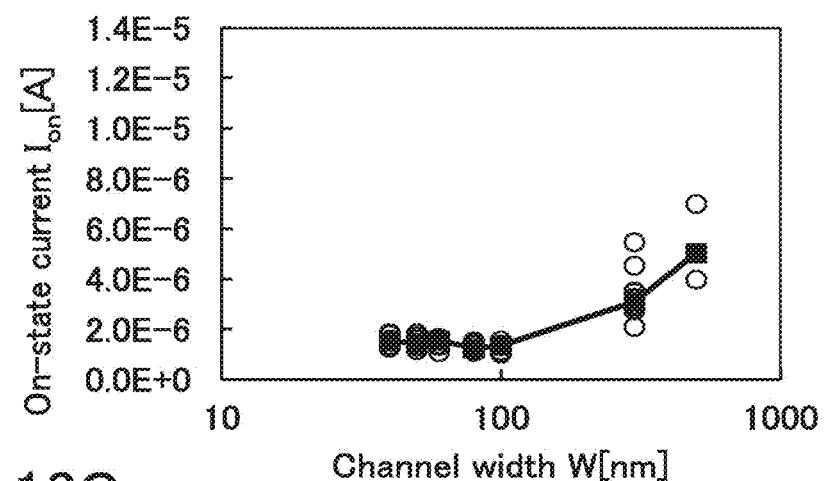
Figure 13C:
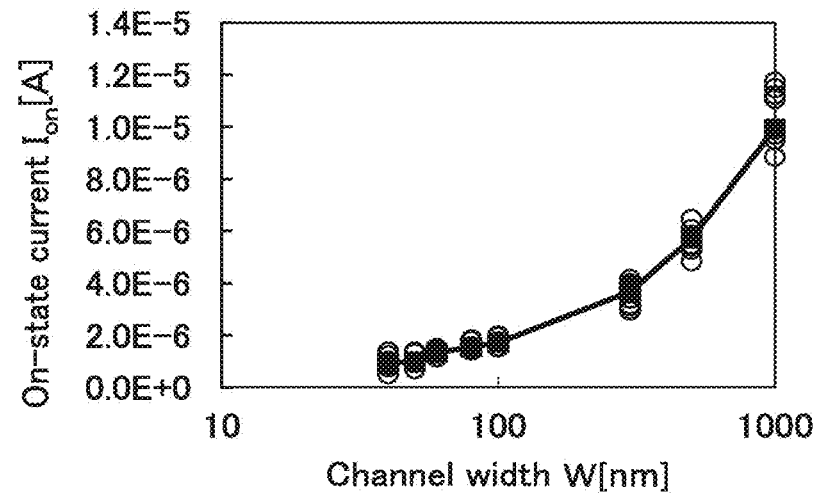

FIG. 13A shows characteristics of Sample A. FIG. 13B shows characteristics of Sample B. FIG. 13C shows characteristics of Sample C. FIGS. 13A to 13C reveal that as the channel width W is larger, the on-state current $I_{on}$ Increases in any of Samples A, B, and C.

Example 7

In this example, a transistor which has the same structure as the transistor 460 illustrated in FIG. 6A was fabricated as an example sample and the electric characteristics of the fabricated transistor was evaluated.

First, a method for fabricating the example sample is described.

First, a silicon oxynitride (SiON) film to be a base insulating film was formed to a thickness of 300 nm over a silicon substrate. The silicon oxynitride film was formed by sputtering under the following conditions: a mixed atmosphere of argon and oxygen (argon:oxygen=25 sccm: 25 sccm); a pressure of 0.4 Pa; a power supply (power supply output) of 5.0 kW; a distance between the silicon substrate and a target of 60 mm; and a substrate temperature of 100° C.

A surface of the silicon oxide film was subjected to polishing treatment, and a 20-nm-thick first oxide film and a 20-nm-thick oxide semiconductor film were stacked. The first oxide film was formed by sputtering using an oxide target of In:Ga:Zn=1:3:4 (atomic ratio) (IGZO(134)) under the following conditions: a mixed atmosphere of argon and oxygen (argon:oxygen=40 sccm: 5 sccm); a pressure of 0.4 Pa; a power supply of 0.5 kW; a distance between the substrate and the target of 60 mm; and a substrate temperature of 200° C. The oxide semiconductor film was formed by sputtering using an oxide target of In:Ga:Zn=1:1:1 (atomic ratio) (IGZO(111)) under the following conditions: a mixed atmosphere of argon and oxygen (argon:oxygen=30 sccm 15 sccm); a pressure of 0.4 Pa; a power supply of 0.5 kW; a distance between the substrate and the target of 60 mm; and a substrate temperature of 300° C. Note that the first oxide film and the oxide semiconductor film were continuously formed without exposure to the air.

Next, beat treatment was performed. The heat treatment was performed under a nitrogen atmosphere at 450° C. for one hour, and then performed under an oxygen atmosphere at 450° C. for one hour.

Next, a tungsten film to be a source electrode and a drain electrode was formed to a thickness of 150 am over the oxide semiconductor film. The film was formed by sputtering using a tungsten target under the following conditions: an argon (80 sccm) atmosphere; a pressure of 0.8 Pa; a power supply (power supply output) of 1.0 kW; a distance between the silicon substrate and the target of 60 mm; and a substrate temperature of 230° C.

Then, a resist mask was formed over the tungsten film and etching was performed using an ICP etching method. As the etching, first etching, second etching, and third etching were performed. The first etching conditions were as follows: a mixed atmosphere of chlorine, carbon tetrafluoride, and oxygen ($Cl_2:CF_4:O_2$=45 sccm: 55 sccm: 55 sccm) atmosphere; a power supply of 3000 W; a bias power of 110 W; and a pressure of 0.67 Pa. Then, the second etching conditions were as follows: an oxygen ($O_2$=100 sccm) atmosphere; a power supply of 2000 W; a bias power of 0 W; and a pressure of 3.0 Pa. The third etching conditions were as follows: a mixed atmosphere of chlorine, carbon tetrafluoride, and oxygen ($Cl_2: CF_4: O_2$=45 sccm: 55 sccm: 55 sccm); a power supply of 3000 W; a bias power of 110 W; and a pressure of 0.67 Pa. Thus, the source electrode and the drain electrode were formed.

Next, a resist mask was formed over the oxide semiconductor film, and the first oxide film and the oxide semiconductor film were processed into an island shape by ICP etching under the following conditions: a boron trichloride ($BCl_3$=80 sccm) atmosphere; a power supply of 450 W; a bias power of 100 W; a pressure of 1.2 Pa; and a substrate temperature of 70° C.

Next, a second oxide film was formed to a thickness of 5 nm over the oxide semiconductor film, the source electrode, and the drain electrode. The film was formed by sputtering using an oxide target of In:Ga:Zn=1:3:2 (atomic ratio) under the following conditions: a mixed atmosphere of argon and oxygen (argon:oxygen=30 sccm 15 sccm); a pressure of 0.4 Pa; a power supply of 0.5 kW; a distance between the substrate and the target of 60 mm; and a substrate temperature of 200° C.

Next, a silicon oxynitride film to be a gate insulating film was formed to a thickness of 20 nm by a CVD method.

A tantalum nitride film was formed to a thickness of 30 nm over the silicon oxynitride film by sputtering under the following conditions: a mixed atmosphere of tantalum nitride and argon (TaN=50 sccm: 10 sccm); a pressure of 0.6 Pa; a power supply of 1 kW; and a distance between the substrate and the target of 60 mm. The substrate temperature was set to room temperature. A tungsten film was formed to a thickness of 135 nm over the titanium nitride film under the following conditions: an argon (Ar=100 sccm) atmosphere; a pressure of 2.0 Pa; a power supply of 4 kW; a distance between the substrate and the target of 60 mm; and a substrate temperature of 230° C.

The stack of the 30-nm-thick tantalum nitride film and the 135-nm-thick tungsten film was etched by ICP etching. As the etching, first etching and second etching were performed. The first etching conditions were as follows: a mixed atmosphere of chlorine, carbon tetrafluoride, and oxygen ($Cl_2:CF_4:O_2$=45 sccm: 55 sccm: 55 sccm); a power supply of 3000 W; a bias power of 110 W; and a pressure of 0.67 Pa. The second etching was performed after the first etching under the following conditions: a chlorine ($Cl_2$=100 sccm) atmosphere; a power supply of 1000 W; a bias power of 50 W; and a pressure of 0.67 Pa. Thus, a gate electrode was formed.

A stack including the gate insulating film and the second oxide film was etched by ICP etching. The etching conditions were as follows: a boron trichloride ($BCl_3$=80 sccm) atmosphere; a power supply of 450 W; a bias power of 100 W; a pressure of 1.2 Pa; and a substrate temperature of 70° C.

Next, a 140-nm-thick aluminum oxide film was formed over the gate electrode by a sputtering method, and a 300-nm-thick silicon oxynitride film was formed thereover by a CVD method.

The channel length was 0.48 μm and the channel width was 0.5 μm.

Next, the temperature dependence of the fabricated transistor was examined.

Figure 40A:
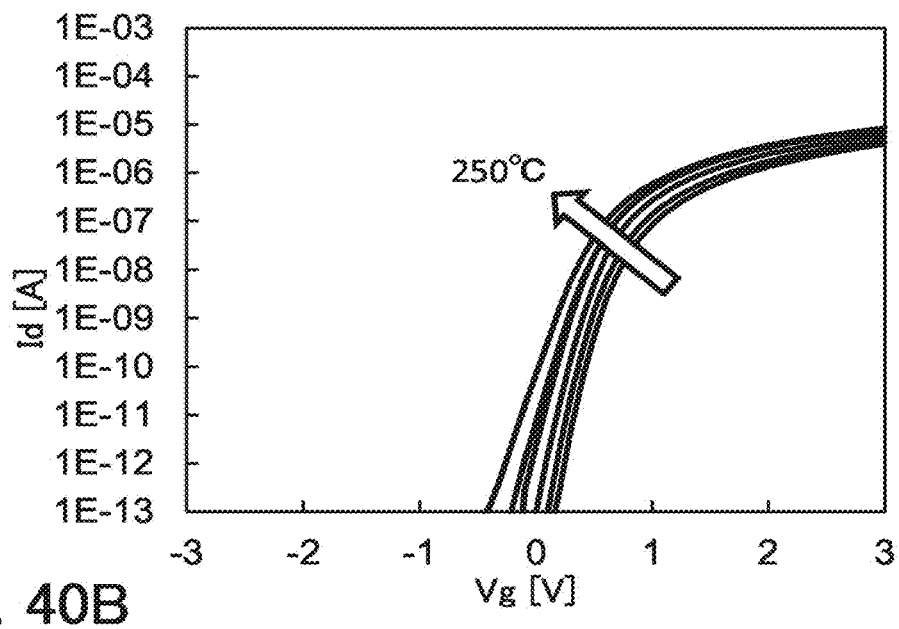
FIGS. 40A to 40C each show temperature dependence of a transistor.

For the evaluation, the drain current ($I_d$: [A]) per a channel width of 1 μm was measured at 25° C., 50° C., 100° C., 150° C., 200° C., and 250° C. The drain voltage ($V_d$: [V]) was set to 1 V and the gate voltage ($V_g$: [V]) was swept from −3 V to 3 V. FIG. 40A shows the measurement results of the transistor. In FIG. 40A, the horizontal axis represents gate voltage ($V_g$: [V]) and the vertical axis represents drain current ($I_d$: [A]). Note that the arrow in FIG. 40A indicate a rise in temperature.

As shown in FIG. 40A, in the transistor fabricated in this example, the on-state current is hardly changed by temperature change.

Figure 40B:
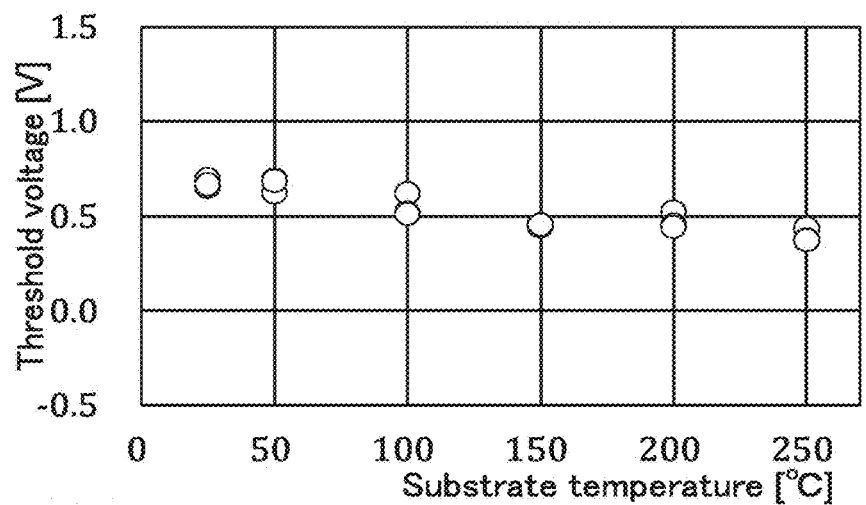
Figure 40C:
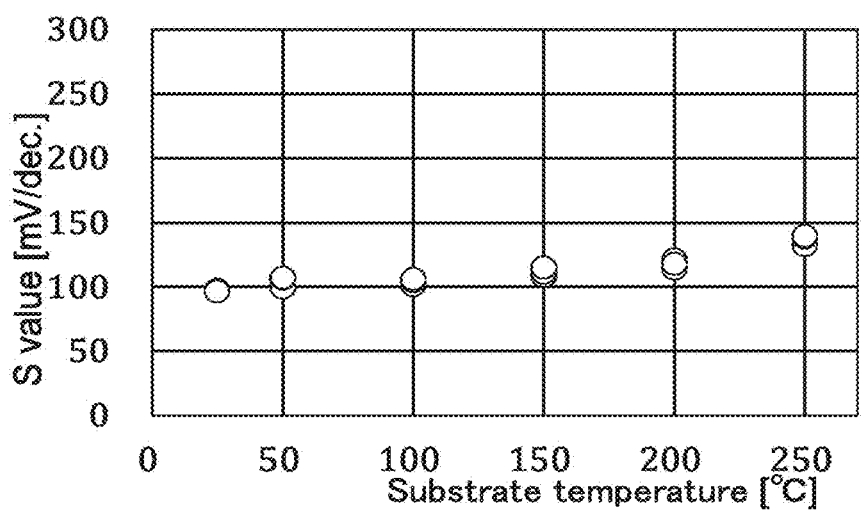

FIGS. 40B and 40C show the temperature dependence of the threshold voltage and the S value.

It was found that the threshold voltage and the S value are hardly changed by temperature change.

The above results indicate that the transistor of this example has temperature resistance.

Example 8

In this example, differences in electric characteristics depending on the shape of the oxide semiconductor film were examined.

First, structures of transistors are described.

Figure 25A:
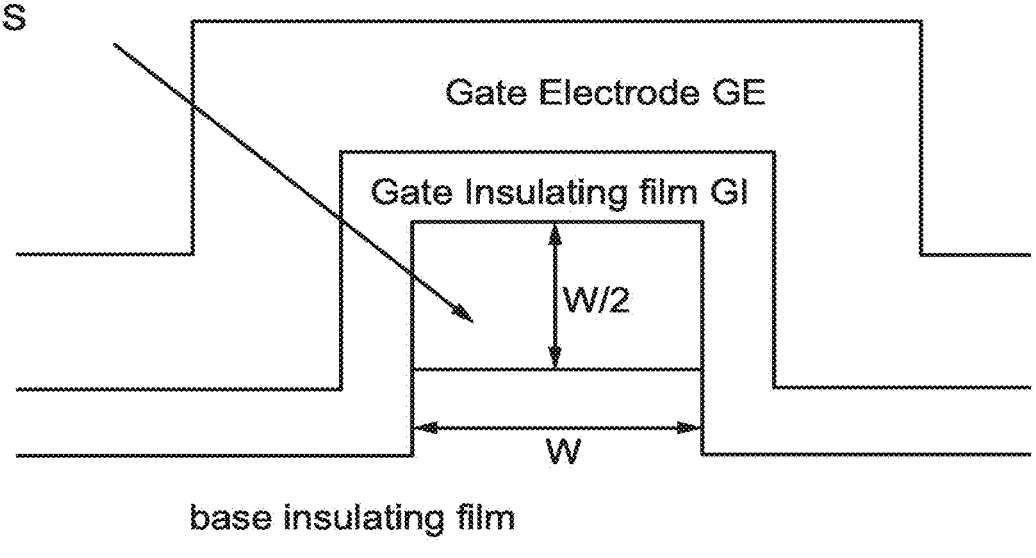
FIGS. 25A and 25B are each a cross-sectional view of a transistor in the channel width direction.

FIG. 25A is a cross-sectional view in the channel width direction of a transistor in which top end portions of an oxide semiconductor film are sharp (hereinafter, such a transistor is also referred to as a transistor with a square structure). In FIG. 25A, WI represents a channel width and the oxide semiconductor film has a thickness of W/2.

Figure 25B:
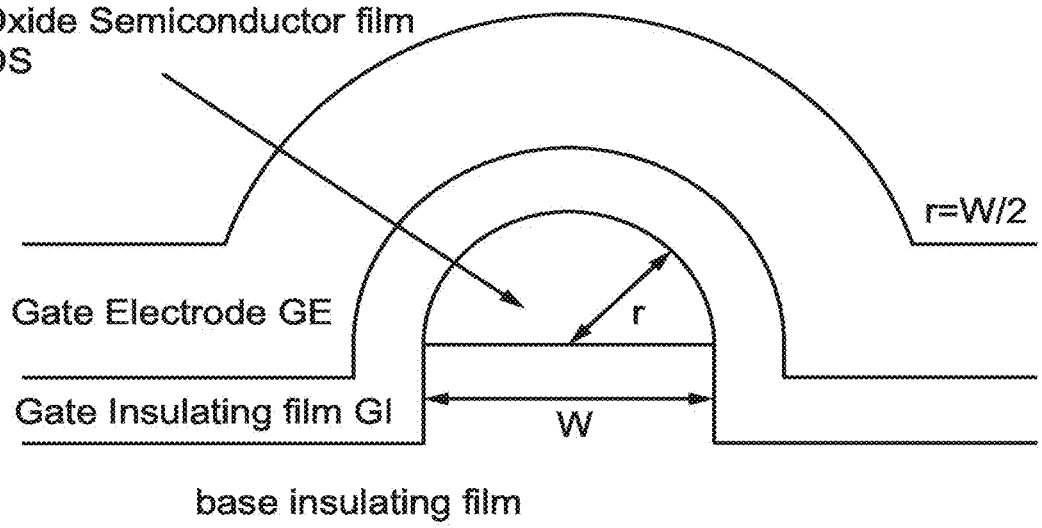

FIG. 25B is a cross-sectional view in the channel width direction of a transistor in which top end portions of an oxide semiconductor film are round (hereinafter, such a transistor is also referred to as a transistor with a semicircle structure), which is one embodiment of the present invention. In FIG. 25B, r represents curvature radius and r=W/2.

The effective channel width of the transistor with a square structure is 2 W (a sum of side surfaces and a top surface). The effective channel width of the transistor with a semicircle structure is 1.57 W (a circumference of a semicircle, $\pi r = \pi W/2 = 1.57$ W). The effective channel width W ratio of the transistor with a semicircle structure to the transistor with a square structure is 0.785.

Figure 26:
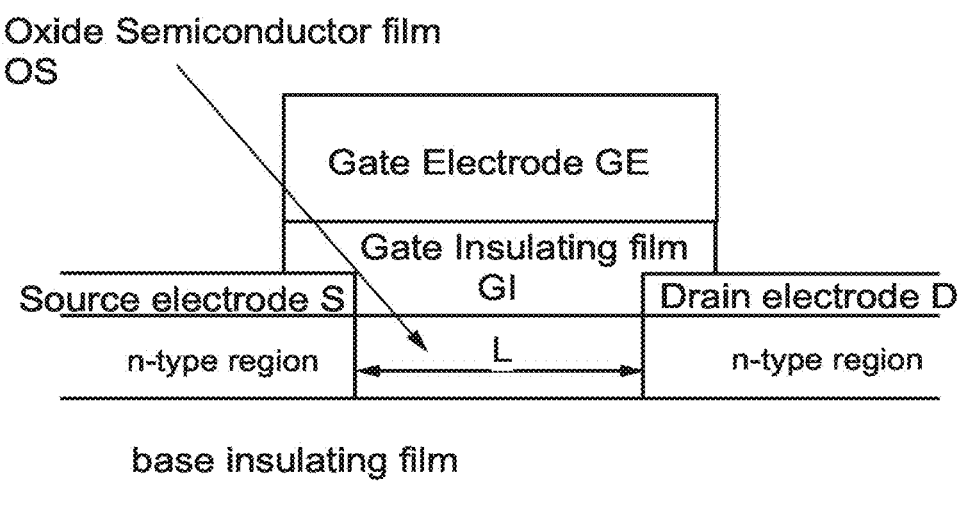
FIG. 26 is a cross-sectional view of a transistor in the channel length direction.

FIG. 26 is a cross-sectional view in the channel length direction of the transistors illustrated in FIGS. 25A and 25B. In FIG. 26, L represents channel length.

Next, calculation conditions are described.

The calculation was performed under conditions shown in Table 1, using Sentaurus Device (produced by Synopsys, Inc.).

TABLE 1

| Size | Channel length L | 40 nm |
|---|---|---|
| | Channel width W | 40 nm |
| GI | Delectric constant | 4.1 |
| | Thickness | 10 nm |
| OS | Composition ratio | IGZO(111) |
| | Electron affinity | 4.6 eV |
| | Eg | 3.2 eV |
| | Delectric constant | 15 |
| | Donor density in a channel portion | 6.60E−9 cm$^{-3}$ |
| | Donor density under source electrode and drain electrodes | 5.00E+18 cm$^{-3}$ |
| | Electron mobility | 15 cm$^2$/Vs |
| | Hole mobility | 0.01 cm$^3$/Vs |
| | Nc | 5.00E+18 cm$^{-3}$ |
| | Nv | 5.00E+18 cm$^{-3}$ |
| | Thickness | 20 nm |
| Base insulating film | Delectric constant | 4.1 |
| | Thickness | 400 nm |
| GE | Work function | 5 eV |
| S/D | Work function | 4.6 eV |

Figure 27:
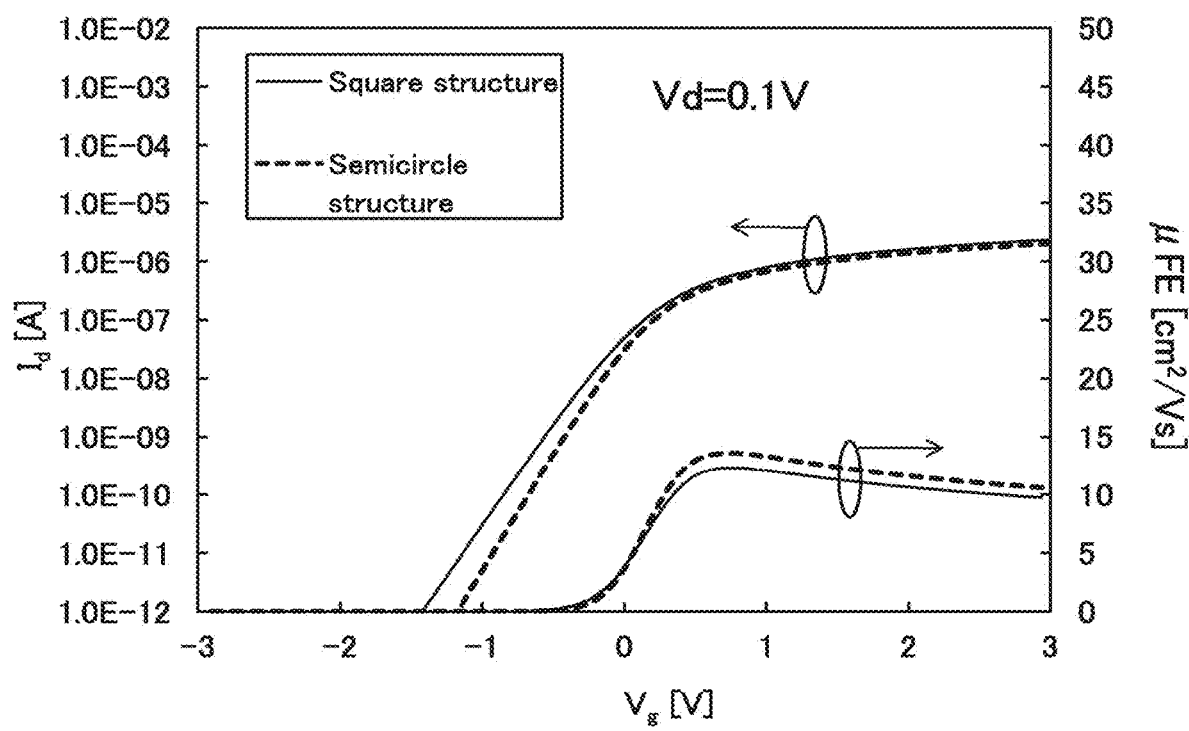
FIG. 27 shows $I_d$-$V_g$ characteristics of transistors.
Figure 28:
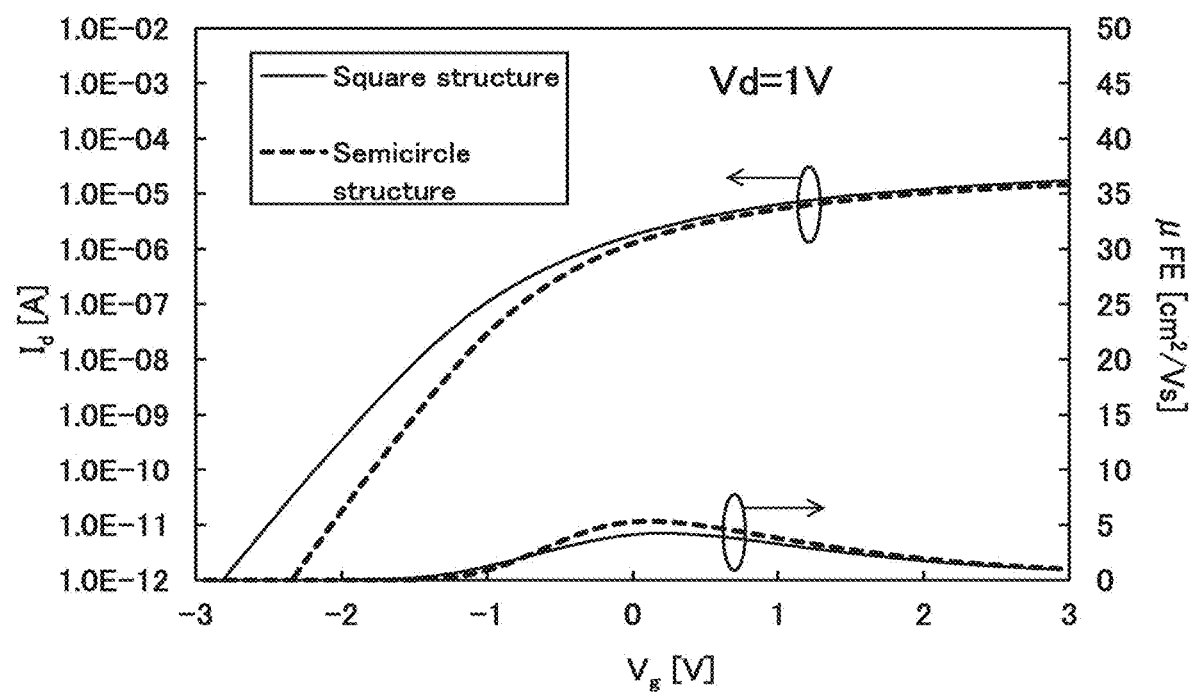
FIG. 28 shows $I_d$-$V_g$ characteristics of transistors.

FIG. 27 shows $I_d$-$V_g$ characteristics and mobility at a drain voltage ($V_d$: [V]) of 0.1 V. FIG. 28 shows $I_d$-$V_g$ characteristics and mobility at a drain voltage ($V_d$: [V]) of 1V.

In FIG. 27 and FIG. 28, the rising voltage (which is one of the $I_d$-$V_g$ characteristics) of the transistor with a semicircle structure is sharper than that of the transistor with a square structure. In addition, the mobility, which is calculated using the effective channel width W, of the transistor with a semicircle structure is higher than that of the transistor with a square structure.

Table 2 compares values of the characteristics obtained from FIG. 27 and FIG. 28.

TABLE 2

| | Square structure | Semicircle structure |
|---|---|---|
| Threshold voltage (Vd = 1) | −0.518 V | −0.443 V |
| On-state current (Vd = 1, Vg = Threshold voltage + 3 V) | 18.4 µA | 16.4 µA |
| S value (Vd = 0.1) | 198 mV/dec | 177 mV/dec |
| Mobility (Vd = 0.1) | 14.3 cm$^2$/Vs | 15.6 cm$^2$/Vs |

It is found from Table 2 that the transistor with a semicircle structure is superior to the transistor with a square structure in characteristics except for on-state current. The on-state current ratio of the transistor with a semicircle structure to the transistor with a square structure is 0.892, which is larger than the effective channel width W ratio of 0.785. That is, electrons are induced more easily in a channel portion of the transistor with a semicircle structure than in a channel portion of the transistor with a square structure.

The relation between effective channel width W and on-state current is probably one of reasons why electrons are induced more easily in the channel portion of the transistor with a semicircle structure than in the channel portion of the transistor with a square structure. The on-state current is thought to be proportional to capacitance of the gate insulating film (hereinafter, also referred to as GI capacitance); however, the GI capacitance of the transistor with a semicircle structure is not represented by a parallel-plate capacitor, and is approximately represented by the following formula.

$$C_r = \varepsilon \frac{\pi}{\ln\left(1 + \frac{t_{GI}}{t_{OS}}\right)} \quad \text{[Formula 1]}$$

In Formula 1, $C_r$ represents GI capacitance per unit channel length in the transistor with a semicircle structure, $\varepsilon$ represents dielectric constant of the gate insulating film, $t_{GI}$ represents a thickness of the gate insulating film, and $t_{OS}$ represents a thickness of the oxide semiconductor film.

In the transistor with a semicircle structure, the GI capacitance is not proportional to the effective channel width $W(\pi_{OS})$; the on-state current cannot be obtained using the effective channel width W ratio.

On the other band, the GI capacitance per unit channel length in the transistor with a square structure is approximately represented by the following formula.

$$C_s = \varepsilon \frac{4 t_{OS}}{t_{GI}} \quad \text{[Formula 2]}$$

The ratio in GI capacitance is necessarily used to obtain on-state current. The GI capacitance ratio of the transistor with a semicircle structure (obtained from Formula 1) to the transistor with a square structure (obtained from Formula 2), $C_r/C_s$, is approximately 0.968, which is larger than the effective channel width W ratio of 0.785. This estimate is an approximate value and does not agree with the ratio obtained by calculation, but from the estimate, it can be said that electrons are induced more easily in the channel portion of the transistor with a semicircle structure than in the channel portion of the transistor with a square structure.

Reference Example

In this reference example, a fact that a transistor using a CAAC-OS film has an adequate resistance to a short-channel effect is described.

The characteristic length is widely used as an indicator of resistance to a short-channel effect. The characteristic length is an indicator of curving of potential in a channel portion. As the characteristic length is shorter, the potential rises more sharply, which means that the resistance to a short-channel effect is high.

The transistor using a CAAC-OS film is an accumulation-type transistor. A reason why the transistor using a CAAC-OS film is resistant to a short-channel effect is probably that the characteristic length of the accumulation-type transistor is shorter than that of a transistor in which a channel is formed in an inversion-type transistor.

Figure 36:
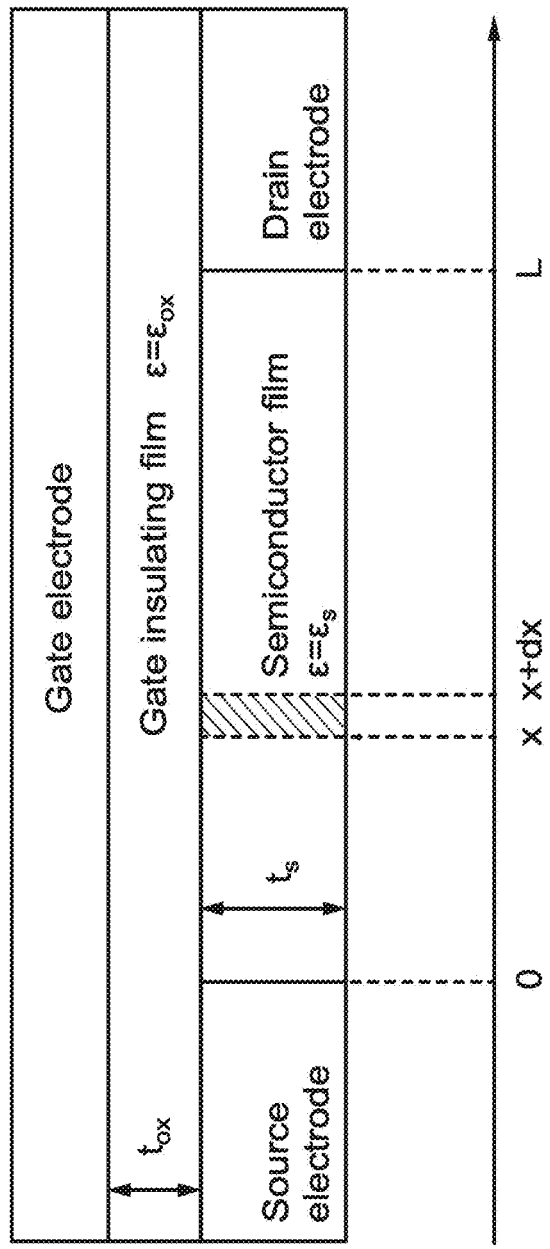
FIG. 36 is a schematic structural view of a transistor.

The structure of the transistor is described in detail using a schematic view of FIG. 36. Note that $\varepsilon_S$ represents dielectric constant of the semiconductor film, $\varepsilon_{OX}$ represents dielectric constant of the gate insulating film, $t_S$ represents a thickness of the semiconductor film, and $t_{OX}$ represents a thickness of the gate insulating film.

First, the potential in a channel portion of an n-channel inversion-type transistor is obtained by solving the Poisson's equation. In FIG. 36, Gauss's law is applied to a diagonally shaded narrow zone x to (x+dx), which is a region to be a channel portion in the semiconductor film, deriving the following formula.

$$-\varepsilon_S t_S \left[ -\frac{d\phi(x)}{dx} + \frac{d\phi(x+dx)}{dx} \right] - \varepsilon_{OX} \frac{V_G - V_{FB} - \phi(x)}{t_{OX}} dx = -e N_A t_S dx \quad \text{[Formula 3]}$$

In Formula 3, $\phi(x)$ represents a potential (a surface potential) in the position x, $\phi(x+dx)$ represents a potential (a surface potential) in the position x+dx, $V_G$ represents gate voltage, $V_{FB}$ represents a flat band voltage, a represents elementary charge, and $N_A$ represents acceptor density.

Formula 3 is arranged to give the following formula.

$$\frac{d^2\phi(x)}{dx^2} + \frac{\varepsilon_{OX}}{\varepsilon_S t_S t_{OX}} \left[ V_G - V_{FB} - \phi(x) - \frac{eN_A t_S t_{OX}}{\varepsilon_{Ox}} \right] = 0 \quad \text{[Formula 4]}$$

By substituting Formula 5 into Formula 4, Formula 6 is obtained.

$$\frac{1}{l^2} = \frac{\varepsilon_{OX}}{\varepsilon_S t_S t_{OX}} \quad \text{[Formula 5]}$$

$$\frac{d^2\phi(x)}{dx^2} - \frac{1}{l^2}\phi(x) + \frac{1}{l^2}\left(V_G - V_{FB} - \frac{eN_A t_S t_{OX}}{\varepsilon_{OX}}\right) = 0 \quad \text{[Formula 6]}$$

The general solution of Formula 6 is obtained using Formula 7, and Formula 8 is obtained.

$$V_L = V_G - V_{FB} - \frac{eN_A t_S t_{OX}}{\varepsilon_{OX}} \quad \text{[Formula 7]}$$

$$\phi(x) = A\exp(x/l) + B\exp(-x/l) + V_L \quad \text{[Formula 8]}$$

The potential $\phi(x)$ satisfies the following boundary conditions.

$$\begin{cases} \phi(0) = V_{bi} \\ \phi(L) = V_{bi} + V_{DS} \end{cases} \quad \text{[Formula 9]}$$

The coefficients A and B satisfying the above boundary conditions are obtained and arranged to give the special solution of a differential equation. The potential $\phi(x)$ is as follows.

$$\phi(x) = V_L + \frac{1}{\sinh\left(\frac{L}{l}\right)} \left[ (V_{bi} - V_{DS} - V_L)\sinh\left(\frac{x}{l}\right) + (V_{bi} - V_L)\sinh\left(\frac{L-x}{l}\right) \right] \quad \text{[Formula 10]}$$

By substituting x=0 or x=L into the formula, it is easily confirmed that Formula 10 satisfies the boundary conditions in Formula 9.

In Formula 10, l represents the characteristic length that is the indicator of curving of potential. As the characteristic length is shorter, the potential of a channel portion in an FET changes more sharply.

Therefore, the characteristic length of the inversion-type transistor is as follows.

$$\frac{1}{l^2} = \frac{\varepsilon_{OX}}{\varepsilon_S t_S t_{OX}} \quad \text{[Formula 11]}$$

Next, an accumulation-type transistor (that includes a transistor using a CAAC-OS film in its category) is considered in a similar manner, and the characteristic lengths of the accumulation-type transistor and the inversion-type transistor are compared. As described above, Gauss's law is applied to a narrow zone x to (x+dx), which is a region to be a channel portion in the semiconductor film, deriving the following formula.

$$-\varepsilon_S t_S \left[ -\frac{d\phi(x)}{dx} + \frac{d\phi(x+dx)}{dx} \right] - \varepsilon_{OX} \frac{V_G - V_{FB} - \phi(x)}{t_{OX}} dx = -en_i \exp\left(\frac{e(\phi(x) - \phi_F)}{k_B T}\right) t_S dx \quad \text{[Formula 12]}$$

In Formula 12, $n_i$ represents intrinsic carrier density, $k_B$ represents Boltzmann constant, and $\varphi_F$ represents Fermi potential.

Formula 12 is arranged to give the following formula.

$$\frac{d^2\phi(x)}{dx^2} + \frac{1}{l^2}[V_G - V_{FB} - \phi(x)] = \frac{e}{\varepsilon_S} n_i \exp\left(\frac{e(\phi(x) - \phi_F)}{k_B T}\right) \quad \text{[Formula 13]}$$

Note that l equals the characteristic length of the inversion-type transistor.

The right side of Formula 13 is developed using an approximation formula given below (Formula 14) to give Formula 15.

$$x = x_1 + x', \phi(x) = \phi_1 + \Delta\phi(x')(\phi_1 = \phi(x_1))$$ [Formula 14]

(Note that $\phi_1 = \phi(x_1)$.)

$$\frac{d^2\Delta\phi(x')}{dx'^2} + \frac{1}{l^2}[V_G - V_{FB} - \phi_1 - \Delta\phi(x')] = $$ [Formula 15]

$$\frac{e}{\varepsilon_S}n_i\exp\left(\frac{e\phi_1 - \phi_F}{k_BT}\right)\exp\left(\frac{e\Delta\phi(x')}{k_BT}\right) = $$

$$\frac{e}{\varepsilon_S}n_i\exp\left(\frac{e\Delta\phi(x')}{k_BT}\right) \approx \frac{e}{\varepsilon_S}n_1\left[1 + \frac{e\Delta\phi(x')}{k_BT}\right]$$

In Formula 15, $n_1$ represents carrier density in the position $x_1$. By substituting Formula 16 and Formula 17 into Formula 15 to give Formula 18.

$$\frac{1}{\lambda_1^2} = \frac{e^2 n_1}{\varepsilon_S k_B T}$$ [Formula 16]

$$n_1 = n_i\exp\left(\frac{e(\phi_i - \phi_F)}{k_B T}\right)$$ [Formula 17]

$$\frac{d^2\Delta\phi(x')}{dx'^2} - \left(\frac{1}{l^2} + \frac{1}{\lambda_1^2}\right)\Delta\phi(x') +$$ [Formula 18]

$$\frac{1}{l^2}(V_G - V_{FB} - \phi_1) - \frac{e}{\varepsilon_s}n_1 = 0$$

Formula 18 is arranged using Formula 19 to give Formula 20.

$$\frac{1}{l'^2} = \frac{1}{l^2} + \frac{1}{\lambda_1^2}$$ [Formula 19]

$$\frac{d^2\Delta\phi(x')}{dx'^2} - \frac{1}{l'^2}\Delta\phi(x') +$$ [Formula 20]

$$\frac{1}{l'^2}\left[\frac{l'^2}{l^2}(V_G - V_{FB} - \phi_1) - l'^2\frac{e}{\varepsilon_S}n_1\right] = 0$$

Formula 20 is effective only in the vicinity of the point $x_1$.

Consequently, characteristic length of the accumulation-type transistor in the vicinity of the point $x_1$ is as follows.

$$\frac{1}{l'^2} = \frac{\varepsilon_{OX}}{\varepsilon_S t_S t_{OX}} + \frac{e^2 n_1}{\varepsilon_S k_B T}$$ [Formula 21]

To compare the inversion-type transistor and the accumulation-type transistor, the characteristic length l of the inversion-type transistor is expressed by l(inv), and the characteristic length l' of the accumulation-type transistor is expressed by l(acc). The characteristic lengths are compared.

$$\begin{cases}\frac{1}{l(inv)^2} = \frac{\varepsilon_{OX}}{\varepsilon_S t_S t_{OX}} \\ \frac{1}{l(acc)^2} = \frac{\varepsilon_{OX}}{\varepsilon_S t_S t_{OX}} + \frac{e^2 n_1}{\varepsilon_S k_B T}\end{cases}$$ [Formula 22]

According to Formula 22, it is shown that l(inv)>l(acc).

Although an obtained value of the characteristic length l(acc) of the accumulation-type transistor is varied depending on the point $x_1$, the characteristic length of the accumulation-type transistor is shorter than that of the inversion-type transistor in any case. In addition, electron density is increased near a source and a drain, so that a potential rises more sharply.

As described above, it is found that the characteristic length of the accumulation-type transistor is shorter than that of the inversion-type transistor.

EXPLANATION OF REFERENCE

110: substrate, 120: base insulating film, 137: channel region, 138: channel region, 160: gate insulating film, 170: gate electrode, 210: substrate, 220: base insulating film, 230: oxide semiconductor film, 260: gate insulating film, 270: gate electrode, 400: substrate, 402: base insulating film, 403a: the first oxide film 403b: oxide semiconductor film, 403c: the second oxide film, 404: multilayer film, 404a: the first oxide film, 404b: oxide semiconductor film, 404c: the second oxide film, 405a: conductive film, 405b: conductive film, 406a: source electrode, 406b: drain electrode, 407: insulating film, 408: gate insulating film, 409: conductive film, 410: gate electrode, 412: oxide insulating film, 414: barrier film, 416: sidewall insulating film, 418; sidewall insulating film, 419a: electrode, 419b: electrode, 420a: wiring, 420b: wiring, 435: boundary, 450: transistor, 460: transistor, 470: transistor, 550: transistor, 560: transistor, 570: transistor, 580: transistor, 602: photodiode, 640: transistor, 656: transistor, 658: photodiode reset signal, 659: gate signal line, 672: photosensor reference signal line, 700: memory element, 701: circuit, 702: circuit, 703: switch, 704: switch, 706: logic element, 707: capacitor, 708: capacitor, 709: transistor, 710: transistor, 713: transistor, 714: transistor, 720: circuit, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 2200: transistor, 2201: insulating film, 2202: wiring, 2203: plug, 2204: insulating film, 2205: wiring, 2206: wiring, 3001: wiring, 3002: wiring, 3003: wiring, 3004: wiring, 3005: wiring, 3200: transistor, 3300: transistor, 3400: capacitor, 8000: television device, 8001: housing, 8002: display portion, 8003: speaker portion, 8004: CPU, 8100: alarm device, 8101: microcomputer, 8102: sensor portion, 8200: indoor unit, 8201: housing, 8202: air outlet, 8203: CPU, 8204: outdoor unit, 8300: electric refrigerator-freezer, 8301: housing, 8302: door for a refrigerator, 8303: door for a freezer, 8304: CPU, 9700: electric car, 9701: secondary battery, 9702: circuit, 9703: driving device, 9704: treatment device This application is based on Japanese Patent Application serial no. 2013-106284 filed with Japan Patent Office on May 20, 2013, Japanese Patent Application serial no. 2013-147191 filed with Japan Patent Office on Jul. 16, 2013, Japanese Patent Application serial no. 2013-196300 filed with Japan Patent Office on Sep. 23, 2013, and Japanese Patent Application serial no. 2014-087067 filed with Japan Patent Office on Apr. 21, 2014, the entire contents of which are hereby incorporated by reference.

What is claimed is:

1. A semiconductor device comprising:
  a first transistor comprising a first semiconductor material in a first channel region;
  a second transistor comprising a second semiconductor material in a second channel region; and
  an insulating film over the first transistor, wherein the first semiconductor material and the second semiconductor material have different energy gaps, wherein the second channel region is provided over the insulating film, wherein a gate electrode of the second transistor is provided over the second channel region, and wherein a portion of a bottom surface of the gate electrode of the second transistor is lower than a lowest bottom surface of the second channel region.

2. The semiconductor device according to claim 1,
wherein the gate electrode surrounds the second channel region,
wherein the first semiconductor material is selected from silicon, germanium, silicon germanium, silicon carbide, and gallium arsenic, and
wherein the second semiconductor material is an oxide semiconductor.

3. The semiconductor device according to claim 1, wherein one of a source electrode and a drain electrode of the first transistor is electrically connected to one of a source electrode and a drain electrode of the second transistor.

4. The semiconductor device according to claim 1, wherein a gate electrode of the first transistor is electrically connected to the gate electrode of the second transistor.

5. The semiconductor device according to claim 1,
wherein a source electrode of the second transistor and a drain electrode of the second transistor are over and in contact with the second channel region,
wherein an oxide film is provided over the second channel region, the source electrode of the second transistor, and the drain electrode of the second transistor,
wherein a gate insulating film is provided over the oxide film, and
wherein the gate electrode of the second transistor is provided over the gate insulating film.

6. The semiconductor device according to claim 5, wherein a conduction band minimum of the oxide film is closer to a vacuum level than a conduction band minimum of the second channel region by 0.05 eV or more and 2 eV or less.

7. The semiconductor device according to claim 5, wherein a part of the oxide film is over and in contact with the insulating film.

8. The semiconductor device according to claim 1,
wherein an end portion of a top surface of the second channel region is curved when seen in a cross-sectional view, and
wherein the cross-sectional view is taken along a channel width direction.

9. The semiconductor device according to claim 8, wherein the end portion of the top surface of the second channel region when seen in the cross-sectional view has a curvature radius of greater than 0 and less than or equal to a half of a channel width.

10. The semiconductor device according to claim 1, wherein the second transistor comprises a first semiconductor layer and a second semiconductor layer.

11. A semiconductor device comprising:
a first transistor, the first transistor comprising:
an insulating film;
a first semiconductor film comprising a first semiconductor material over the insulating film;
a first source electrode over and in contact with the first semiconductor film;
a first drain electrode over and in contact with the first semiconductor film;
a gate insulating film over the first semiconductor film; and
a first gate electrode over the gate insulating film;
a second transistor below the insulating film, the second transistor comprising:
a second source electrode;
a second drain electrode;
a second gate electrode; and
a first channel region comprising a second semiconductor material,
wherein the first semiconductor material and the second semiconductor material have different energy gaps, and
wherein a portion of a bottom surface of the first gate electrode of the first transistor is lower than a lowest bottom surface of the first semiconductor film.

12. The semiconductor device according to claim 11,
wherein the first gate electrode surrounds the first semiconductor film,
wherein the second semiconductor material is selected from silicon, germanium, silicon germanium, silicon carbide, and gallium arsenic, and
wherein the first semiconductor material is an oxide semiconductor.

13. The semiconductor device according to claim 11, wherein one of the first source electrode and the first drain electrode of the first transistor is electrically connected to one of the second source electrode and the second drain electrode of the second transistor.

14. The semiconductor device according to claim 11, wherein the first gate electrode of the first transistor is electrically connected to the second gate electrode of the second transistor.

15. The semiconductor device according to claim 11,
wherein a first oxide film is provided over the first semiconductor film, the first source electrode, and the first drain electrode, and
wherein the gate insulating film is provided over the first oxide film.

16. The semiconductor device according to claim 15, wherein a conduction band minimum of the first oxide film is closer to a vacuum level than a conduction band minimum of the first semiconductor film by 0.05 eV or more and 2 eV or less.

17. The semiconductor device according to claim 15, wherein a part of the first oxide film is over and in contact with the insulating film.

18. The semiconductor device according to claim 11,
wherein an end portion of a top surface of the first semiconductor film is curved when seen in a cross-sectional view, and
wherein the cross-sectional view is taken along a channel width direction.

19. The semiconductor device according to claim 18, wherein the end portion of the top surface of the first semiconductor film when seen in the cross-sectional view has a curvature radius of greater than 0 and less than or equal to a half of a channel width.

20. The semiconductor device according to claim 11, wherein the first semiconductor film comprises a first semiconductor layer and a second semiconductor layer.

* * * * *